US006970232B2

(12) United States Patent  (10) Patent No.: US 6,970,232 B2
McGuire, Jr.  (45) Date of Patent: Nov. 29, 2005

(54) STRUCTURES AND METHODS FOR REDUCING ABERRATION IN INTEGRATED CIRCUIT FABRICATION SYSTEMS

(75) Inventor: James P. McGuire, Jr., Pasadena, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/178,621

(22) Filed: Jun. 20, 2002

(65) Prior Publication Data

US 2003/0086071 A1 May 8, 2003

Related U.S. Application Data

(60) Provisional application No. 60/385,427, filed on May 31, 2002, provisional application No. 60/367,911, filed on Mar. 26, 2002, provisional application No. 60/363,808, filed on Mar. 12, 2002, provisional application No. 60/332,183, filed on Nov. 21, 2001, and provisional application No. 60/335,093, filed on Oct. 30, 2001.

(51) Int. Cl.[7] .................. G03B 27/72; G03B 27/42; G03B 27/54; G02B 5/30
(52) U.S. Cl. .................. 355/71; 355/53; 355/64; 359/494; 359/499
(58) Field of Search .................. 355/71, 53, 55, 355/67, 77; 359/494, 497, 499, 386, 351, 683, 766; 250/492.2; 430/5, 30

(56) References Cited

U.S. PATENT DOCUMENTS

| 3,758,201 A | 9/1973 | MacNeille |
| 4,239,329 A | 12/1980 | Matsumoto |
| 4,534,649 A | 8/1985 | Downs |
| 4,576,479 A | 3/1986 | Downs |
| 5,033,830 A | 7/1991 | Jameson |
| 5,410,375 A | 4/1995 | Fiala |
| 5,537,260 A | 7/1996 | Williamson |
| 6,081,382 A | 6/2000 | Omura |

(Continued)

FOREIGN PATENT DOCUMENTS

| DE | 101 23 725 | 11/2002 |
| DE | 101 23 727 | 11/2002 |

(Continued)

OTHER PUBLICATIONS

Burnett et al., "Intrinsic Birefringence in 157 nm Materials," Proc. $2^{nd}$, Intl. Symp on 157 nm Lithography, 2001, pp. 1–13, International SEMATECH, Austin, Texas.

(Continued)

*Primary Examiner*—Alan Mathews
(74) *Attorney, Agent, or Firm*—Pillsbury Winthrop Shaw Pittman LLP

(57) ABSTRACT

An optical system includes multiple cubic crystalline optical elements and one or more polarization rotators in which the crystal lattices of the cubic crystalline optical elements are oriented with respect to each other to reduce the effects of intrinsic birefringence and produce a system with reduced retardance. The optical system may be a refractive or catadioptric system having a high numerical aperture and using light with a wavelength at or below 248 nanometers. The net retardance of the system is less than the sum of the retardance contributions of the respective optical elements. In one embodiment, all cubic crystalline optical elements are oriented with identical three dimensional cubic crystalline lattice directions, a 90° polarization rotator divides the system into front and rear groups such that the net retardance of the front group is balanced by the net retardance of the rear group. The optical system may be used in a photolithography tool to pattern substrates such as semiconductor substrates and thereby produce semiconductor devices.

95 Claims, 48 Drawing Sheets

U.S. PATENT DOCUMENTS

| | | | |
|---|---|---|---|
| 6,084,708 A | | 7/2000 | Schuster |
| 6,137,626 A | * | 10/2000 | Takaoka .................... 359/386 |
| 6,172,380 B1 | | 1/2001 | Noguchi et al. |
| 6,195,213 B1 | | 2/2001 | Omura et al. |
| 6,201,634 B1 | | 3/2001 | Sakuma et al. |
| 6,252,712 B1 | | 6/2001 | Fürter et al. |
| 6,259,508 B1 | * | 7/2001 | Shigematsu .................. 355/53 |
| 6,324,003 B1 | | 11/2001 | Martin |
| 6,366,404 B1 | | 4/2002 | Hiraiwa et al. |
| 6,411,384 B2 | | 6/2002 | Sakuma et al. |
| 6,417,974 B1 | | 7/2002 | Schuster |
| 6,455,862 B1 | * | 9/2002 | van der Veen et al. .. 250/492.2 |
| 6,583,931 B2 | | 6/2003 | Hiraiwa et al. |
| 6,672,109 B1 | | 1/2004 | Hiraiwa |
| 6,683,710 B2 | | 1/2004 | Hoffman et al. |
| 6,683,729 B1 | | 1/2004 | Schuster |
| 6,697,199 B2 | | 2/2004 | Gerhard et al. |
| 6,728,043 B2 | | 4/2004 | Gruner et al. |
| 6,775,063 B2 | | 8/2004 | Shiraishi |
| 2001/0026006 A1 | | 10/2001 | Noble et al. |
| 2002/0085176 A1 | | 7/2002 | Hiraiwa et al. |
| 2002/0149855 A1 | | 10/2002 | Schuster |
| 2002/0186355 A1 | | 12/2002 | Omura |
| 2003/0000453 A1 | | 1/2003 | Unno et al. |
| 2003/0007253 A1 | | 1/2003 | Schuster et al. |
| 2003/0011893 A1 | | 1/2003 | Shiraishi et al. |
| 2003/0012724 A1 | | 1/2003 | Burnett et al. |
| 2003/0021026 A1 | | 1/2003 | Allan et al. |
| 2003/0025894 A1 | * | 2/2003 | Owa et al. .................... 355/67 |
| 2003/0053036 A1 | | 3/2003 | Fujishima et al. |
| 2003/0058421 A1 | | 3/2003 | Omura et al. |
| 2003/0063393 A1 | | 4/2003 | Omura |
| 2003/0067679 A1 | | 4/2003 | Allan et al. |
| 2003/0086156 A1 | | 5/2003 | McGuire, Jr. |
| 2003/0086157 A1 | | 5/2003 | McGuire, Jr. |
| 2003/0086171 A1 | | 5/2003 | McGuire |
| 2003/0089299 A1 | | 5/2003 | Obara et al. |
| 2003/0091934 A1 | | 5/2003 | Allan et al. |
| 2003/0099047 A1 | | 5/2003 | Hoffman et al. |
| 2003/0112501 A1 | | 6/2003 | Sakuma |
| 2003/0128349 A1 | | 7/2003 | Unno |
| 2003/0147061 A1 | | 8/2003 | Omura |
| 2003/0168597 A1 | | 9/2003 | Webb et al. |
| 2003/0197946 A1 | | 10/2003 | Omura |
| 2003/0234981 A1 | | 12/2003 | Hoffman et al. |
| 2004/0001244 A1 | | 1/2004 | Hoffman et al. |
| 2004/0004757 A1 | | 1/2004 | Schuster |
| 2004/0004771 A1 | | 1/2004 | Omura |
| 2004/0005266 A1 | | 1/2004 | Sakuma et al. |
| 2004/0036961 A1 | | 2/2004 | McGuire, Jr. |
| 2004/0036971 A1 | | 2/2004 | McGuire, Jr. |
| 2004/0036985 A1 | | 2/2004 | McGuire, Jr. |
| 2004/0105170 A1 | | 6/2004 | Krahmer et al. |
| 2004/0136084 A1 | | 7/2004 | Unno |

FOREIGN PATENT DOCUMENTS

| | | |
|---|---|---|
| DE | 101 27 320 | 12/2002 |
| DE | 101 25 487 | 1/2003 |
| DE | 102 10 782 | 10/2003 |
| EP | 0 828 172 | 3/1998 |
| EP | 1 063 684 A1 | 12/2000 |
| EP | 1115019 A2 | 7/2001 |
| EP | 1139138 | 10/2001 |
| JP | 2000331927 A | 11/2000 |
| JP | 2001-108801 | 4/2001 |
| JP | 2003-050349 | 2/2003 |
| WO | WO 01/01182 | 1/2001 |
| WO | WO 02/093209 A2 | 11/2002 |
| WO | WO 02/093257 | 11/2002 |
| WO | WO 02/097508 A1 | 12/2002 |
| WO | WO 02/099500 A2 | 12/2002 |
| WO | WO 03/001271 A1 | 1/2003 |
| WO | WO 03/003429 | 1/2003 |
| WO | WO 03/007046 | 1/2003 |
| WO | WO 03/009021 A1 | 1/2003 |
| WO | WO 03/009050 A1 | 1/2003 |
| WO | WO 03/009062 A1 | 1/2003 |
| WO | WO 03/046634 | 6/2003 |
| WO | WO 03/077007 | 9/2003 |
| WO | WO 03/077011 | 9/2003 |
| WO | WO 03/088330 | 10/2003 |
| WO | WO 04/008254 | 1/2004 |

OTHER PUBLICATIONS

D. Krähmer, "Intrinsic Birefringence in $CaF_2$," at $CaF_2$ Birefringence Workshop, Intl SEMATECH, Jul. 18, 2001, pp. 1–9.

Morton et al., "Testing Optical Damage for 157 nm Lithography," Semiconductor International, http://www.e–insite.net/semiconductor/index.asp?layout=article&stt (Feb. 2002).

A. Hand, "157 nm Optics Demand a Bag of Tricks," Semiconductor International, http://www.e–insite.net/semiconductor/index.asp?layout=article&stt (Feb. 2001).

Shiraishi et al., "Current Status of Nikon's Investigation on $CaF_2$ Intrinsic Birefringence,"International–SEMATECH Calcium Fluoride Birefringence Workshop, Jul. 18, 2001, pp. 1–15.

Burnett et al., "Intrinsic birefringence in calcium fluoride and barium fluoride," Physical Review B, vol. 64, pp. 241102-1–241102-4.

Burnett, et al., "Minimizing spatial–dispersion–induced birefringence in crystals for precision optics by using mixed crystals of materials with t opposite sign of the birefringence," National Institute of Standards and Technology, Gaithersburg, Maryland 20899, http://physics.nist.gov/Divisions/Div842/Gp3/DUVMatChar/birefring.ht (Jul. 12, 2001), pp. 1–3.

Burnett et al., "Alternative Materials Development (LITJ216) Final Report—Stress Birefringence, Intrinsic Birefringence, and Index Properties of 157 nm Refractive Materials," International SEMATECH, Feb. 28, 2002, 33 pages.

J. Dyson, "Unit magnification optical system without Seidel aberrations," J. Opt. Soc. Am., vol. 49, 1959, p. 713 as described by R. Kingslake, "Lens Design Fundamentals," Institute of Optics, University of Rochester, Academic Press, Inc., 1978, pp. 320–321.

U.S. Appl. No. 10/071,375, filed Feb. 7, 2002. Applicants: Jeffrey M. Hoffman and James P. McGuire.

U.S. Appl. No. 10/178,601, filed Jun. 20, 2002, Applicant: James P. McGuire. (OPTRES.002A).

U.S. Appl. No. 10/178,937, filed Jun. 20, 2002. Applicant: James P. McGuire. (OPTRES.003A).

U.S. Appl. No. 10/178,935, filed Jun. 20, 2002. Applicant: James P. McGuire. (OPTRES.006A).

U.S. Appl. No. 10/331,159, filed Dec. 26, 2002, titled Structures and Methods for Reducing Polarization Aberration in Optical Systems.

U.S. Appl. No. 10/331,101, filed Dec. 26, 2002, titled Methods for Reducing Polarization Aberration in Optical Sytstems.

U.S. Appl. No. 10/331,103, filed Dec. 26, 2002, titled Structures and Methods for Reducing Polarization Aberration in Integrated Circuit Fabrication Systems.

Burnett, J.H. et al., "Intrinsic Birefringence in 157 nm Materials," Proceedings of the International Symposium on 157NM Lithography, Dana Point, CA, May 15, 2001, XP002218849, pp. 1–13.

Burnett, J.H. et al., "Intrinsic Birefringence in calcium fluoride," preprinted handed out at $2^{nd}$ International Symposium on 157NM Lithography, Dana Point, CA, May 15, 2001, XP002232195, pp. 1–17.

Yeh, P. et al., "Optics of Liquid Crystal Displays," John Wiley & Sons, Inc., New York, 1999, pp. 380–385.

Burnett, et al., "Intrinsic Birefringence in Calcium Fluoride," National Institute of Standards and Technology, Gaithersburg, Maryland 20899, Submitted for Publication to Physical Review Letters (May 11, 2001), pp. 1–12.

Rudolf Kingslake, *Lens Design Fundamentals*, 1978, pp. 320–321, Academic Press, Inc. San Diego, California.

U.S. Provisional Patent Application 60/306,206, filed Jul. 18, 2001 which is priority document for WO 03/009050.

U.S. Provisional Patent Application 60/308,844, filed Aug. 1, 2001, in Japanese language (Owa et al).

English translation of Provisional Patent Application 60/308,844 filed Aug. 1, 2001, filed with USPTO on Oct. 23, 2002 in U.S. Appl. No. 10/207,109 (Owa et al).

U.S. Appl. No. 10/371,266. filed Feb. 20, 2003 (OPTRES.026C1).

U.S. Appl. No. 10/371,269, filed Feb. 20, 2003 (OPTRES.026DV1).

Unno et al., "Analyses of Imaging Performance Degradation Caused by Birefringence Residual in Lens Materials," *Optical Microlithography XIV*, Proceedings of SPIE, vol. 4346, 2001, pp. 1306–1317.

Owa et al., "Nikon F2 Exposure Tool," *Nikon Corporation*, 157nm Data Review, Dec. 2001, Slides 1–24.

Owa et al., "Nikon F2 Exposure Tool," *Nikon Corporation*, $3^{rd}$ Symposium, Sep. 4, 2002, Slides 1–25.

Shiraishi et al., "Current Status of Nikon's Investigation of CaF2 Intrinsic Birefringence," *Nikon Corporation*, International SEMATECH Calcium Fluoride Birefringence Workshop, Jul. 18, 2001, Slides 1–15.

Shiraishi et al., "Progress of Nikon's F2 Exposure Tool Development," *Optical Microlithography XV*, Proceedings of SPIE, vol. 4691, 2002, pp. 594–601.

Shiraishi et al., "Current Status of F2 Exposure Tool Development," Precision Company, *Nikon Corporation*, NGL Workshop 2003, Jul. 10, 2003, pp. P1–P29.

Suzuki et al., "Influence of the Intrinsic Birefringence in F2 Projection System," *Canon Inc.*, Calcium Fluoride Birefringence Workshop, Jul. 18, 2001, Slides.

Takahashi, "Current Status and Future Plan for 157nm Lithography," *Canon Inc.*, Litho Forum Los Angeles, International SEMATECH, Jan. 27–29, 2004, Slides.

Tirri et al., "Intrinsic Birefringence Impact on the ASML Wilton 157nm Lens," *ASML*, Wilton, Connecticut, Intrinsic Biref Sematech, Jul. 17, 2001, Slides 1–15.

Van Peski, "Lens Design Software CODE V® Modification," *International SeMaTech*, Jul. 18, 2001, Slides.

Walker, "Simulation of Intrinsic Birefringence of $CaF_2$ in Code V®," *Optical Research Associates*, SEMATECH Calcium Fluoride Birefringence Workshop, Jul. 18, 2001, Slides.

Wang, "157 nm Birefringence Measurement System Using PEM Technology," *Hinds Instruments*, Slides.

Ware, "Pushing ArF to the Limits!," *Canon USA*, DNS Lithography Breakfast Forum at SEMICON West 2003, Jul. 2003, Slides.

Webb, Intrinsic Birefringence Workshop, *Corning*, Corning Tropel, Jul. 18, 2001, Slides.

Zeiss et al., "Intrinsic Birefringence in $CaF_2$," *Zeiss*, $CaF_2$ Birefringence Workshop, Slides.

"Business and Technology Update," *Canon Europa N.V.*, Amstelveen, Slides.

Memorandum from C. Van Peski to Exposure Tool Manufactures and Lens Designers, Regarding Birefringence of Calcium Fluoride, May 7, 2001, XP-002218848.

Memorandum from C. Van Peski to PAG Members, Regarding Birefringence of Calcium Fluoride, May 7, 2001.

Burnett et al., "Intrinsic Birefringence in 157 nm Materials," *National Institute of Standards and Technology*, SEMATECH Calcium Fluoride Birefringence Workshop, Jul. 18, 2001, Slides.

Burnett et al., "Intrinsic Birefringence in Calcium Fluoride and Barium Fluoride," *Rapid Communications*, Physical Review B, vol. 64, Nov. 29, 2001, pp. 241102-1–4.

Burnett et al., "Intrinsic Birefringence in 157 nm Materials," *National Institute of Standards and Technology*, Slides.

Chiba et al., "New Generation Projection Optics for ArF Lithography," *Optical Microlithography XV*, Proceedings of SPIE, vol. 4691, 2002, pp. 679–686.

Matsumoto et al., "Analysis of Imaging Performance Degradation," *Optical Microlithography XVI*, Proceedings of SPIE, vol. 5040, 2003, pp. 131–138.

Matsuyama et al., "High NA and Low Residual Aberration Projection Lens for DUV Scanner," *Optical Microlithography XV*, Proceedings of SPIE, vol. 4691, 2002, pp. 687–695.

Matsuyama et al., "Microlithographic Lens for DUV Scanner," *International Optical Design Conference 2002*, Proceedings of SPIE, vol. 4832, 2002, pp. 170–174.

Matsuyama et al., "Nikon Projection Lens Update," *Nikon Corporation*, SPIE Microlithography 5377-65, Feb. 27, 2004, Slides 1–25.

Matsuyama et al., "Nikon Projection Lens Update," Precision Equipment Company, *Nikon Corporation*.

Miyawaki et al., "Development of 157nm Exposure Tools," *Canon*, 157nm Technical Data Review, Dec. 11–13, 2001, Slides 1–22.

Nakano et al., "The Development of 193nm–Immersion Exposure Tools," *Canon*, International Symposium on Immersion & 157nm Lithography, Aug. 3, 2004, Slides 1–25.

Nattermann et al., "Birefringence of $CAF_2$," *Schott Lithotec*, Jul. 23, 2001, Slides.

Nogawa, "Development Status of 157nm Exposure Tools," *Canon Inc.*, Semiconductor Production Equipment Development Center, Slides 1–26.

Nogawa et al., "System Design of a 157nm Scanner," *Canon Inc.*

* cited by examiner

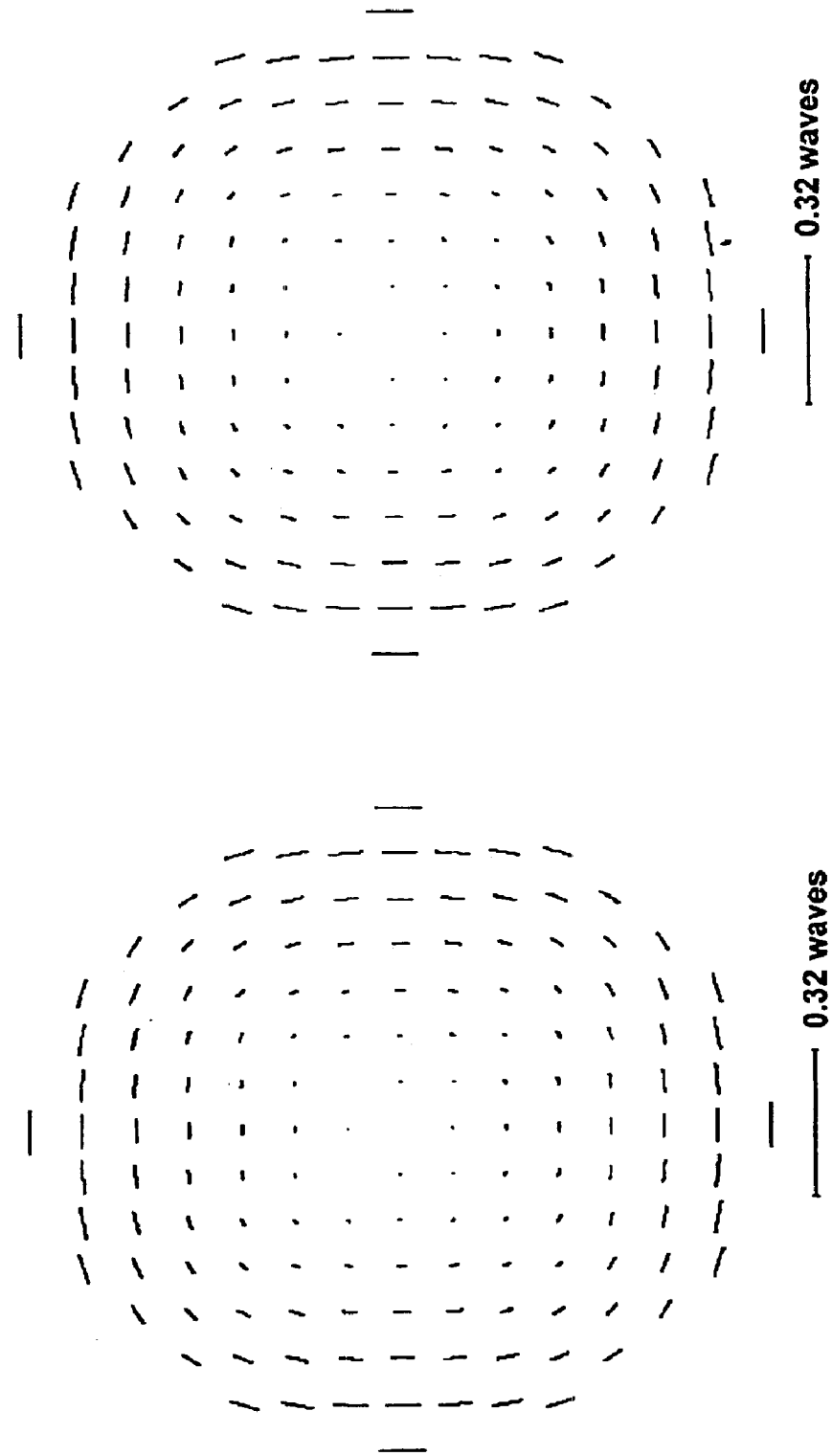

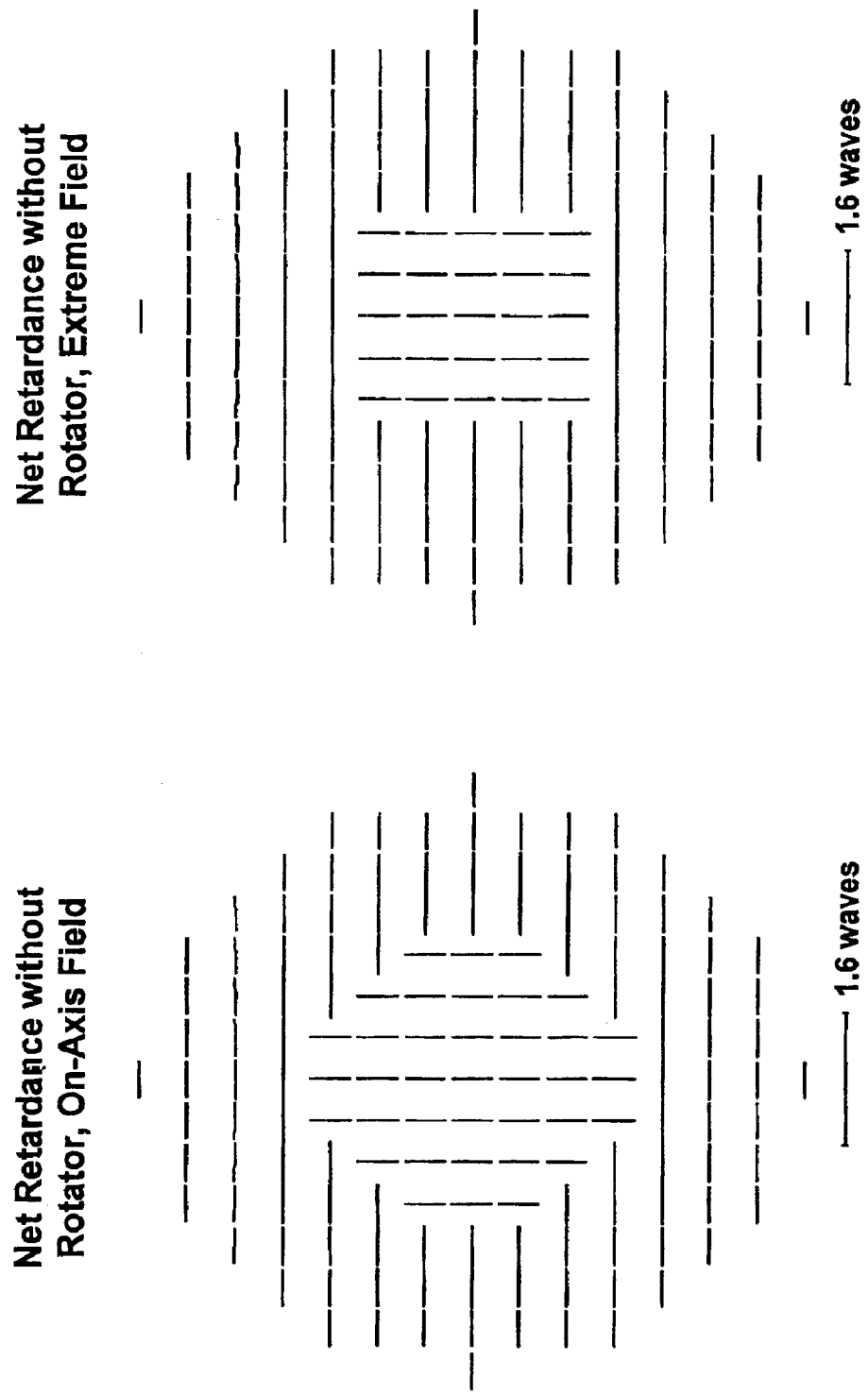

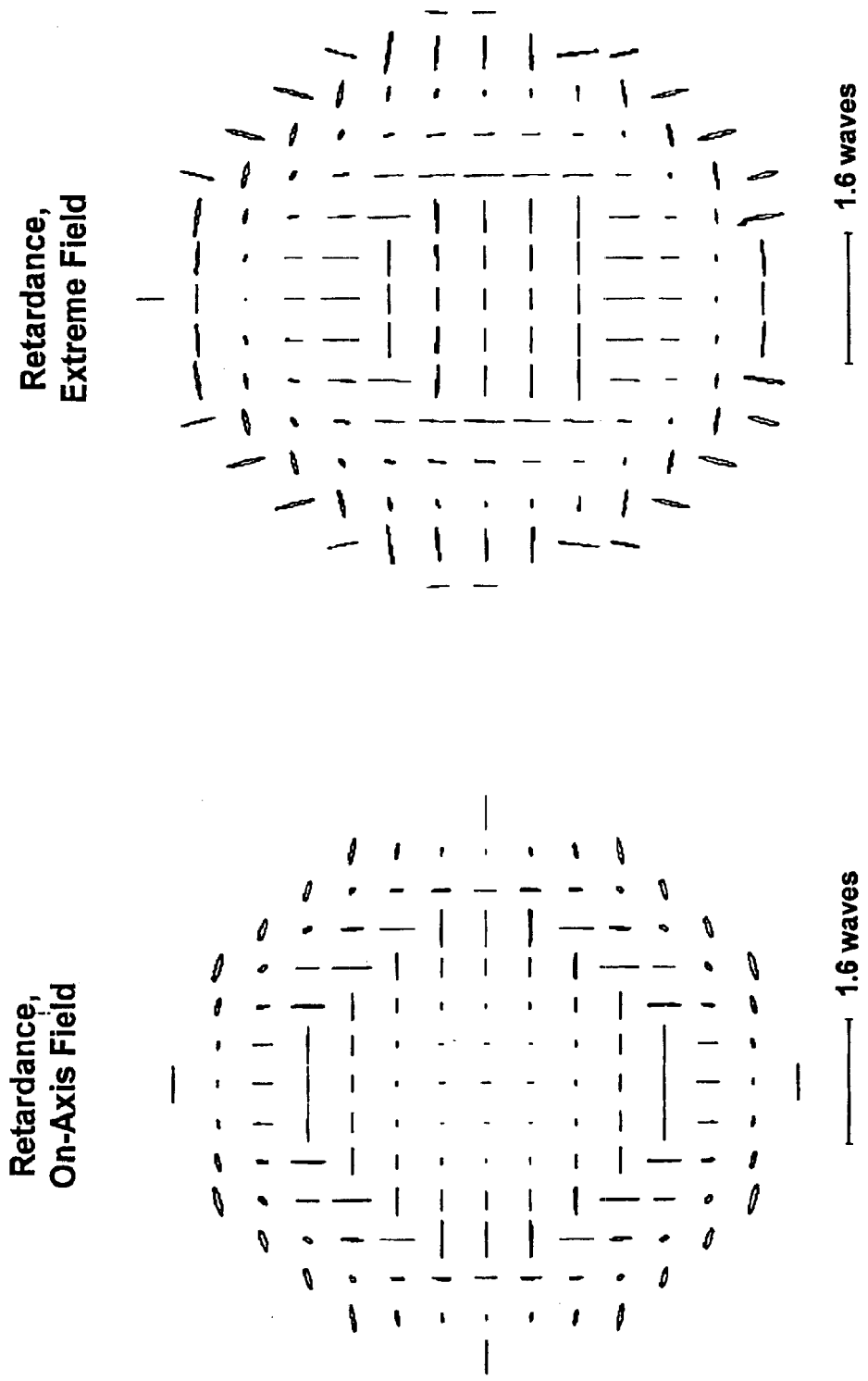

Net Retardance All Elements Plus Rotator 1, Extreme Field
1.6 waves

Net Retardance All Elements Plus Rotator 1, On-Axis Field
1.6 waves

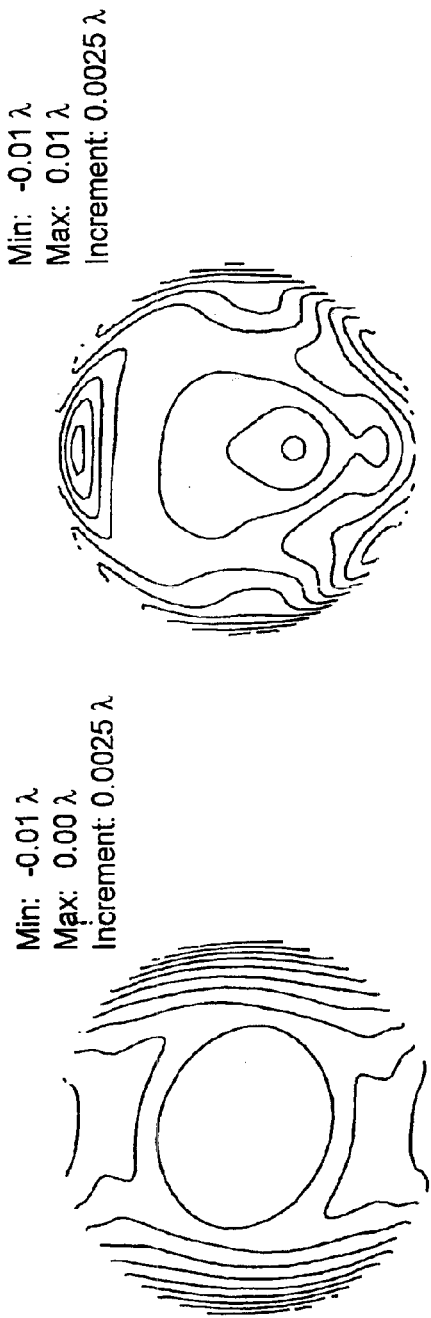
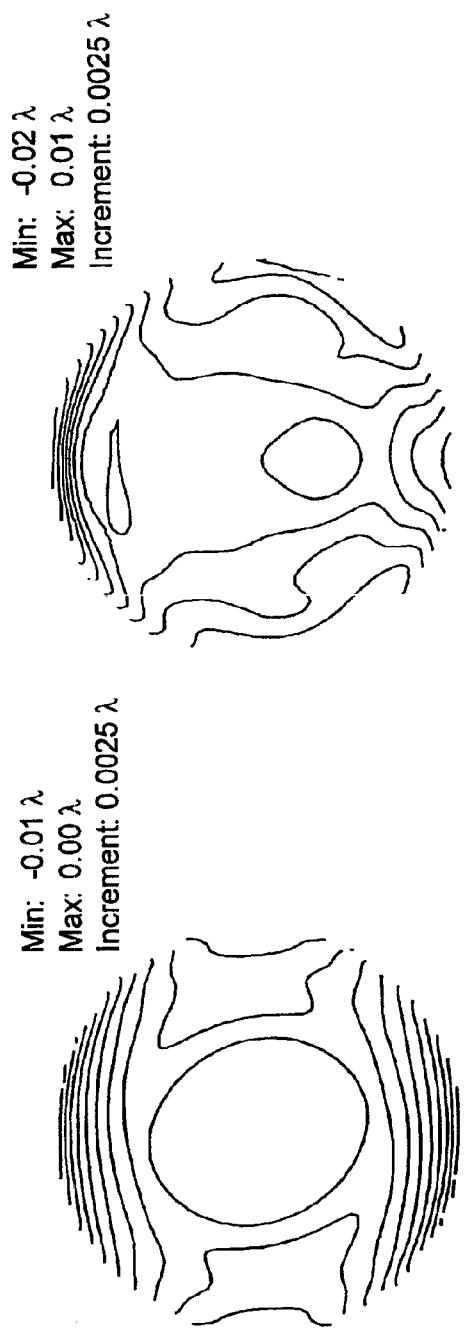
FIG. 33A
FIG. 33B
FIG. 33C
FIG. 33D

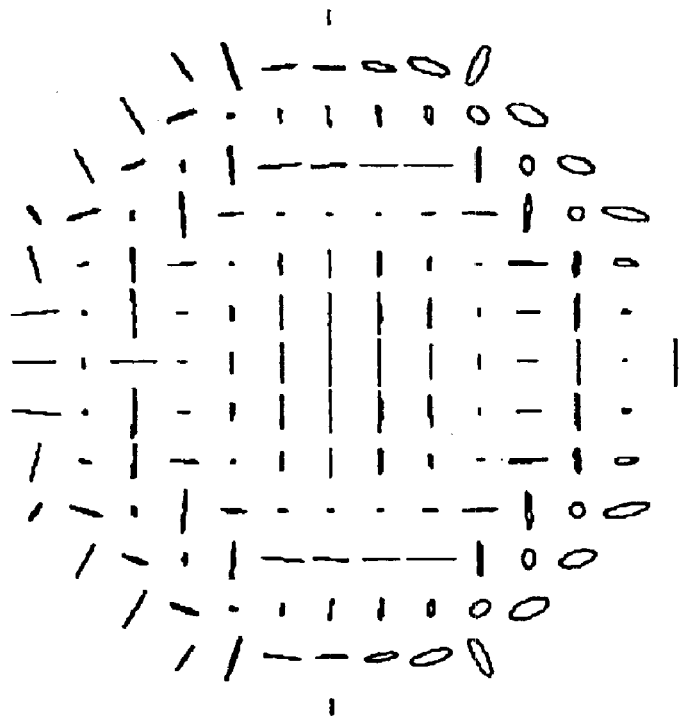
FIG. 34A Retardance, On-Axis Field — 1.6 waves
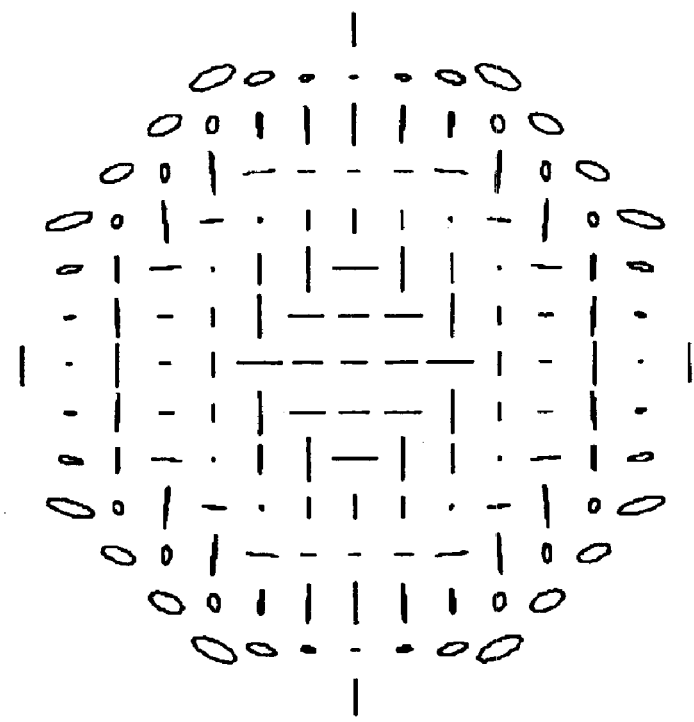
FIG. 34B Retardance, Extreme Field — 1.6 waves Net Retardance of Elements Between Rotators, Extreme Field 0.59 waves Net Retardance of Elements Between Rotators, On-Axis Field 0.62 waves Retardance, Extreme Field
1.5 waves Retardance, On-Axis Field
1.6 waves

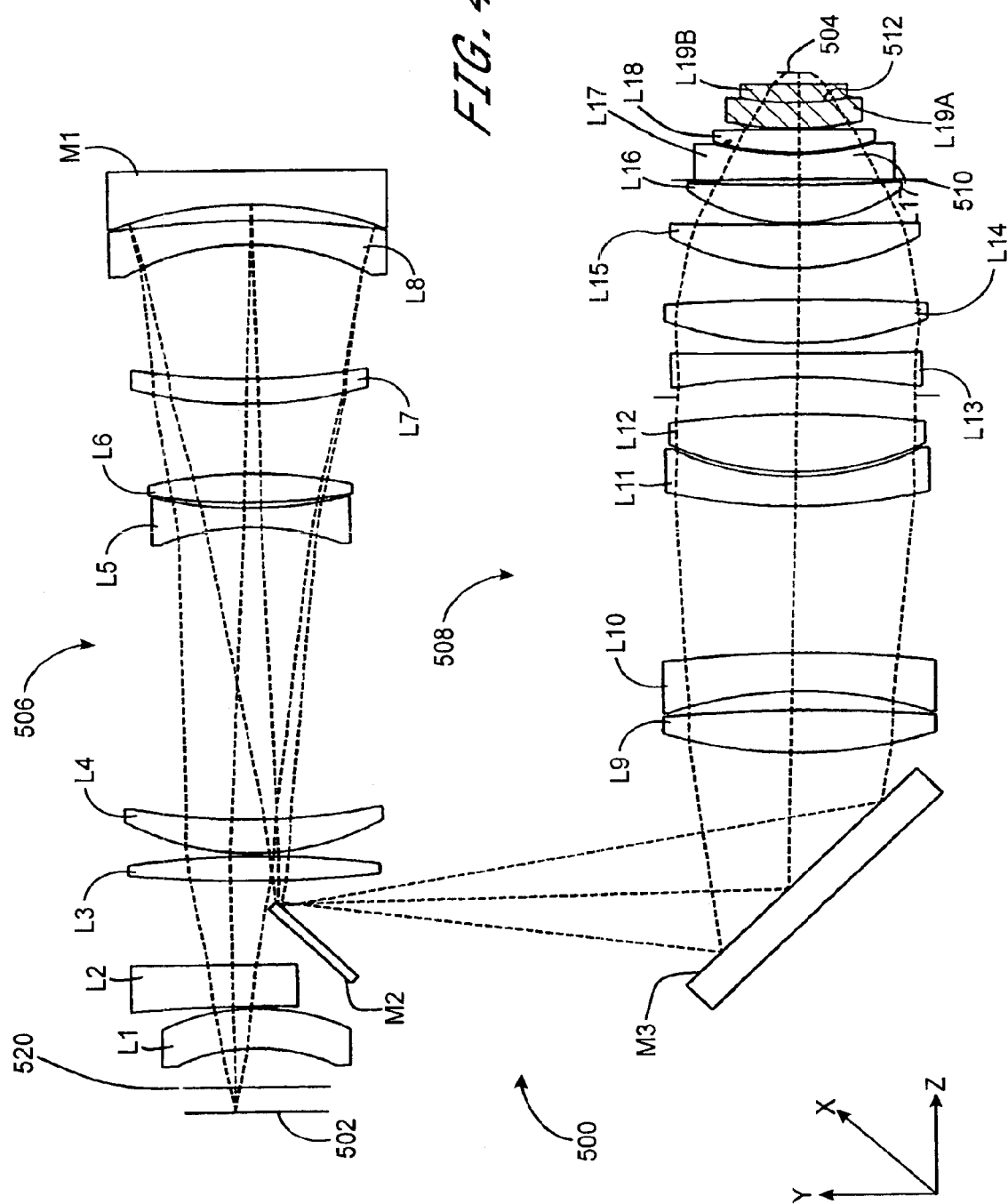

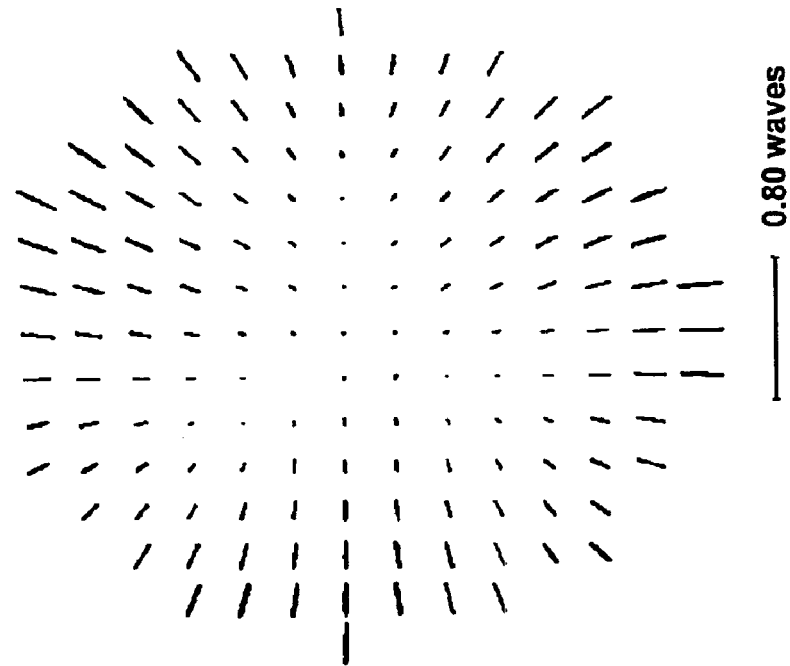
FIG. 47A  Net Retardance of Elements Between Rotators, On-Axis Field — 0.81 waves
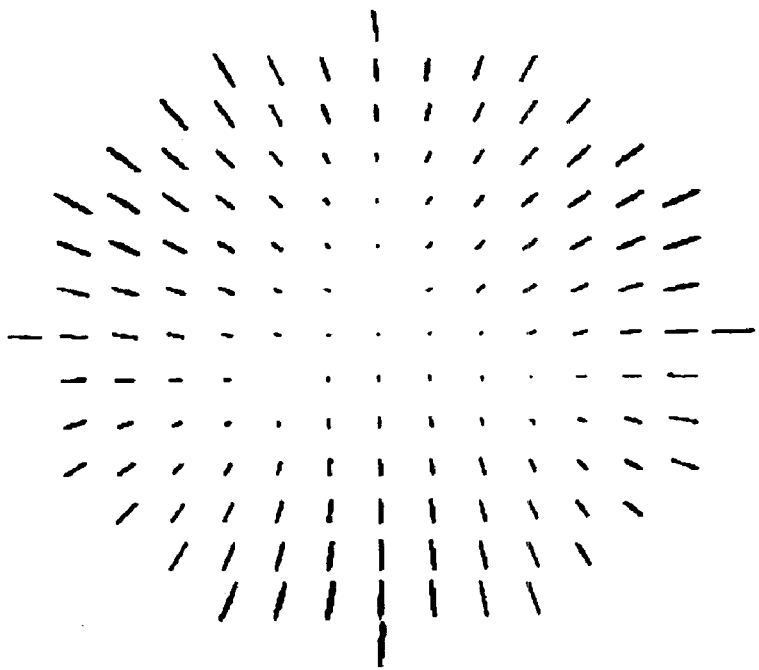
FIG. 47B  Net Retardance of Elements Between Rotators, Extreme Field — 0.80 waves

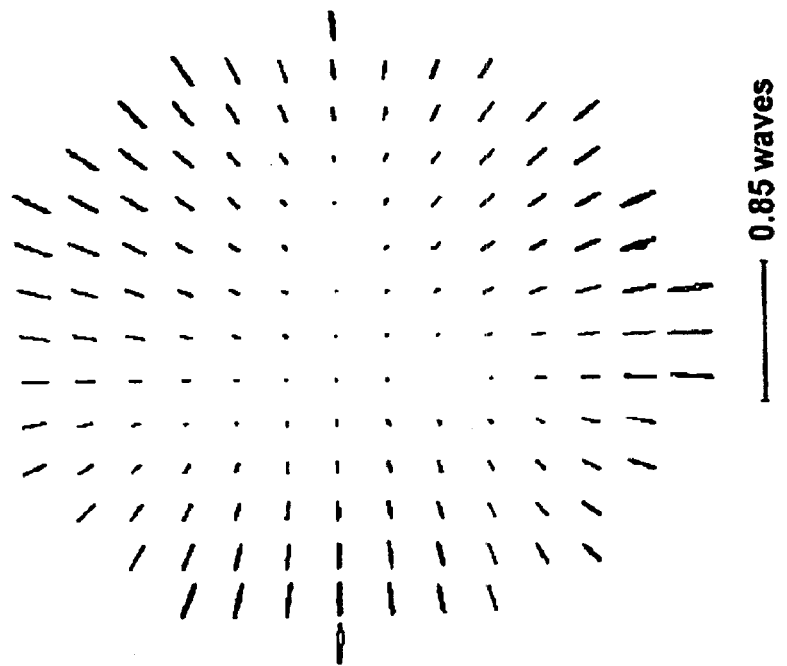
FIG. 48B  Net Retardance of Elements Following Rotators, Extreme Field — 0.85 waves
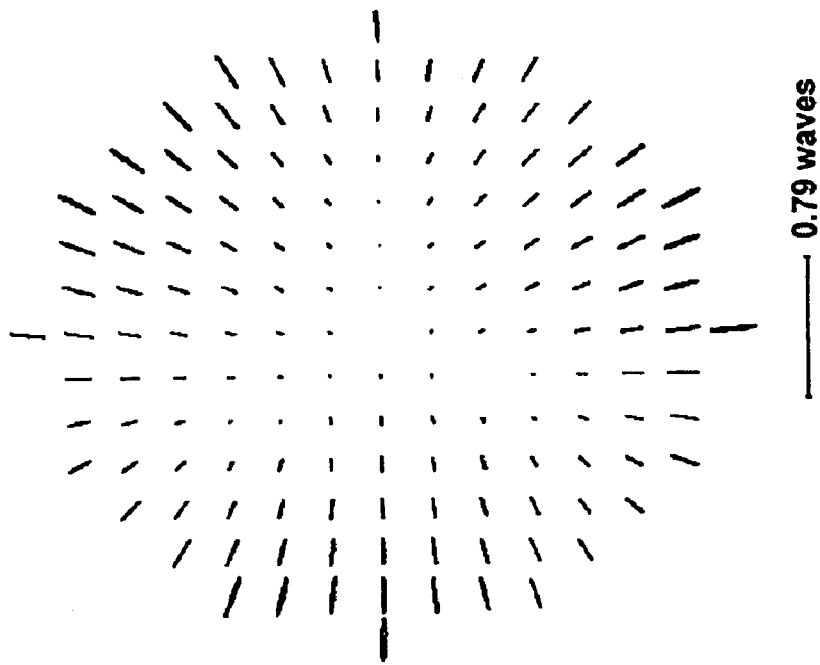
FIG. 48A  Net Retardance of Elements Following Rotators, On-Axis Field — 0.79 waves Retardance, Extreme Field —— 0.10 waves

*FIG. 49B*

Retardance, On-Axis Field

—— 0.077 waves

*FIG. 49A*

STRUCTURES AND METHODS FOR REDUCING ABERRATION IN INTEGRATED CIRCUIT FABRICATION SYSTEMS

PRIORITY APPLICATION

This application claims the benefit of priority under 35 U.S.C. § 119(e) to U.S. Provisional Patent Application No. 60/385,427, filed May 31, 2002 and entitled "Structures and Methods for Reducing Aberrations in Optical Systems", U.S. Provisional Patent Application No. 60/367,911, filed Mar. 26, 2002 and entitled "Structure and Method for Improving Optical Systems", U.S. Provisional Patent Application No. 60/363,808, filed Mar. 12, 2002, and entitled "Correction of Intrinsic Birefringence Using Rotators", U.S. Provisional Patent Application No. 60/332,183, filed Nov. 21, 2001, and entitled "Compensation for Intrinsic Birefringence Effects in Cubic Crystalline Optical Systems" as well as U.S. Provisional Patent Application No. 60/335,093, filed Oct. 30, 2001, and entitled "Intrinsic Birefringence Compensation", which are each hereby incorporated by reference herein in their entirety.

BACKGROUND OF THE INVENTION

1. Field of the Invention

The present invention relates to reducing aberration in optical systems. More particularly, the present invention relates to an apparatus and method for reducing polarization aberrations in optical systems such as lithographic imaging systems comprising cubic crystalline optical elements having intrinsic birefringence.

2. Description of the Related Art

In order to increase levels of device integration for integrated circuit and other semiconductor components, device features having smaller and smaller dimensions are desired. In today's rapidly advancing semiconductor manufacturing industry, the drive is to produce such reduced device features in a reliable and repeatable manner.

Optical lithography systems are commonly used to form images of device patterns upon semiconductor substrates in the fabrication process. The resolving power of such systems is proportional to the exposure wavelength; therefore, it is advantageous to use exposure wavelengths that are as short as possible. For sub-micron lithography, deep ultraviolet light having a wavelength of 248 nanometers or shorter is commonly used. Wavelengths of interest include 193 and 157 nanometers.

At ultraviolet or deep ultraviolet wavelengths, the choice of materials used to form the lenses, windows, and other optical elements of the lithography system is significant. Such optical elements preferably are substantially optically transmissive at short wavelengths used in these lithography systems.

Calcium fluoride and other cubic crystalline materials such as barium fluoride, lithium fluoride, and strontium fluoride, represent some of the materials being developed for use as optical elements for 157 nanometer lithography, for example. These single crystal fluoride materials have a desirably high transmittance compared to ordinary optical glass and can be produced with good homogeneity.

Accordingly, such cubic crystalline materials are useful as optical elements in short wavelength optical systems including but not limited to wafer steppers and other projection printers used to produce small features on substrates such as semiconductor wafers and other substrates used in the semiconductor manufacturing industry. In particular, calcium fluoride finds particular advantage in that it is an easily obtained cubic crystalline material and large high purity single crystals can be grown. These crystals, however, are expensive, and certain orientations, such as the <100> and <110> crytallographic orientations are more expensive than others, like the <111> crystal orientation.

A primary concern regarding the use of cubic crystalline materials for optical elements in deep ultraviolet lithography systems is anisotropy of refractive index inherent in cubic crystalline materials; this effect is referred to as "intrinsic birefringence." For light propagating through a birefringent material, the refractive index varies as a function of polarization and orientation of the material with respect to the propagation direction and the polarization. Accordingly, different polarization components propagate at different phase velocities and undergo different phase shifts upon passing through an optical element comprising birefringent material.

When used for construction of elements of an optical system, the birefringent properties of these cubic crystalline materials may produce wavefront aberrations that significantly degrade image resolution and introduce field distortion. These aberrations are particularly challenging for optical instruments employed in photolithography in today's semiconductor manufacturing industry where high resolution and tight overlay requirements are demanded by an emphasis on increased levels of integration and reduced feature sizes.

It has been recently reported [J. Burnett, Z. H. Levine, and E. Shipley, "Intrinsic Birefringence in 157 nm materials," Proc. $2^{nd}$ Intl. Symp. on 157 nm Lithography, Austin, Intl. SEMATECH, ed. R. Harbison, 2001] that cubic crystalline materials such as calcium fluoride, exhibit intrinsic birefringence that scales as the inverse of the square of the wavelength of light used in the optical system. The magnitude of this birefringence becomes especially significant when the optical wavelength is decreased below 250 nanometers and particularly as it approaches 100 nanometers. Of particular interest is the effect of intrinsic birefringence at the wavelength of 157 nanometers (nm), the wavelength of light produced by an $F_2$ excimer laser, which is favored in the semiconductor manufacturing industry. Strong intrinsic birefringence at this wavelength has the unfortunate effect of producing wavefront aberrations that can significantly degrade image resolution and introduce distortion of the image field, particularly for sub-micron projection lithography in semiconductor manufacturing.

Thus, there is a need to reduce these wavefront aberrations caused by intrinsic birefringence, which can degrade image resolution and cause image field distortion. Such correction is particularly desirable in projection lithography systems comprising cubic crystalline optical elements using light having wavelengths in the deep ultraviolet range.

SUMMARY OF THE INVENTION

One aspect of the invention comprises an optical apparatus having an output. This optical apparatus comprises one or more optical elements with polarization aberrations that alter the output of the apparatus. The optical apparatus further comprises polarization transformation optics, e.g., polarization rotation optics, configured to reduce the contributions of the polarization aberrations to the output.

Another aspect of the invention comprises an optical system comprising at least one cubic crystalline optical element aligned along an optical axis and polarization rotation optics inserted along this optical axis. The at least one cubic crystalline optical element is birefringent and imparts retardance on a beam of light propagating through the optical system along the optical axis. The polarization rotation optics rotates the polarization of the beam of light to reduce the retardance.

In another aspect of the invention, an optical apparatus having an output comprises a plurality of optical elements divided into first and second sections and polarization conversion optics disposed between the first and second optical sections. The first and second sections have associated therewith polarization aberrations originating from variation in optical properties of the respective sections with polarization. The polarization aberrations affect the output of the optical apparatus. The polarization aberrations associated with the first section are substantially similar to the polarization aberrations associated with the second section. The polarization conversion optics are configured to transform an input polarization into a orthogonal output polarization such that the polarization aberrations associated with the first section at least partially offset the polarization aberrations associated with the second section. The effects of polarization aberrations on the output of the optical system are thereby reduced.

Another aspect of the invention comprises an optical imaging system for producing an optical image. This optical imaging system includes one or more powered optical elements with polarization aberration that degrades the optical image. The optical imaging system further comprises a polarization rotation system configured to reduce the contributions of the polarization aberration to the degradation of the optical image.

Still another aspect of the invention comprises an optical apparatus for transmitting a light. This optical apparatus comprises a plurality of optical elements having birefringence that introduces retardance to the light and a circular retarder having orthogonal circular eigenpolarization states. The circular retarder produces phase delay between the eigenpolarization states substantially equivalent to an odd number of quarter wavelengths of the light.

In yet another aspect of the invention, an optical system includes a first optics section for receiving a beam of light having a polarization that is propagating therethrough and a second optics section outputting said beam of light. The first and second optics sections introduce phase delay between orthogonal polarization states of the beam of light. The optical system further includes means for rotating the polarization of the beam to reduce total phase delay between the polarization states of the beam of light output from the optical system.

Another aspect of the invention comprises a method of optically imaging. In this method, light is collected from an object using at least one optical element which introduces first polarization aberrations. The polarization of the light is rotated. The light collected is propagated through at least one element thereby introducing second polarization aberrations which at least partially cancel the first polarization aberrations.

In another aspect of the invention, a method includes propagating light having first and second orthogonal polarization components through a first optics section having first and second eigenpolarization states. The first polarization component is converted into the second polarization component and the second polarization component is converted into the first polarization component. After performing the conversion, light is propagated through a second optics section having first and second eigenpolarization states.

Still another aspect of the invention comprises a method of propagating light. Light having first and second orthogonal polarization components is propagated through first optics comprising one or more cubic crystalline optical elements. The first optics has fast and slow eigenpolarization states. The first and second orthogonal polarization components correspond to the fast and slow eigenpolarization states. The light is propagated through second optics comprising one or more cubic crystalline optical elements. The second optics has fast and slow eigenpolarization states substantially similar in magnitude and orientation to the respective fast and slow eigenpolarization states of the first optics. Prior to propagating the light through the second optics, the polarization of the light is altered such that the first and second orthogonal polarization components correspond to the slow and fast eigenpolarization states, respectively, of the second optics.

Another aspect of the invention comprises a method which includes transmitting a beam of light having a polarization corresponding to the sum of two orthogonal polarization states through at least one birefringent optical element thereby introducing phase delay between the orthogonal polarization states of the beam of light. The polarization of the beam of light is rotated. The light having rotated polarization is transmitted through at least one birefringent element thereby introducing additional phase delay between the orthogonal polarization states to reduce the relative phase difference between the polarization states of the beam of light.

Yet another aspect of the invention comprises a method for forming an optical system with reduced polarization aberration. The method includes providing a plurality of optical elements along a common optical path and inserting polarization rotation optics in said common optical path. The optical system is thereby divided into first and second parts. The first and second parts have associated therewith first and second polarization aberrations, respectively. The polarization rotation optics rotates the polarization of light transmitted therethrough. The optical elements and the polarization rotation optics are selected and arranged to reduce net polarization aberrations produced by the plurality of optical elements.

Another aspect of the invention comprises a method of reducing the retardance caused by intrinsic birefringence in an optical system comprising cubic crystalline optical elements. This method comprises introducing polarization rotation optics into the optical system. The polarization rotation optics are configured to rotate the polarization of a light beam passing therethrough by odd integer multiples of about 90 degrees, such that retardance introduced into an optical beam transmitted through at least one of the cubic crystalline optical element is substantially offset by retardance introduced into the optical beam upon transmitting the beam through at least one of the cubic crystalline optical elements after rotating the polarization of the beam.

Another aspect of the invention comprises a photolithography tool. This photolithography tool includes a light source outputting light for illuminating a reticle and condenser optics positioned to receive light from the light source. The condenser optics are positioned to direct an optical beam formed from the light through the reticle. The photolithography tool further comprises projection optics configured to form an image of the reticle onto a substrate. The projection optics comprise one or more cubic crystalline lens elements receiving the directed optical beam propagated through the reticle and polarization rotation optics positioned along a common optical pathway with the reticle and the one or more cubic crystalline lens elements. The one or more cubic crystalline lens elements has intrinsic birefringence which introduces retardance into the optical beam. The polarization rotation optics rotates the polarization of the optical beam transmitted through the one or more cubic crystalline lens elements.

Another aspect of the invention comprises a method of forming a semiconductor device. In this method, a beam of light is propagated through a reticle. An optical image of the reticle is formed by directing the beam of light into a first part of a projection lens. The first part of the projection lens includes one or more refractive optical elements, which cause the beam of light to become aberrated as a result of first polarization aberrations introduced by the first part of the projection lens. These first polarization aberrations result from variation in an optical property with polarization. The polarization of the beam of light is rotated. The beam of light is then propagated through a second part of the projection lens. The second part of the projection lens includes one or more refractive optical elements. This second part of the projection lens is selected to introduce second polarization aberrations which at least partially cancel the first polarization aberrations, the second polarization aberrations also resulting from variation in an optical property with polarization. A substrate is positioned such that the optical image formed by the beam of light output by the projection lens, is formed on the substrate.

In another aspect of the invention, a semiconductor device is formed according to a process which includes depositing a photosensitive material over a semiconductor wafer, illuminating a mask pattern, and transmitting a beam of light having first and second orthogonal polarization states along an optical path from the mask pattern through at least one optical element. The optical element has instrinsic birefringence such that the first polarization state is phase delayed with respect to the second polarization state. The first and second orthogonal polarization states of said beam of light are rotated and the beam of light, having rotated the first and second orthogonal polarization states, is transmitted through at least one birefringent element. In this manner, the second polarization state is phase delayed with respect to the first polarization state to reduce the relative phase difference between the first and second orthogonal polarization states of the beam of light. After said beam of light is transmitted through the at least one birefringent element, the beam is projected onto said photosensitive material over said semiconductor wafer. Portions of photosensitive material are removed to form a pattern in the photosensitive material that resembles the mask pattern, and the semiconductor wafer having the patterned photosensitive material thereon is processed.

Yet another aspect of the invention comprises a photolithography tool that includes a light source outputting light for illuminating a reticle and condenser optics positioned to receive light from the light source. The condenser optics is positioned to direct an optical beam formed from the light through the reticle. The photolithography tool further comprises projection optics configured to form an image of the reticle onto a substrate. The condenser optics includes one or more cubic crystalline optical elements which receive the light from the light source. The one or more cubic crystalline optical elements have intrinsic birefringence which introduces retardance into the optical beam. The condenser further includes polarization rotation optics positioned along a common optical pathway through the one or more cubic crystalline optical elements. The polarization rotation optic rotates the polarization of the light transmitted through the one or more cubic crystalline optical elements.

Another aspect of the invention comprises an optical system comprising one or more cubic crystalline lens elements having intrinsic birefringence and a substantially optically transmissive element comprising a cubic crystalline central portion and a clamp secured thereto. The cubic crystalline central portion has a birefringence induced by compressive force imparted by the clamp. This birefringence increases radially away from an optical axis passing through the central portion. The compressive force produces an amount of radially increasing birefringence to at least partially offset the intrinsic birefringence of the one or more cubic crystalline lens elements. The substantially optically transmissive element may comprise a lens element. The cubic crystalline central portion may comprise cubic crystalline fluoride material such as cubic crystalline calcium fluoride. In various embodiments, the birefringence may increase quadratically from the optical axis. The clamp may also comprise a hoop. Furthermore, the optical system may include polarization rotation optics. Additionally, in some embodiments, a common optical axis may extend through the one or more cubic crystalline lens elements and through the substantially optically transmissive element and the birefringence induced by the compressive force may increase radially away from the common optical axis.

Another aspect of the invention comprises a method for reducing retardance in an optical beam passing through an optical system comprising one or more cubic crystal optical elements forming an optical path. In this method an amount of force is applied to at least one of the cubic crystalline optical elements to produce a stress-induced birefringence increasing in magnitude substantially symmetrically away from a central axis passing therethrough. The amount of applied force is selected to produce a birefringence to reduce retardance in the optical beam passing therethrough. This stress-induced birefringence may increase monotonically with distance from the central axis. The stress-induced birefringence may increase quadratically with distance from the central axis. In some embodiments, the method may further comprise selecting and orienting said optical elements so as to reduce said retardance. Also, the method may include rotating the polarization of the beam to reduce said retardance.

Yet another aspect of the invention comprises a method for reducing retardance in an optical beam propagating across an optical path through an optical system comprising one or more cubic crystal lens elements aligned along a common optical axis. The method comprises replacing one of the cubic crystal lens elements having a first optical power with two or more cubic crystal optical elements. The two or more cubic crystal optical elements together have a second optical power substantially matching the first optical power. The two or more cubic crystal optical elements may also comprise cubic crystal having crystal axes oriented differently. The two or more cubic crystal optical elements may comprise cubic crystal having different crystal axis substantially aligned along the common optical axis. One of the cubic crystal lens elements may be replaced with a [100] and a [110] cubic crystal element having respective [100] and [110] cubic crystal axes substantially aligned with the common optical axis. One of the cubic crystal lens elements may be replaced with a [111] and a [110] cubic crystal element having respective [111] and [110] cubic crystal axes substantially aligned with the common optical axis. Also, one of the cubic crystal lens elements may be replaced with a [100] and a [111] cubic crystal element having respective [100] and [111] cubic crystal axes substantially aligned with the common optical axis. In some embodiments, the two or more cubic crystal optical elements may comprise cubic crystal having substantially the same crystal axis substantially aligned along the common optical axis, and the method may further comprise rotating said optical elements about the optical axis to an orientation that reduces retardance in said optical beam. One of the cubic crystal lens elements may be replaced with two [111] cubic crystal lens elements having respective [111] cubic crystal axes substantially aligned with the common optical axis. Also, in various embodiments, the method may further comprise inserting polarization rotation optics in the optical path to rotate the polarization of the beam and to reduce beam retardance.

In still another aspect of the invention, an optical system that outputs light comprises first and second sections each comprising a plurality of symmetrically shaped calcium fluoride lens elements and a retardation reduction system between the first and second sections. Each of the calcium fluoride lens elements is symmetrical about a respective optical axis passing therethough. The plurality of symmetrically shaped calcium fluoride lens elements are arranged along an optical path. The symmetrically shaped calcium fluoride lens elements in the first and second sections together comprise at least about 80% by weight [111] cubic crystalline calcium fluoride having a [111] crystal direction substantially parallel to the respective optical axis. This optical system may comprise a photolithography system, for use for example, in fabricating semiconductor and/or other devices. In various embodiments, the polarization reduction system reduces retardance produced by the plurality of symmetrically shaped calcium fluoride lens elements in each of the first and second sections together, such that the retardance of the light output by said optical system onto a reference surface is less than or equal to about 0.020 waves rms at each location on the reference surface. In some embodiments, the retardance of the light output by said optical system onto a reference surface is less than or equal to about 0.010 waves rms at each location on the reference surface. This reference surface may correspond, for example, to the exit pupil of the optical system, to a wafer, to the format of a photolithography instrument but it is not limited to these examples.

In still another aspect of the invention, an optical imaging system includes a plurality of first lens elements arranged along a common optical axis. The first lens elements comprise [111] cubic crystalline calcium fluoride having a [111] crystal direction substantially along the common optical axis passing through the first lens elements. The optical imaging system further comprises a plurality of second lens elements arranged along the optical axis. The second lens elements comprise material selected from the group tconsisting of [100] cubic crystalline calcium fluoride having a [100] crystal direction substantially along the common optical axis passing through the second lens element and [110] cubic crystalline calcium fluoride having a [110] crystal direction substantially along the common optical axis passing through the second lens element. The plurality of first lens elements outweigh the plurality of second lens elements at least by a ratio of about 4 to 1 and the plurality of first lens elements. The plurality of second lens elements have positions, shapes, and rotational orientations about the common optical axis so that less than about 0.015 waves rms of retardance is produced by the plurality of first lens element and the plurality of second lens elements together. This optical system may comprise an optical lithography system.

In yet another aspect of the invention, an optical system comprises a first plurality of [111] cubic crystalline lens elements, polarization transforming optics, and a second plurality of [111] cubic crystalline lens elements. The first plurality of [111] cubic crystalline lens are arranged along an optical path for receiving an optical beam having a first polarization. The polarization transforming optics transform the first polarization of the optical beam into a second polarization. The second plurality of [111] cubic crystalline lens elements are arranged along an optical path for receiving the optical beam having the second polarization. Each of the [111] cubic crystalline lens elements are symmetrical with respect to an optical axis passing though the respective lens element. Each of the [111] cubic crystalline lens elements also comprise [111] cubic crystalline calcium fluoride having a [111] crystal axis substantially parallel to an optical axis passing through the respective lens elements. Furthermore, the first plurality of [111] cubic crystalline lens elements imparts a first retardance on the optical beam and the second plurality of [111] optical elements imparts a second retardance on the optical beam that at least partially compensates for the first retardance. In various embodiments, this optical system may be a photolithography system.

Another aspect of the invention comprises a method of reducing retardance in an optical beam propagating through at least one [111] optical element, the optical beam having a polarization corresponding to the sum of two orthogonal polarization states. In this method, the polarization of the optical beam is altered after the optical beam has propagated through the at least one [111] optical element and has acquired a first phase shift between the two orthogonal polarization states. The optical beam having altered polarization is propagated through at least one [111] optical element thereby imparting a second phase shift between the two orthogonal polarization states that at least partially counters the first phase shift. This method may be employed to reduce retardance in optical lithography systems.

In still another aspect of the invention, an optical system comprises a plurality of calcium fluoride lens elements each having respective optical axes. The plurality of calcium fluoride lens elements are aligned along an optical path for propagation of light therethrough. Each of the calcium fluoride lens elements in the optical system comprises cubic crystalline calcium fluoride that is aligned with its [111] lattice direction substantially parallel with the respective optical axes. This optical system may be a photolithography system for use for example in fabricating semiconductor devices.

BRIEF DESCRIPTION OF THE DRAWINGS

A more complete understanding of the present invention and advantages thereof may be acquired by referring to the following description, taken in conjunction with the accompanying drawings in which like reference numbers indicate like features and wherein:

FIGS. 8A and 8B are graphical illustrations of the retardance across the system exit pupil for field points at the center and edge of the field, respectively, for an optical system such as shown in FIG. 6, wherein the refractive element comprises cubic crystalline material having with its [100] crystal axis aligned along optical axis;

FIGS. 9A and 9B are graphical illustrations of the retardance across the system exit pupil for field points at the center and edge of the field, respectively, for an optical system such as shown in FIG. 6, wherein the refractive element comprises cubic crystalline material having with its [110] crystal axis aligned along optical axis;

FIGS. 19A and 19B are graphical illustration; of the net retardance across the pupil for central and extreme field points, respectively, for the lens depicted in FIG. 1 wherein the optical elements comprise cubic crystalline material with crystal axes substantially identically aligned in three dimensions, with the optical axis extending along the [110] crystal lattice direction computed using a peak birefringence magnitude corresponding to that of calcium fluoride at a wavelength of 157 nm;

FIGS. 33A, 33B, 33C, and 33D are contour plots showing the residual wavefront error for the exemplary lens depicted in FIG. 32;

FIG. 33A shows the wavefront error for an input polarization in the X direction (used with an exit pupil analyzer in the X direction) for the central field point;

FIG. 33B shows the wavefront error for an input polarization in the X direction (used with an exit pupil analyzer in the X direction) for the extreme field point;

FIG. 33C shows the wavefront error for an input polarization in the Y direction (used with an exit pupil analyzer in the Y direction) for the central field point;

FIG. 33D shows the wavefront error for an input polarization in the Y direction (used with an exit pupil analyzer in the Y direction) for the extreme field point;

FIGS. 34A and 34B are graphical illustrations showing net retardance across the pupil for the exemplary lens depicted in FIG. 32 for central and extreme field points, respectively, in which all elements are cubic crystals with crystal axes substantially identically aligned in three dimensions, with the optical axis extending generally along the [110] crystal lattice direction computed for a peak birefringence magnitude corresponding to that of calcium fluoride at a wavelength of 157 nm;

FIG. 41A shows the wavefront error for an input polarization in the X direction (used with an exit pupil analyzer in the X direction) for the central field point;

FIG. 41B shows the wavefront error for an input polarization in the X direction (used with an exit pupil analyzer in the X direction) for the extreme field point;

FIG. 41C shows the wavefront error for an input polarization in the Y direction (used with an exit pupil analyzer in the Y direction) for the central field point;

FIG. 41D shows the wavefront error for an input polarization in the Y direction (used with an exit pupil analyzer in the Y direction) for the extreme field point;

FIG. 46 is a schematic cross-sectional view showing an exemplary lens similar to that depicted in FIG. 29, with twenty powered refractive elements comprising cubic crystalline material with crystal axes substantially identically aligned in three dimensions, with the optical axis extending along the [111] crystal lattice direction, further comprising −90° and 90° polarization rotators, with the optical element closest to the wafer derived by splitting a single powered refractive optical element, and having a toroidal surface.

FIGS. 47A and 47B are graphical illustrations showing net retardance across the pupil for the central and extreme field points, respectively, for the optical elements between the −90° and 90° polarization rotators for the exemplary lens depicted in FIG. 46;

FIGS. 48A and 48B are graphical illustrations showing net retardance across the pupil for the central and extreme field points, respectively, for the optical elements between the 90° polarization rotator and the image plane for the exemplary lens depicted in FIG. 46; and FIGS. 49A and 49B are graphical illustrations showing net retardance across the pupil at the central and extreme field points, respectively, for all elements and the 90° and −90° polarization rotators for the exemplary lens depicted in FIG. 46.

DETAILED DESCRIPTION OF THE PREFERRED EMBODIMENTS

Figure 1:
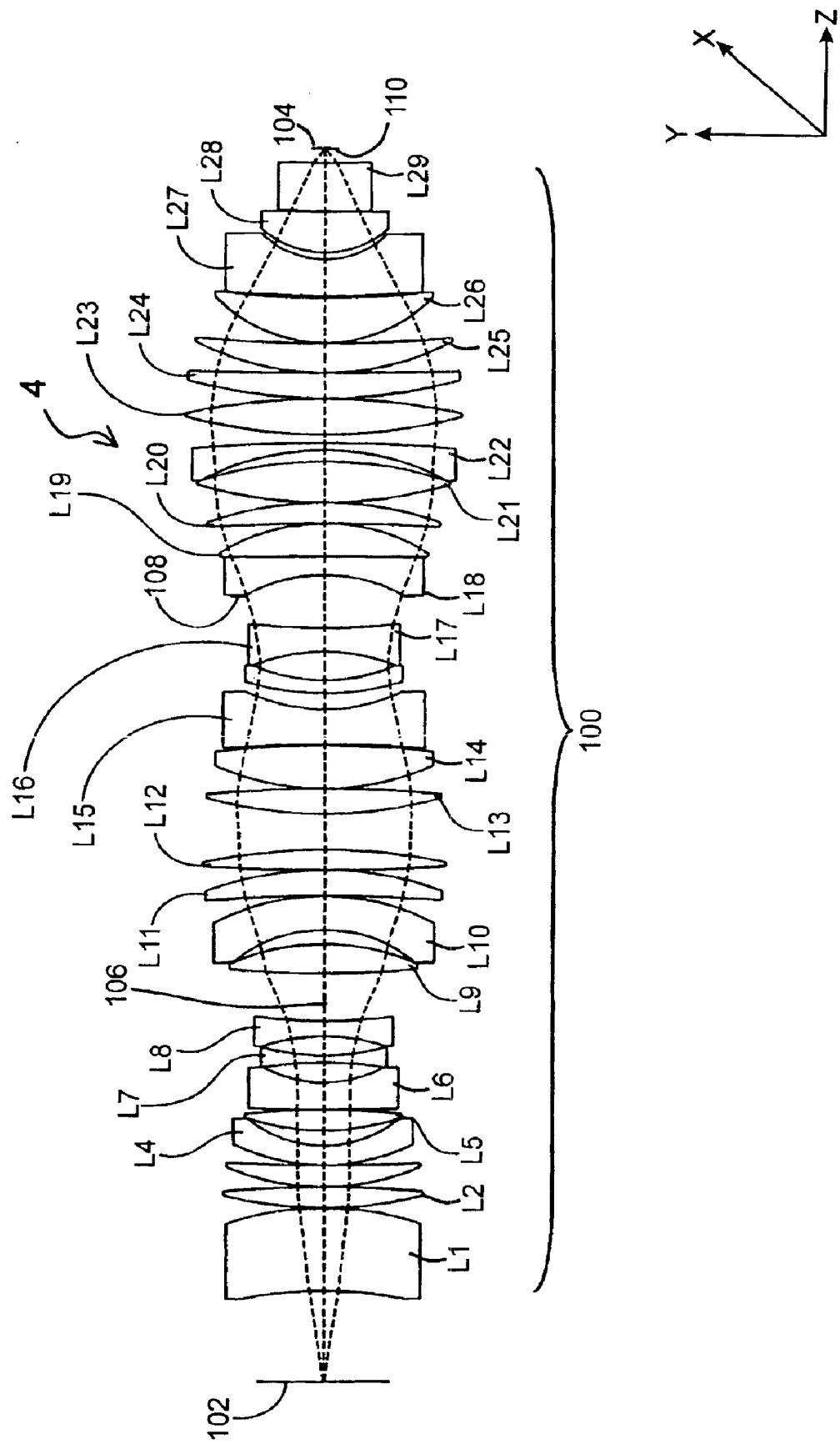
FIG. 1 is a cross-sectional view of a projection optics for an exemplary lithography system comprising twenty-nine refractive optical elements.

It is well-known that cubic crystalline materials like calcium fluoride are favored in lithography systems, such as the high performance photolithographic tools used in the semiconductor manufacturing industry. These crystalline materials are substantially transmissive to short wavelength UV light, which provides for high optical resolution. It is also well-known, however, that these cubic crystalline materials exhibit intrinsic birefringence, i.e., an inherent anisotropy in refractive index.

Birefringence, or double-refraction, is a property of refractive materials in which the index of refraction is anisotropic, that is, the index of refraction and thus the phase velocity is different for different polarizations. For light propagating through a birefringent material, the refractive index varies as a function of polarization and orientation of the material with respect to the polarization and thus the propagation direction. Unpolarized light propagating through a birefringent material will generally separate into two beams with orthogonal polarization states. These beams may be referred to as eigenpolarization states or eigenpolarizations. The two beams propagate through the material with a different phase velocity. As the light passes through a unit length of the birefringent material, the difference in phase velocity for the two ray paths will produced a phase difference between the polarizations, which is conventionally referred to as retardance. These two states having different phase velocities may be referred to as the slow and fast eigenpolarization states.

Birefringence is a unitless quantity, although it is common practice in the lithography community to express it in units of nanometer per centimeter (nm/cm). Birefringence is a material property, while retardance is an optical delay between polarization states. The retardance for a given ray through an optical system may be expressed in nanometers (nm), or it may be expressed in terms of number of waves of a particular wavelength.

In uniaxial crystals, such as magnesium fluoride or crystal quartz, the direction through the birefringent material in which the two orthogonal polarizations travel with the same velocity is referred to as the birefringence axis. The term optic axis is commonly used interchangeably with birefringence axis when dealing with single crystals. In systems of lens elements, the term optical axis usually refers to the symmetry axis of the lens system. To avoid confusion, the term optical axis will be used hereinafter only to refer to the symmetry axis in a lens system. For directions through the material other than the birefringence axis, the two orthogonal polarizations will travel with different velocities. For a given incident ray upon a birefringent medium, the two refracted rays are commonly described as the ordinary and extraordinary rays. The ordinary ray is polarized perpendicular to the birefringence axis and refracts according to Snell's Law, and the extraordinary ray is polarized perpendicular to the ordinary ray and refracts at an angle that depends on the direction of the birefringence axis relative to the incident ray and the amount of birefringence. In uniaxial crystals, the birefringence axis is oriented along a single direction, and the magnitude of the birefringence is constant throughout the material. Uniaxial crystals are commonly used for optical components such as retardation plates and polarizers.

In contrast, however, cubic crystals have been shown to have both a birefringence axis orientation and magnitude that vary depending on the propagation direction of the light with respect to the orientation of the crystal lattice. In addition to birefringence, which is the difference in the index of refraction seen by the two eigenpolarizations, the average index of refraction also varies as a function of angle of incidence, which produces polarization independent phase errors.

Optical elements constructed from a cubic crystalline material, may cause a wavefront to be retarded as a result of the intrinsic birefringence of the optical element. Moreover, the retardance magnitude and orientation at a given point on the wavefront may vary, because the local propagation angle with respect to the material varies across the wavefront. Such variations in retardance across the wavefront may be referred to as "retardance aberrations." Retardance aberrations split a uniformly polarized or unpolarized wavefront into two wavefronts with orthogonal polarizations. Again, these orthogonal wavefronts correspond to the eigenpolarization states. Each of the orthogonal wavefronts will experience a different refractive index, resulting in different wavefront aberrations.

Optical elements comprising cubic crystalline material therefore introduce additional aberrations that are correlated with polarization. These aberrations are generally referred to herein as polarization aberrations and include the retardance aberrations described above which result from intrinsic birefringence in cubic crystalline materials. Additionally, these polarization aberrations include diattenuation, the variation in optical transmission with polarization.

In cubic crystalline material, these polarization aberrations are significant enough to affect image quality in optical systems such as photolithography system used in semiconductor fabrication processing. Accordingly, methods and apparatus for reducing these aberrations have significant value.

For ease of description, the cubic crystalline materials have crystal axis directions and planes described herein using the well-known Miller indices, which are integers with no common factors and that are inversely proportional to the intercepts of the crystal planes along the crystal axes. Lattice planes are given by the Miller indices in parentheses, e.g. (100), and axis directions in the direct lattice are given in square brackets, e.g. [111]. The crystal lattice direction, e.g. [111], may also be referred to as the [111] crystal axis of the material or optical element. The (100), (010), and (001) planes are equivalent in a cubic crystal and are collectively referred to as the {100} planes.

As discussed above, for cubic crystalline materials, the magnitude of birefingence depends on the direction of light propagation through the crystal with respect to the orientation of the crystal axes. For example, light propagating through an exemplary cubic crystalline optical element along the [110] crystal axis experiences the maximum birefringence, while light propagating along the [100] crystal axis experiences no birefringence.

Unfortunately, when constructing optical systems from cubic crystalline materials such as calcium fluoride, the cost of the optical elements contributes significantly to the total cost of these optical systems. In particular, the expense of the materials used to fabricate the refractive optical elements drives up the cost. Moreover, optical elements comprising calcium fluoride having an optical axis directed along the [100] crystalline directions, which has the least intrinsic birefringence, is the most expensive to fabricate. Blanks for creating refractive elements having an optical axis corresponding to the [110] are also expensive. In contrast, calcium fluoride grown (or cleaved) in the [111] direction is significantly less expensive to fabricate. However, as described above, optical elements having an optical axis generally coinciding with the [111] direction of the crystalline material although least expensive, possess intrinsic birefringence which introduces wavefront aberrations that degrade performance of optical systems such as image quality and resolution. Although both [100] and [111] optical elements have zero birefringence along their respective optical axes, for [100] optical elements, the birefringence increase more slowly for rays further and further off-axis.

FIG. 1 is a schematic illustration of a projection optics section of an exemplary lithography system. The optical system 100 shown in FIG. 1 is substantially similar to the optical system shown and described European Patent Application No. 0 828 172 by S. Kudo and Y. Suenaga, the contents of which are incorporated herein by reference in their entirety. This exemplary optical system 100 is a large format refractive projection lens having an NA of 0.75, a peak wavelength of 193.3 nm and providing a 4× reduction. Such an optical system is intended to be exemplary only and other optical imaging systems and non-imaging systems may be used in other embodiments. The optical system 100, however, may be the projection optics section of a lithography tool in one preferred embodiment. As shown in FIG. 1, the projection lens 100 is disposed between a reticle 102 and a substrate 104. The reticle 102 may be considered to correspond to the object field with the substrate 104 in the image field of the projection lens 100.

The optical system 100 shown is a lens system, commonly referred to collectively as a "lens," comprising a plurality of, i.e., twenty-nine, individual lens elements L1–L29, an optical axis 106, and aperture stop (AS) 108. The reticle 102 includes a mask pattern, which is to be projected onto a surface 110 of the substrate 104. Substrate 104 may, for example, be a semiconductor wafer used in the semiconductor manufacturing industry, and surface 110 may be coated with a photosensitive material, such as a photoresist commonly used in the semiconductor manufacturing industry. Other substrates may be used according to other embodiments and applications. Reticle 102 may be a photomask suitable for various microlithography tools. Generally speaking, the reticle or photomask, hereinafter referred to collectively as reticle 102, includes a pattern in the object field. The pattern may for example be clear and opaque sections, gray scale sections, clear sections with different phase shifts, or a combination of the above. Light is propagated through the pattern, and the pattern is projected through the lens system 100 and onto surface 110 of substrate 104. The pattern projected from the reticle 102 onto substrate surface 110 may be uniformly reduced in size to various degrees such as 10:1, 5:1, 4:1 or others. The optical system 100 may have a numerical aperture, NA, of 0.75, but is not so limited. Systems having other numerical apertures, such as for example between about 0.60 to 0.90 or beyond this range are conceivable.

The arrangement of the plurality of lens elements L1–L29, is intended to be exemplary only and various other arrangements of individual lens elements having various shapes and sizes and comprising different materials may be used according to other exemplary embodiments. The element thicknesses, spacings, radii of curvature, aspheric coefficients, and the like, are considered to be the lens prescription. This lens prescription is not limited and will vary with application, performance requirements, cost, and other design considerations.

The optical system 100 shown in FIG. 1, includes twenty-nine individual lenses or powered refractive optical elements. Each of these are preferably substantially optically transmisive at the wavelength of operation. More or less optical elements may be included in other designs. In other embdiments, these elements may be powered or unpowered, refractive, reflective, or diffractive and may be coated or uncoated. The individual lens elements, L1–L29, are arranged along the common optical axis 106 that extends through the lens 100. In the exemplary embodiment of FIG. 1, this optical axis 106 is linear.

In the case where the optical system 100 comprises a plurality of individual lens elements L1–L29, or other optically transmissive components, preferably one or more comprises cubic crystalline material. Cubic crystalline materials such as for example single crystal fluoride materials like strontium fluoride, barium fluoride, lithium fluoride, and calcium fluoride may be used. Calcium fluoride is one preferred material for operation with ultraviolet (UV) light. In an exemplary embodiment, most or even all of the cubic crystalline optical elements are formed of the same cubic crystalline material. This cubic crystalline material may also have the same crystallographic orientation with respect to the optical axis of the lens 100. In one preferred embodiment, a majority of the lens elements comprise cubic crystal such as cubic crystal calcium fluoride having a <111> crystal axis substantially aligned with the optical axis, as these crystals are less expensive than other crystallographic directions. In one embodiment, all of the lens or powered optical elements comprise <111> crystal. Non-powered transmissive optical elements, if any, may also comprise <111> crystal. The lens 100 may also include lens elements, which are formed of non-cubic crystalline material such as low-OH fused silica, also known as dry fused silica.

Figure 2:
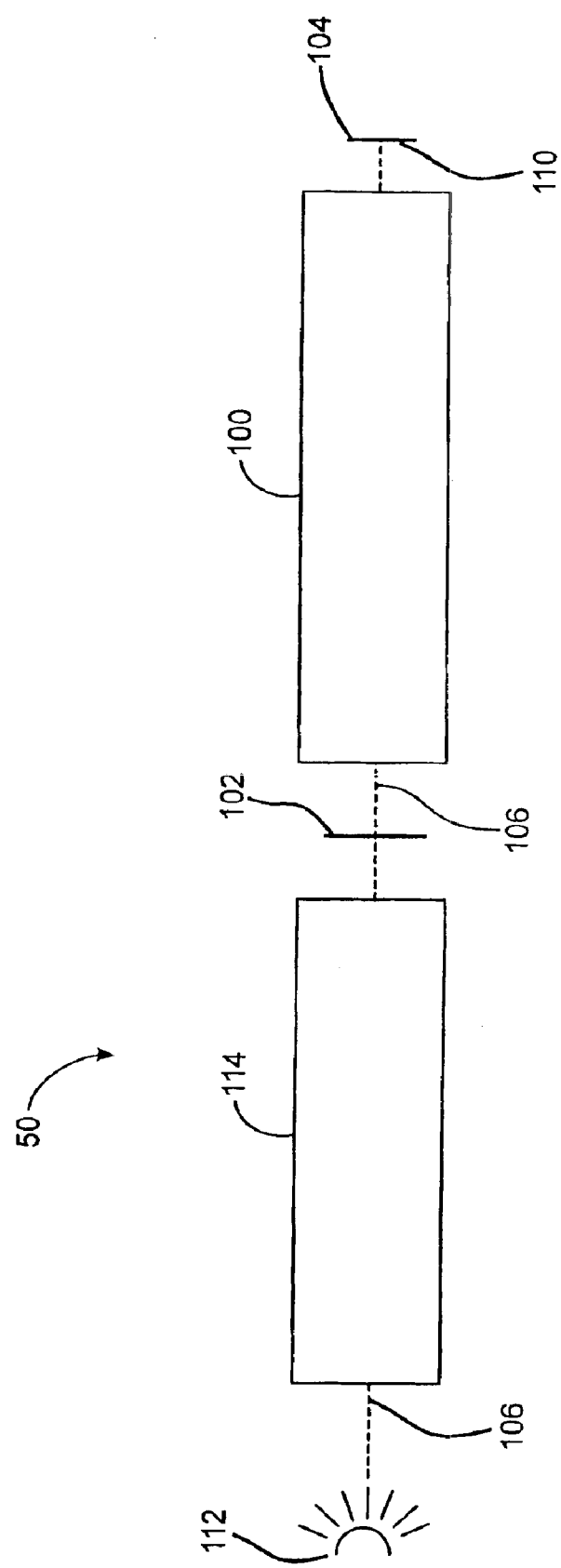
FIG. 2 is a schematic diagram of an exemplary lithography system including a condenser lens and projection optics.

FIG. 2 is a schematic illustration showing the optical system 100 functioning as the projection optics section within a larger lithography tool 50. FIG. 2 shows an optical source 112 and the substrate 104. The reticle 102 is disposed between condenser optics 114 and projection optics 100. The optical field of reticle 102 may be of various dimensions. Each of projection optics 100 and condenser optics 114 may include an aperture stop and a plurality of lens elements, windows, and other refractive, reflective, catadioptric, and diffractive members. The lithography tool 50 shown in FIG. 2 is aligned along the optical axis 106, which in this case is linear. This lithography tool 50 may be a wafer stepper, projection printer, or other photolithography or microlithography tool used in the semiconductor industry. The lithography tool 50 may likewise be a scanning optical system, a step-and-repeat optical system or other microlithography or projection optics system. In a scanning-type optical system, a pattern on reticle 102 is projected and scanned onto corresponding sections of surface 110 of substrate 104. In a step-and-repeat optical system, such as a conventional wafer stepper, the pattern on reticle 102, is projected onto multiple different portions of surface 110 in a plurality of discrete operations. In either case, the reticle pattern includes various field points which are projected onto surface 110 simultaneously.

The pattern printed on reticle 102 may be used to create a circuit pattern on surface 110 for an integrated circuit device being fabricated on the substrate 104. The pattern may be projected onto a photosensitive material formed on surface 110 to create an exposure pattern. The exposure pattern may be developed using conventional means, to produce a photo-pattern in the photosensitive material. The photo-pattern may be translated into the substrate 104 by etching or other method. A plurality of layers of materials can be deposited thereon. The surface 110 may be one of the layers and the photo-pattern formed on the layer. Etching or other techniques may be used to translate the photo-pattern into the layer. Similarly-formed photo-patterns may be used to enable spatially selective doping using known methods such as ion implantation. In this manner, multiple photolithographic operations, may be used to form various patterns in various layers to create a completed semiconductor device such as an integrated circuit. An advantage of the innovative techniques described herein is that images formed on the substrate 104 have sufficiently low aberration to enable precisely dimensioned and aligned device features to be created having reduced sizes.

In one exemplary scanning optical system, the optical field of reticle 102 which is projected and scanned onto the substrate surface 110 has a height of about 26 millimeters and a width of a few millimeters. Other field dimensions may be used which are suitable for the specific applications and may depend on the type of lithography tool in which the projection optics are included. Similarly, the format at the image plane where the wafer is located may vary as well.

The optical source 112 produces light that is subsequently shaped and conditioned by condenser lens 114. The optical wavelength of source 112 may vary, and may be no greater than 248 nanometers in some cases. In one preferred embodiment, light having a wavelength of about 157 nanometers may be used. The optical source 112 may produce linearly polarized light. One optical source that produces linearly polarized light is an excimer laser. In other embodiments, the optical source 112 may produce light having other polarizations or which is substantially non-polarized. A KrF excimer laser operating at about 248 nm, an ArF excimer laser operating at about 193 nm, or an $F_2$ excimer laser operating at about 157 nm, are examples of various optical sources 112.

The light produced by the optical source 112 is shaped and conditioned by the condenser lens 114 and propagated through the reticle 102 and the projection optics 100 to project an image of the reticle 102 or photomask onto the substrate 110. This light may be described as a light beam comprised of a plurality of rays. In accordance with convention, the marginal ray is the ray from the point on the object field 102 intersecting the optical axis 106, to the edge of the aperture 108 and also intersects the axis 106 at the image field 104. The chief ray is the ray from a given field point that passes through the center of the aperture stop 108 and system pupils in the optical system 100. For an object field point located where the optical axis 110 intersects the reticle 102, the chief ray travels along the optical axis 106. Light rays emanating from an individual object field point on the reticle or photomask 102 correspond to a wavefront that is propagated through the projection lens 100 and are focus down to a corresponding image field point at the substrate 104. The full image field is therefore generated by a plurality image field points with corresponding wavefronts associated therewith.

Figure 3B:
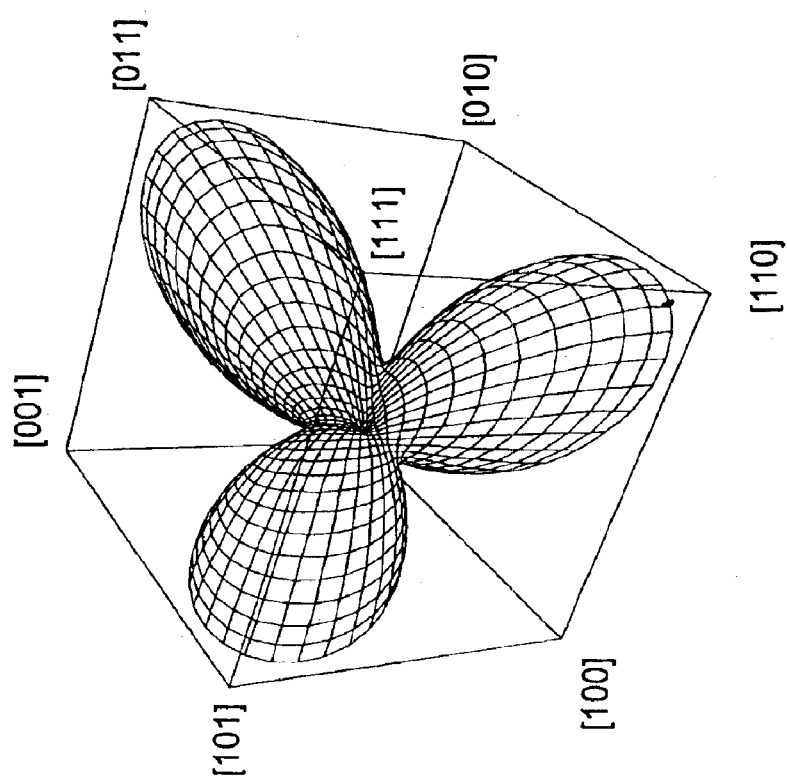
FIG. 3B is a graphical representation of variation of birefringence magnitude with respect to a cubic crystal lattice.
Figure 3A:
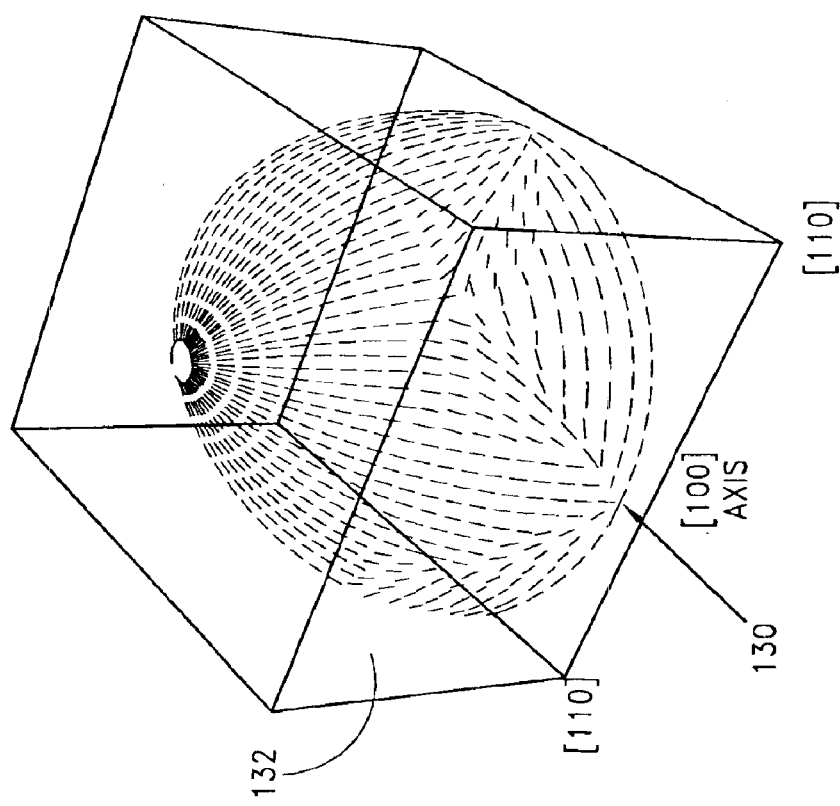
FIG. 3A is a graphical representation of variation of birefringence axis orientation with respect to a cubic crystal lattice.

As describe above, these wavefronts may be aberrated as a result of retardance arising from intrinsic birefringence which has magnitude and orientation that varies with direction in cubic crystalline materials. FIG. 3A is a three-dimensional vector plot showing the spatial variation in birefringence axis orientation within a material having a cubic crystalline lattice. The cubic crystalline lattice may be that of calcium fluoride, for example. The crystal axis directions shown in FIG. 3A as well as in FIG. 3B are described using Miller indices. FIG. 3B is a three-dimensional plot corresponding to a quadrant of the vector plot shown in FIG. 3A, and depicts the corresponding magnitude of the intrinsic birefringence. It can be seen that the localized magnitude and axis of the birefringence vary spatially throughout the crystal in a known fashion. It can also be seen that, depending on the direction along which light travels through such a cubic crystalline material, the birefringence magnitude and the orientation of the birefringence axis relative to the direction of propagation will vary. FIG. 3B represents an octant of the crystal lattice; the extension of this diagram to all possible directions through the crystal gives twelve directions with maximum birefringence, herein referred to as birefringence lobes.

The crystalline material can therefore be advantageously cut along a given plane and arranged such that light normal to that plane travels along a chosen axis direction. For example, light traveling along the [100] crystal axis 130 (i.e. along the [100] crystal lattice direction), which is oriented normal to the (100) crystal lattice plane 132, sees a fixed and deterministic localized intrinsic birefringence. The birefringence magnitude and birefringence axis direction encountered by a given ray therefore varies as a function of the direction along which the light ray travels through the crystal.

Figure 4:
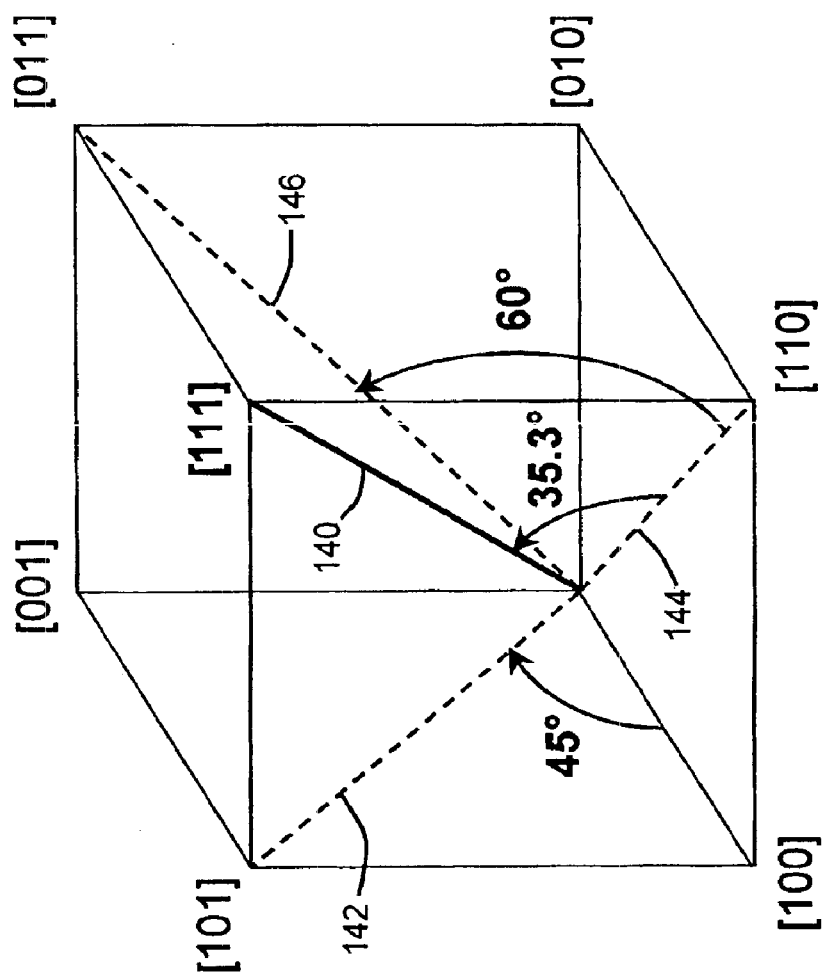
FIG. 4 is a perspective view showing angular relationships between various directions through an exemplary cubic crystalline lattice.

FIG. 4 is a perspective view showing angular relationships between various directions through an exemplary cubic crystalline lattice. The cubic crystalline lattice may be that of calcium fluoride, for example. FIG. 4 includes the peak intrinsic birefringence directions along the [101], [110], and [011] lattice directions, indicated by lines 142, 144, and 146, respectively. Line 140 represents the [111] crystal axis direction, which corresponds to a direction through the crystal without intrinsic birefringence.

Figure 5:
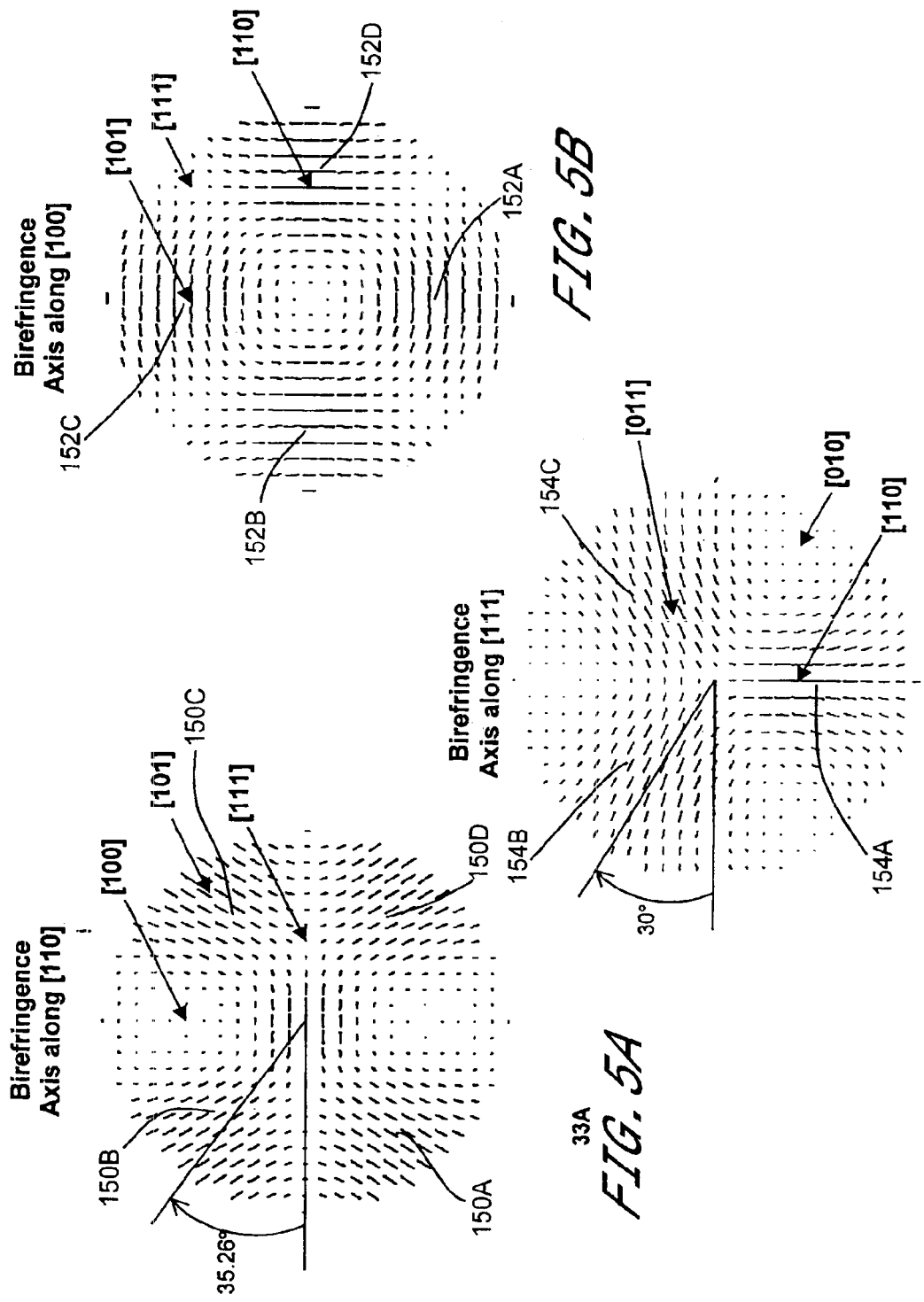
FIG. 5A is a graphical illustration of birefringence magnitude and birefringence axis orientation in angular space for a cubic crystalline material with respect to the [110] lattice direction and indicates the azimuthal orientations of the off-axis peak birefringence lobes.
FIG. 5B is a graphical illustration of birefringence magnitude and birefringence axis orientation in angular space for a cubic crystalline material with respect to the [100] lattice direction and indicates the azimuthal orientations of the off-axis peak birefringence lobes.
FIG. 5C is a graphical illustration of birefringence magnitude and birefringence axis orientation in angular space for a cubic crystalline material with respect to the [111] lattice direction and indicates the azimuthal orientations of the off-axis peak birefringence lobes.

FIGS. 5A, 5B, and 5C are schematic representations of the variations in birefringence magnitude and birefringence axis orientation in angular space for optical axis 106 orientations in the [110], [100], and [111] lattice directions, respectively, for the cubic crystalline lattice structure shown in FIG. 4. The center of the plot represents the birefringence encountered by a ray traveling along the indicated crystal axis and normal to the plane of the illustration. Birefringence depicted at increased radial distance from the center represents the birefringence for rays at increased angles of propagation with respect to the optical axis 106. These plots, therefore can be used to visualize the birefringence encountered from a plurality of rays emanating from a point, e.g. on the optical axis 106 through a lens element comprising for example [111] material. The ray through the optical axis 106 propagates in the [111] direction through the center of the lens element and encounters a birefringence with magnitude and orientation specified at the center of the plot. A ray emanating from the point on the axis but angled will experience birefringence specified by the direction indicated on these plots. In each of FIGS. 5A–5C, the localized birefringence axis is indicated by the direction of lines plotted on a square grid, and the magnitude is indicated by the relative length of the lines.

The variation of birefringence magnitude in FIGS. 5A-5C is characterized by several lobes, also referred to as nodes, distributed azimuthally in which the birefringence is maximized. Each of FIGS. 5A–5C shows peak intrinsic birefringence lobes with respect to the various crystal axis directions in the cubic crystalline lattice shown in FIG. 4. The spatial orientation of the cubic crystalline lattice is indicated by the other related crystalline lattice directions indicated by the arrows. For example, in FIG. 5A in which the center represents birefringence encountered by a ray traveling along the [110] crystal axis, a ray traveling along the [101] lattice direction is at a greater angle with respect to the [110] crystal axis than a ray traveling along the [111] lattice direction; these ray angles are at 60° and 35.3°, respectively. This is indicated by the [101] arrowhead positioned at a greater radial distance from center than the [111] arrowhead. The relative azimuthal directions of the indicated [100], [101], and [111] lattice directions are as shown in FIG. 4. This description applies to FIGS. 5B and 5C as well.

Referring to FIGS. 5A–5C, in each case, the indicated crystal axis is the direction normal to the plane of the paper and at the center of each of the respective figures. FIG. 5A shows intrinsic birefringence with respect to the [110] lattice direction, including peak intrinsic birefringence lobes 150A, 150B, 150C and 150D, each which forms an angle of 60° with respect to the [110] crystal axis direction. Intrinsic [110] birefringence also includes a central birefringence node. FIG. 5B shows intrinsic birefringence with respect to the [100] lattice direction, including peak birefringence lobes 152A, 152B, 152C and 152D each of which forms a 45° angle with respect to the [100] crystal axis direction. There are also peaks along the diagonals at 90° not depicted. FIG. 5C shows intrinsic birefringence along the [111] lattice direction and which includes peak birefringence lobes 154A, 154B, and 154C, each of which forms an angle of 35.3° with respect to the [111] crystal lattice direction.

The crystal lattice and resulting intrinsic birefringence lobes with respect to the crystal axes such as shown in FIGS. 5A–5C, correspond to the exemplary case in which the cubic crystals are negative cubic crystals; that is the ordinary refractive index is greater than the extraordinary index, so the birefringence, $n_e - n_o$, is negative. Calcium fluoride is an example of a negative cubic crystal. For positive cubic crystals, the patterns would be substantially similar except the lines would be each rotated by 90 degrees about their midpoints. It should be understood that other cubic crystalline optical elements such as barium fluoride, lithium fluoride, and strontium fluoride as well as other materials might be used to form optical elements. With respect to any cubic crystalline material used, the variations in the intrinsic birefringence direction and magnitude can be measured, or calculated using computer modeling. Furthermore, the variations in intrinsic birefringence direction and magnitude of an optical material may also be measured. Graphical representations of the variations in birefringence magnitude and axis orientations similar to those shown in FIGS. 5A–5C, can be similarly generated for each of the aforementioned cubic crystalline materials.

Referring again to FIG. 1, it can be understood that if each of individual lens elements L1–L29 or optical elements is formed of the same cubic crystalline optical material such as calcium fluoride and the individual elements L1–L29 are arranged along a common optical axis 106 and aligned such that each of individual elements L1–L29 that is constructed from a cubic crystalline material, includes substantially the same three dimensional lattice orientation with respect to the optical axis 106, then the net retardance of the lens system 100 will have a retardance that varies across the system exit pupil in a similar manner to the angular intrinsic birefringence variation shown schematically in FIGS. 5A–5C.

EXAMPLE 1

Figure 6:
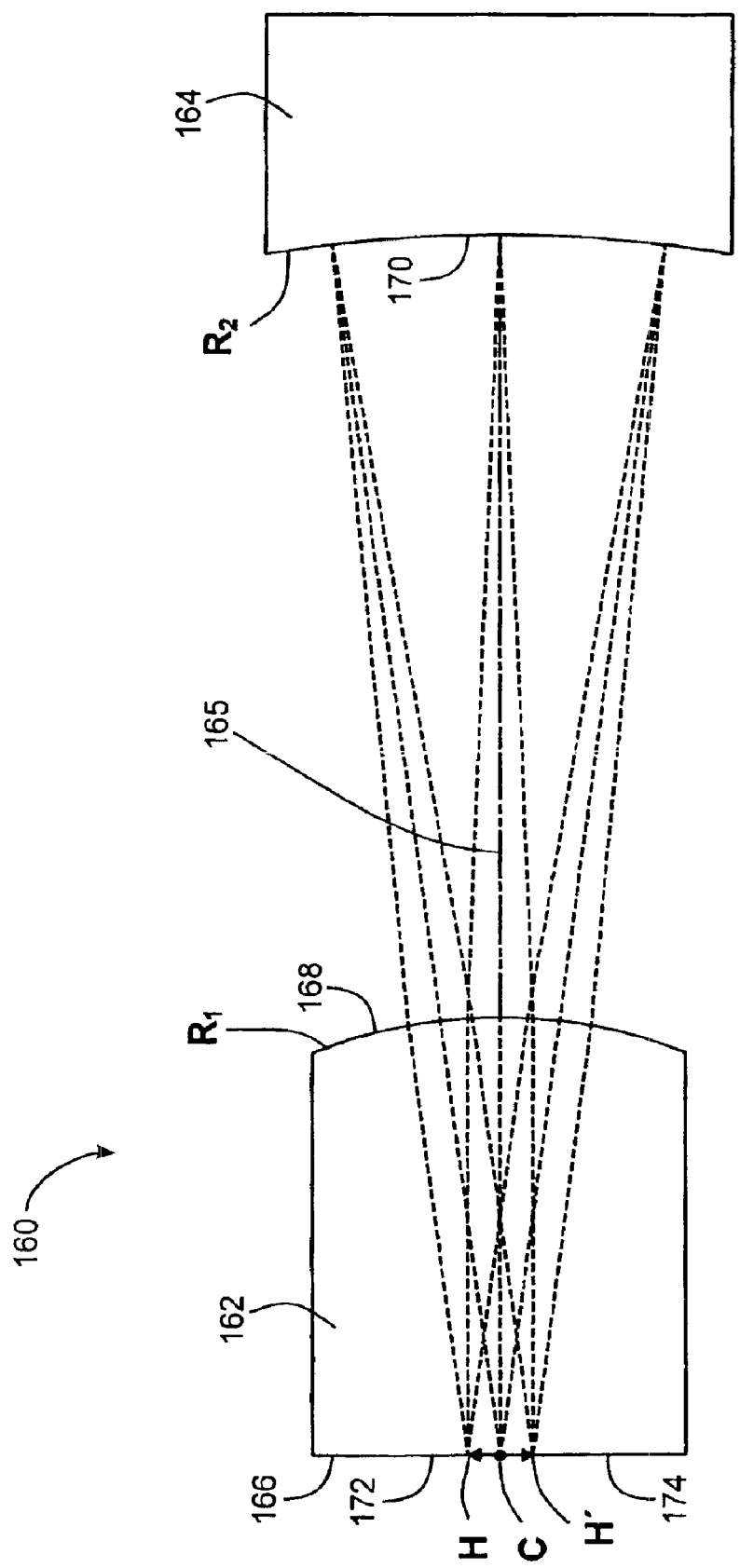
FIG. 6 shows cross-sectional view of an exemplary arrangement of an optical system referred to as a Dyson system comprising a refractive element and a reflective element aligned along an optical axis.

FIG. 6 shows an exemplary optical system 160 usable for lithographic applications that is based on a Dyson catadioptric lens comprising a single refractive element 162 and single reflective element 164 aligned along an optical axis 165 [Refs. J. Dyson, "Unit magnification optical system without Seidel aberrations," J. Opt. Soc. Am., Vol. 49, p. 713 (1959), as described in R. Kingslake, *Lens Design Fundamentals*, Academic Press, Inc. (1978)] In one preferred embodiment, the refractive optical element comprises cubic crystalline material. This refractive element 162 has first planar surface 166 and second curved surface 168. The reflective element 164 also has a curved reflective surface 170.

A notable feature of the Dyson design is that the object and image fields 172, 174 are coplanar and located at the center of curvature, C, of the curved surfaces on the refractive and reflective elements 160 and 162. Preferably, the radius of curvature, $R_1$, of the refractive element 162 is $(n_o - 1)/n_o$ times the radius of curvature, $R_2$, of the reflective surface 170, where $n_o$ is the ordinary index of refraction of the refractive element 162. These design specifications provide a design that is corrected for Petzval curvature and third order spherical aberration, coma, and sagittal astigmatism. Simulations were performed for an exemplary Dyson system having a numerical aperture of 0.20 and object and image heights, H and H', of 7 and −7 mm, respectively. The wavelength of light was assumed to 157.63 nm. Of course other curvatures, thicknesses, materials, as well as other object and image heights are possible. The optical system 160 may also be used at other wavelengths may and may have a different numerical aperture in other embodiments. At this wavelength, however, the ordinary index of refraction, $n_o$, is assumed to be 1.5587. The dimensions of the exemplary system 160 used in the simulations are listed in Table 1.

TABLE 1

| Surface | Radius of Curvature | Thickness | Glass |
|---|---|---|---|
| 1 | Infinite | 0.000 | |
| 2 | −100.000 | 100.000 | CaF$_2$ |
| Stop | −278.987 | −178.987 | Reflection |
| 4 | −100.000 | −100.000 | CaF$_2$ |
| Image | Infinite | 0.000 | |

Cubic crystalline element 160 is assumed to have a birefringence magnitude, $n_e - n_o$, of $-12 \times 10^{-7}$, corresponding to the intrinsic, birefringence of calcium fluoride measured at a wavelength of 157 nm as suggested in D. Krahmer, "Intrinsic Birefringence in CaF$_2$," at Calcium Fluoride Birefringence Workshop, Intl SEMATECH, Jul. 31, 2001.

Figure 7B:
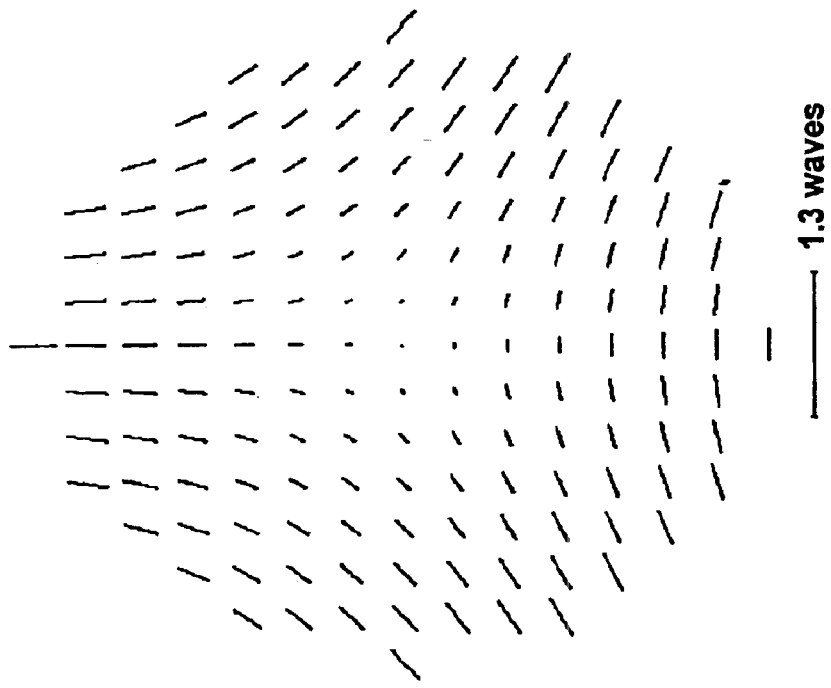
FIGS. 7A and 7B are graphical illustrations showing the net retardance across the system exit pupil for field points at the center and edge of the field, respectively, for an optical system such as shown in FIG. 6, wherein the refractive element comprises cubic crystalline material having with its [111] crystal axis aligned along optical axis.
Figure 7A:
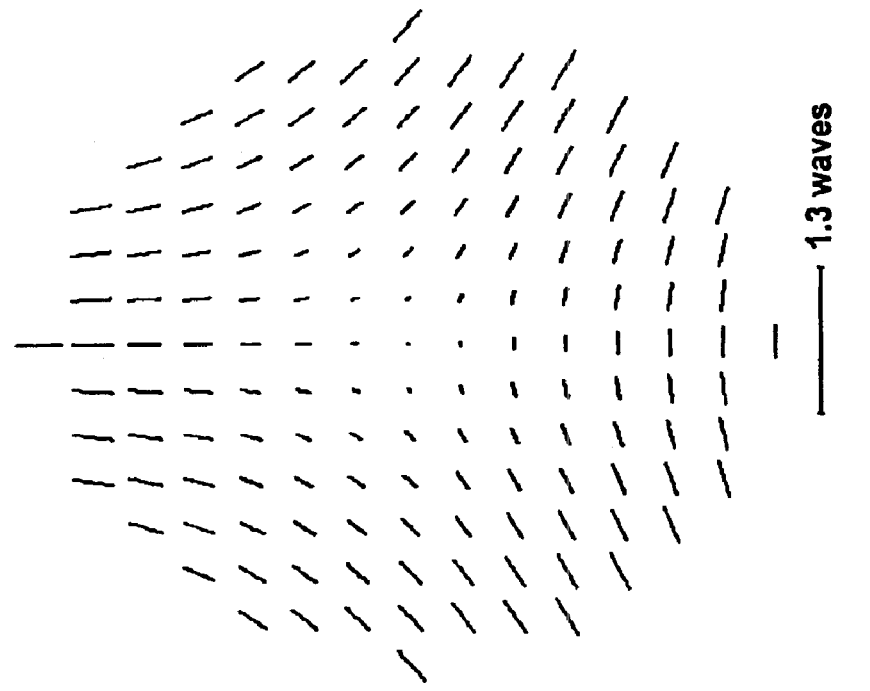

When the effects of intrinsic birefringence associated with the cubic crystalline lens material are taken into account, system performance degrades significantly. FIGS. 7A and 7B are graphical illustrations showing the net retardance across the system exit pupil for field points at the center and edge of the field, respectively, when the refractive element 162, shown in FIG. 6, is aligned with its [111] crystal axis parallel with the optical axis 165.

In these plots, and the retardance pupil maps to follow, the retardance is shown on a square grid across the system exit pupil for the optical system of interest. As described above, the retardance will generally vary across a wavefront propagating through a birefringent optical system. Accordingly, the retardance will be different for different locations across a cross-section of the beam. The variation plotted in these retardance maps corresponds to the exit pupil of the optical system.

The retardance plots are described in general by ellipses, which sometimes degenerate into lines that show one of the eigen-polarization states. As defined above, the eigen-polarization state is a polarization state that remains unchanged for a ray propagating through the optical system at given pupil coordinates. The eigen-polarization in the plots is the slow eigenpolarization state. The fast and the slow eigenpolarizations are orthogonal. The fast eigenpolarization state corresponds to the eigenpolarization shown in the plot rotated 90° about its center. For example, if the local retardance, be it linear or elliptical, is in the vertical direction, the slow eigenpolarization state will be oriented in the vertical direction and the fast eigenpolarization state will be oriented in the horizontally. The direction of the ellipse is defined by its major axis; for a vertical ellipse, the major axis is oriented in the vertical direction. We refer to the major axis as the retardance axis. The size of the ellipse or length of the line at a given pupil coordinate is proportional to the relative strength of the retardance, i.e., the phase shift between the fast and slow eigenpolarizations.

Also, for the lenses and corresponding retardance maps, the coordinates are defined using a right-handed coordinate system such that the system optical axis is in the +Z direction from the object towards the image plane, the +Y axis is in the vertical direction, and the +X direction is orthogonal to the Y and Z axes. For the exit pupil retardance and wavefront maps, the plots describe variations over an exit pupil reference sphere for a given field point using a Cartesian coordinate system, where the X and Y coordinates are coordinates on the reference sphere projected onto a plane perpendicular to the chief ray.

FIGS. 7A and 7B include the effects of intrinsic birefringence on the optical system 160 depicted in FIG. 6. The object field height in FIG. 7A is 0 mm and the object field height in FIG. 7B is 7 mm, corresponding to the center and edge field points, respectively. The peak retardance due to intrinsic birefringence in this example is approximately 0.41 waves at a wavelength of 157.63 nanometers.

FIG. 7A plots the retardance across the exit pupil for a beam of light represented by a bundle of rays emanating from an object point on the optical axis 165 through the system 160 to a location on the image field 174 ideally also located on the optical axis 164. This beam and corresponding bundle of rays fills the aperture and the exit pupil. The retardance map of FIG. 7A corresponds to the retardance for rays at each of the locations shown in the exit pupil. These retardance plots thus represent the retardance sampled across this particular beam at the exit pupil. The retardance may correspond to a wavefront at the exit pupil produced by a point source on axis in the object field. Similarly, FIG. 7B plots the retardance across the exit pupil for a beam of light represented by a bundle of ray emanating from an off-axis object point, here 7 mm off axis, passing through the system 160 to a location on the image field 174 also located off-axis. The beam and the corresponding bundle of rays also fills the aperture and the exit pupil. The retardance map of FIG. 7B shows the retardance for rays at various locations in the exit pupil. As described above, this retardance may correspond to that of the wavefront at the exit pupil produced by a point source at the off-axis field point, 7 mm off axis in the object field. This off-axis object field point may map, for example, into a point on the edge of the format of a photolithography instrument. These retardance plots thus represent the retardance sampled across this particular beam at the exit pupil.

FIGS. 8A and 8B are graphical illustrations of the retardance of another exemplary embodiment of the lens system 160 shown in FIG. 6. In FIGS. 8A and 8B, the net retardance across the system exit pupil, including the effects of intrinsic birefringence, is depicted for field points at the center and edge of the field for a refractive element 162 comprising cubic crystal having a [100] crystal axis along the optical axis 165. The peak retardance due to intrinsic birefringence in this example is approximately 0.1 waves at a wavelength of 157.63 nanometers. The peak retardance for the [100] optical element 162 associated with FIGS. 8A and 8B is thus smaller than the peak retrdance for the [111] optical element 162 associated with FIGS. 7A and 7B.

FIGS. 9A and 9B are graphical illustrations of the retardance of another exemplary embodiment of crystal lattice orientation of the refractive element 162 shown in FIG. 6. In FIGS. 9A and 9B, the net retardance across the system exit pupil is depicted for field points at the center and edge of the field with refractive element 162 comprising cubic crystal material having a [110] crystal axis generally along the optical axis 165. The peak retardance due to intrinsic birefringence in this exemplary arrangement is approximately 0.58 waves at a wavelength of 157.63 nanometers, which is higher than the peak retrdance for the [111] optical element 162 associated with FIGS. 7A and 7B and the peak retrdance for the [100] optical element 162 associated with FIGS. 8A and 8B. In the retardance pupil maps given in FIGS. 9A and 9B, and in others to follow in which the net retardance exceeds a magnitude of ±0.5 waves (i.e., π radian or 180°), the retardance is plotted "modulo 1 wave." It can therefore be seen that the retardance orientation rotates by 90 degrees at one-half-wave intervals, i.e., the effect of a 0.75 wave retarder at 0 degrees is the same as a 0.25 wave retarder at 90 degrees.

Each of three preceding examples, as illustrated in FIGS. 7A–9B, shows that the intrinsic birefringence produces large polarization aberrations, namely, large retardance aberrations. The result is large wavefront aberrations, even with a single refractive element 162 used at a moderate numerical aperture. Without compensation, this aberration strongly exceeds the allowable wavefront error for photolithography or many other imaging applications.

The retardance plots in FIGS. 7A–9B are for a single pass through the refractive optical element 162 corresponding to light propagating from the object field 172 through the refractive optical element 162 and toward the reflective optical element 164. As discussed above, the image plane 174 is superimposed on the object plane 172 and thus, in a Dyson system, image formation involves reflection of light rays off the reflective optical element 164 and back through the refractive optical element 162. With refractive element 162 oriented with either its [111], [100], or [110] crystal axis aligned substantially along the optical axis 14, the retardance produced by refractive element 162 for the central field point will have the same variation in magnitude and orientation across the pupil on the first and second passes through the refractive element 162, since each ray from the central field point is reflected back upon itself by reflective element 164. The retardance introduced in the first pass is thus matched to the retardance introduced in the second pass.

Figure 10:
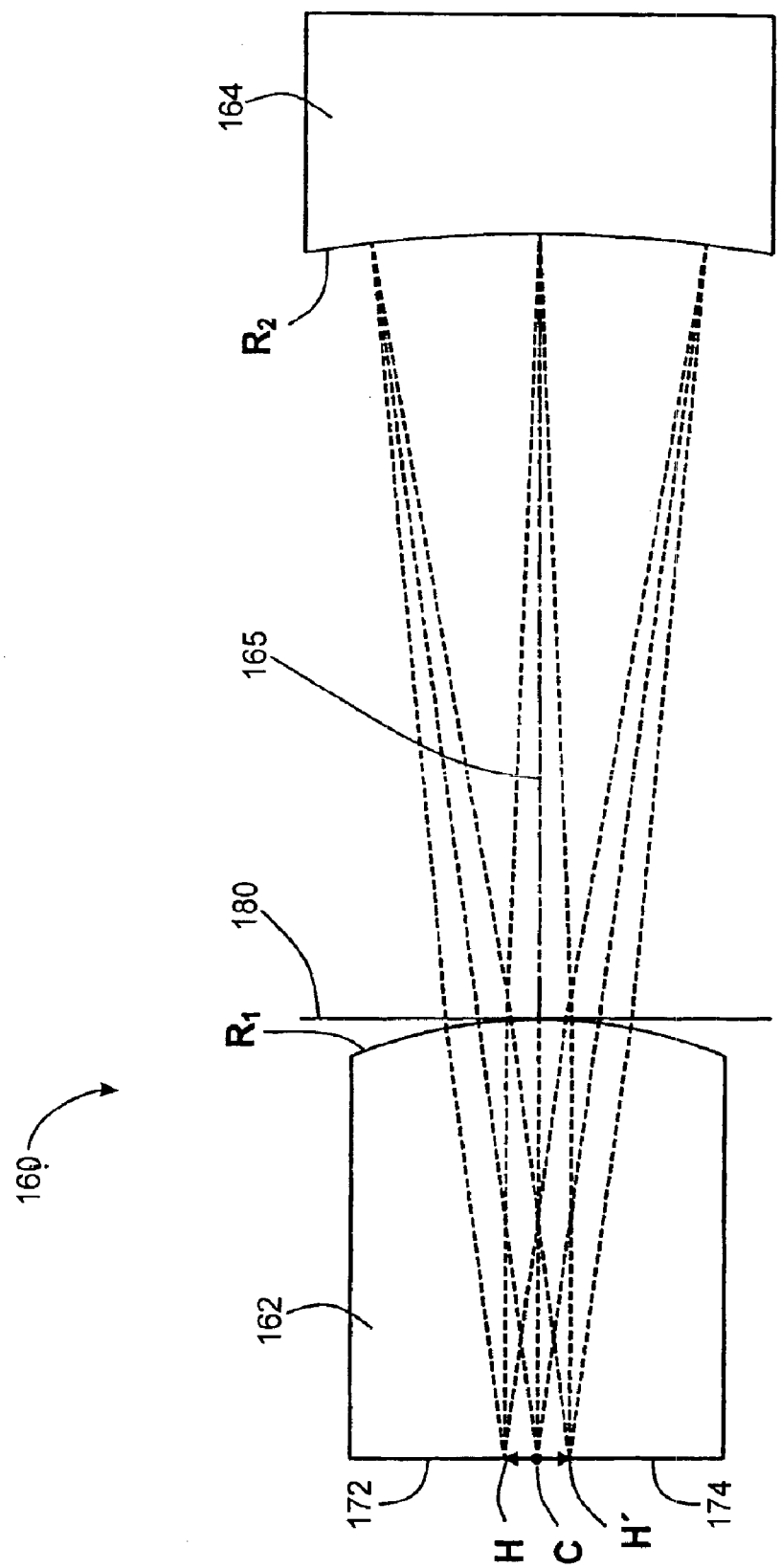
FIG. 10 is a cross-sectional view of the lens depicted in FIG. 6 additionally including a 45° non-reciprocal Faraday rotator used to rotate the polarization to reduce the harmful effects of intrinsic birefringence.

To reduce the retardance produced by the refractive element 162, which comprises cubic crystal, a non-reciprocal Faraday rotator 180 is inserted between refractive element 162 and reflective element 164, as depicted in FIG. 10. Preferably, this non-reciprocal rotator 180 provides an approximately 45° rotation to the polarization of light passing therethrough. (By non-reciprocal is meant that the rotator 180 rotates polarization in the same direction, i.e., clockwise or counter-clockwise, for light transmitted through the rotator 180 in both a first forward axial direction and a second reverse axial direction. Thus, the rotator will provide a rotation in the second pass that adds to the rotation introduced on the first pass. A reciprocal rotator, in contrast, would rotate the polarization in the counter-opposing directions for light passing through the rotator in the forward and reverse axial directions; the two polarization rotations would therefore cancel out with no net polarization rotation.)

The Faraday rotator 180 alters the polarization state by rotating the constituent polarizations by about 45° each time the beam passes through the rotator 180. For example, as is well known, linear or elliptical polarized light can be reduced to vertical and horizontal polarization components. Both these polarization components are rotated about the propagation direction by approximately 45° upon respective first and second forward and reverse passes through the Faraday rotator 180. Because the beam travels through the 45° Faraday rotator 180 twice following the first pass through refractive element 162, the rotator 180 produces a net rotation of 90° for each constituent polarization state before the beam passes through refractive element 162 a second time. Accordingly, the above-mentioned horizontal component becomes vertically oriented and the above-mentioned vertical component becomes horizontally directed. The sum of the two components forms an aggregate polarization corresponding to the original linear or elliptical polarization state rotated by about 90° about the propagation direction.

Similarly, in the case where the light from the object has linear polarization and is polarized along the horizontal, after first and second passes through the rotator 160, the horizontally polarized light becomes vertically polarized. For this example, in the first pass horizontally polarized light passes through the refractive optical element 160 and in the second pass, assuming no diattenuation, vertically polarized light having substantially the same magnitude as the horizontally polarized light of the first pass is transmitted through the refractive optical element 162. In another example, light from the object which is elliptically polarized with the major axis of the ellipse substantially aligned in the vertical direction, after first and second passes through the rotator 160, becomes elliptically polarized light oriented horizontally. Thus, on the first pass through the refractive optical element 160, the elliptically polarized light is vertically oriented and upon the second reverse pass through the refractive element 162 is elliptically polarized with the major axis along the horizontal. The constituent polarization components are similarly rotated by 90°.

Moreover, any arbitrary polarization that is transmitted through the optical element 162 can be reduced to a weighted complex sum of first and second orthogonal eigen-polarization components. The first polarization component corresponding to the slow eigenpolarization state is slowed with respect to the second orthogonal polarization component corresponding to the fast polarization state on a first pass. In the second pass, the first polarization component is rotated so as to correspond to the fast eigenpolarizaton state and the second polarization component is rotated so as to correspond to the slow eigenpolarization state. The second polarization component is therefore slowed with respect to the first polarization component by an equal amount on the second pass. The retardance of first polarization component introduced on the first pass is offset or compensated for by the retardance of the second polarization component on the second pass. The retardance is said to be matched or balanced.

Thus, for a beam propagating from the central field point, the retardance contributed by the refractive element 162 on the second pass is equal in magnitude but opposite in sign, orthogonal in orientation, to the retardance contributed by the refractive element 162 on the first pass at all pupil coordinates (i.e., for all ray angles), resulting in substantial cancellation of the retardance produced by the intrinsic birefringence. For the exemplary embodiments discussed above in connection with FIGS. 7A–7B, 8A–8B, and 9A–9B wherein the refractive element 162 is oriented respectively with its [111], [100], or [110] crystal axis aligned substantially parallel to the optical axis 165, and with a 45° polarization rotator 180 located between refractive element 162 and the reflecting element 164, the RMS retardance over the pupil is essentially zero for the central field point. For off-axis field points, the retardance aberrations from the first and second passes through the refractive element 162 are also substantially balanced, although there are small residual retardance aberrations, since the beam follows different paths through the refractive element 162 on the first and second passes. In the computer simulations conducted for these examples, the Faraday rotator 180 is assumed to be an ideal rotator with zero thickness.

For exemplary embodiments having refractive elements 162 oriented with its [111], [100], or [110] crystal axis aligned substantially in the direction of the optical axis 165, and with a 45° non-reciprocal Faraday rotator 180 located so as rotate the polarization by about 90° in the first and second passes combined, the RMS retardance over the pupil is 0.0006, 0.0001, and 0.0035 waves, respectively at a wavelength of 157.63 nm. The respective peak-to-valley retardance is 0.0032, 0.0007, and 0.0130 waves respectively. Peak-to-valley retardance is reduced by approximately 128 times, 343 times, and 45 times, respectively by introducing the rotator 180 into this Dyson design.

Figure 11B:
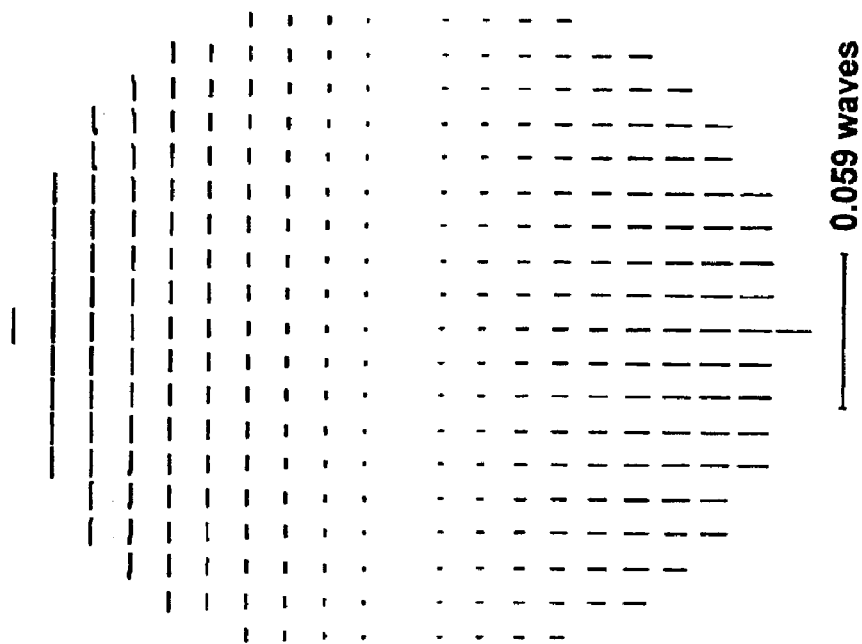
FIG. 11B is a graphical illustration of net retardance across the pupil for the exemplary optical system shown in FIG. 10 with refractive element comprising cubic crystalline material with its [110] crystal axis aligned substantially along the optical axis for the extreme field point.
Figure 11A:
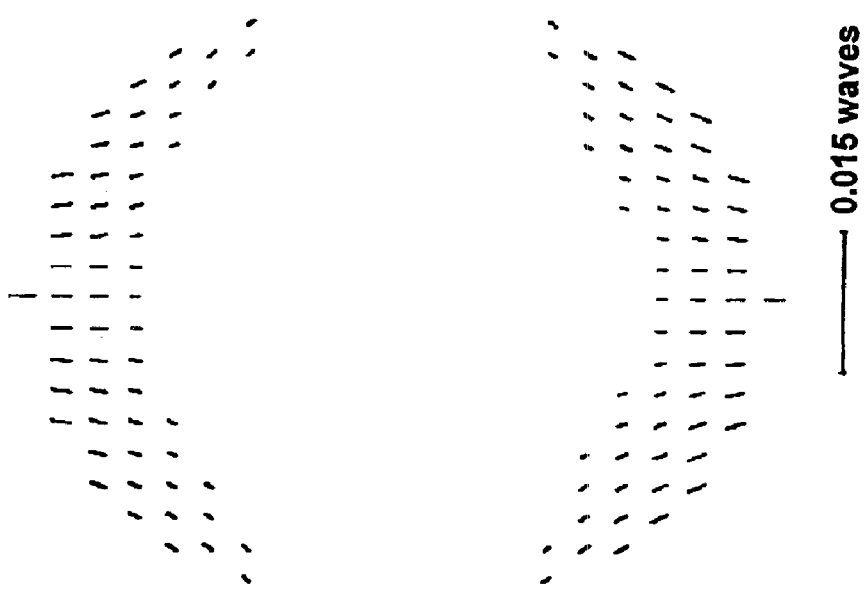
FIG. 11A is a graphical illustration of net retardance across the pupil for the exemplary optical system shown in FIG. 10 with refractive element comprising cubic crystalline material with its [111] crystal axis aligned substantially along the optical axis for the extreme field point.

FIG. 11A is a graphical illustration of net retardance magnitude and orientation across the pupil for the extreme field point for the exemplary optical system 160 shown in FIG. 10 with refractive element 162 having a [111] crystal axis aligned substantially along the optical axis 165. FIG. 11B is a graphical illustration of net retardance magnitude and orientation across the pupil for the extreme field point for the exemplary optical system 160 shown in FIG. 10 with refractive element 162 oriented with its [110] crystal axis aligned substantially parallel to the optical axis 165. With a refractive element 162 having a [100] crystal axis substantially in the direction of the optical axis 165, the retardance is very close to zero across the exit pupil, and thus, no retardance map has been provided.

Thus, by inserting a 45° Faraday rotator 180 between refractive element 162 and reflective element 164 in the exemplary system 160 depicted in FIG. 10, each constituent polarization state is rotated by about 90° between the first and second passes through refractive element 162. Near perfect correction of the retardance aberrations for the central field point is provided. Substantial balancing of retardance aberrations for off-axis field points, with the refractive element 162 oriented with its [111], [100], or [110] crystal axis aligned substantially with the optical axis 165 is also attained.

Faraday rotators are well known in the art. These devices will rotate the polarization of light by a controllable amount. Other polarization rotators may also be employed. These rotators may be active devices like the Faraday rotator which rely on application of a magnetic field to induce rotation of polarization states. Passive devices or combination of active and passive devices are also possible.

An example of a 90° reciprocal wave plate rotator is constructed using two quarter wave plates with their fast axes at 90° with respect to one another on either side of a half wave plate whose fast axis is at 45° with respect to the fast axes of the quarter wave plates; see, e.g., R. C. Jones, "A new calculus for the treatment of optical systems III: The Sohncke theory of optical activity," J. Opt. Soc. Am., 31, p. 500–503, 1941. These wave plates may be created using stress-induced birefringence (see, e.g., U.S. Pat. No. 6,084,708 issued to K. H. Schuster and U.S. Pat. No. 6,324,003 issued to G. Martin both of which are incorporated herein by reference) or using uniaxial crystalline materials. For a wave plate constructed by applying stress to a cubic crystalline substrate, the stress birefringence coefficient is highest when the [100] crystal lattice direction is oriented along the system optical axis. The stress birefringence coefficient along the [100] direction is over 4 times larger than the coefficient along the [111] lattice direction [Alternative Materials Development (LITJ216) Final Report—Stress Birefringence, Intrinsic Birefringence, and Index Properties of 157 nm Refractive Materials, International SEMATECH, Feb. 28, 2002, J. Burnett and R. Morton]. Thus, for a given plate thickness, the stress necessary to create a given retardance may be substantially reduced or minimized by orienting the wave plate with its [100] crystal lattice direction along the optical axis, and cubic crystalline stress elements are often used with this orientation (see, e.g., U.S. Pat. No. 6,201,634 issued to S. Sakuma which is incorporated herein by reference). Elements with weak retardance, other than the half wave plate, may also be placed between the quarter wave plates without substantially affecting the performance of the rotator. These type of polarization rotators will rotate any arbitrary polarization by 90°.

Other designs may be suitable in other cases. For example, if the incoming light has a known linear polarization, a quarter wave plate (QWP) can rotate polarization. On the first pass through the QWP, linearly polarized light may be converted into left circularly polarized light, if the QWP is at 45° to the polarization state. Reflection off a mirror will transform the light into right handed circularly polarized. On the second pass through the QWP, the light is converted back into linearly polarized light, with the polarization state rotated by 90° from that of the light initially incident on the QWP.

In other embodiments, the incoming and outgoing beams can be fully separated at the polarization rotator. A reciprocal or non-reciprocal 90° polarization rotator may be inserted in the path of one of the beams, in lieu of the 45° non-reciprocal rotator in both of the beams. Reciprocal rotators include, but are not limited to, wave plate rotators and rotators constructed using an optically active material with its birefringence axis oriented along the direction of the system optical axis. The optical configuration to provide a 90° polarization rotation is not limited to those described above, but may include other polarization rotators both well-known in the art and yet to be devised.

EXAMPLE 2

Figure 12:
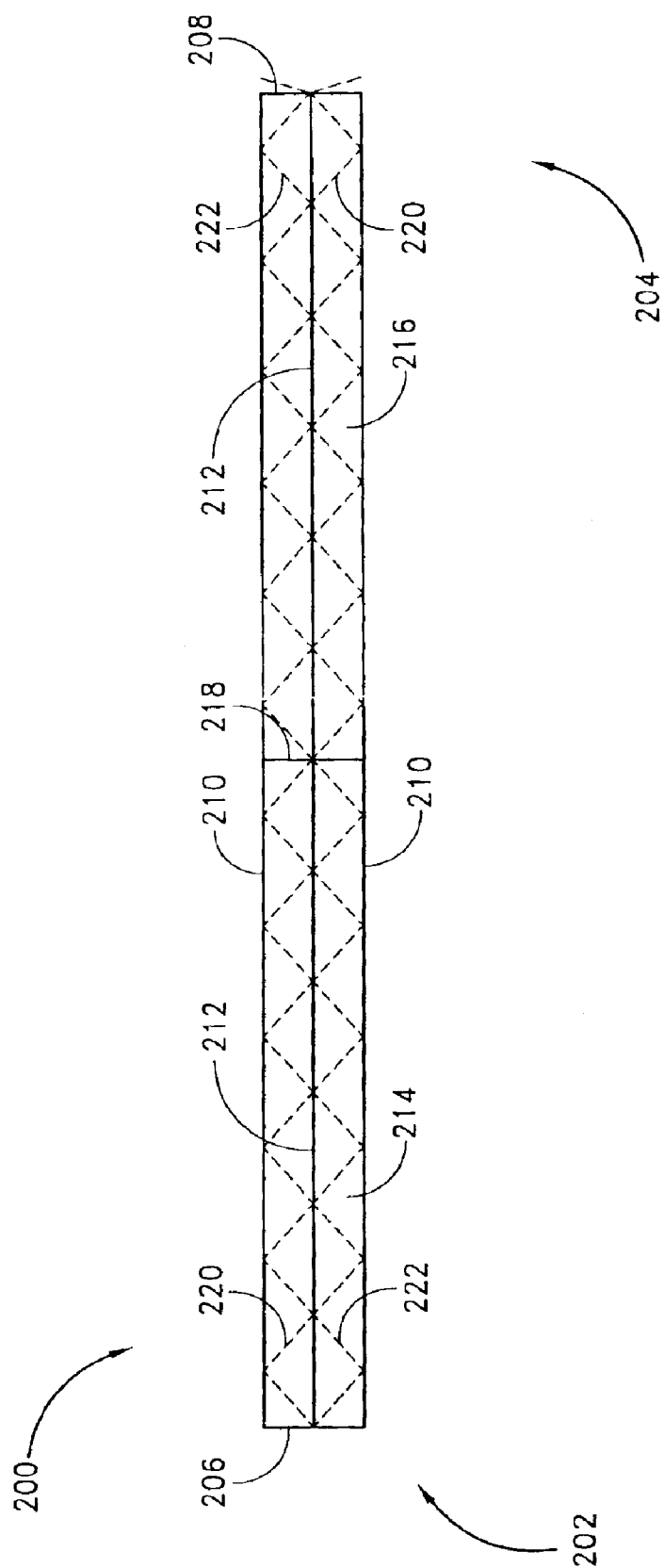
FIG. 12 shows schematic cross-sectional view of an exemplary mixing rod, a non-imaging optical element.

A mixing rod, also referred to as a homogenizer or kaleidoscope, is commonly used in illumination systems for photolithography. FIG. 12 shows an exemplary mixing rod 200 comprising calcium fluoride and having dimensions of 10×10×160 millimeters (mm). The mixing rod 200 is assumed to have a birefringence magnitude, $n_e - n_o$, of $-12 \times 10^{-7}$, corresponding to the intrinsic birefringence of calcium fluoride measured at a wavelength of 157 nanometers (nm) as suggested in D. Krahmer, "Intrinsic Birefringence in $CaF_2$," at Calcium Fluoride Birefringence Workshop, Intl. SEMATECH, Jul. 31, 2001. The mixing rod 200 has proximal and distal ends 202, 204 and an input and output faces or ports 206, 208 for inputting and outputting the beam and walls 210 on opposite sides for reflecting the beam propagating therethrough. An optical axis 212 extends the length of the mixing rod 200. The mixing rod 200 can be separated into two portions 214, 216, preferably of equal length, and more preferably having substantially the same retardance, i.e., the magnitude of retardance and the orientation of the retardance axis across the exit pupil is equivalent for both sections 214, 216. The two sections 214, 216, come together at the axial center 218 of the mixing rod 200.

A beam is input into the rod 200 by focusing it at the center of the input port 206 of the mixing rod 200 along the optical axis 212. The beam may have, for example, a numerical aperture of about 0.5. The beam propagates from the input port 206 to the output port 208, rays reflecting from the sidewalls 210 within the mixing rod 200. Rays 220 and 222 illustrate how light travels down the length of the rod 200.

Figure 13:
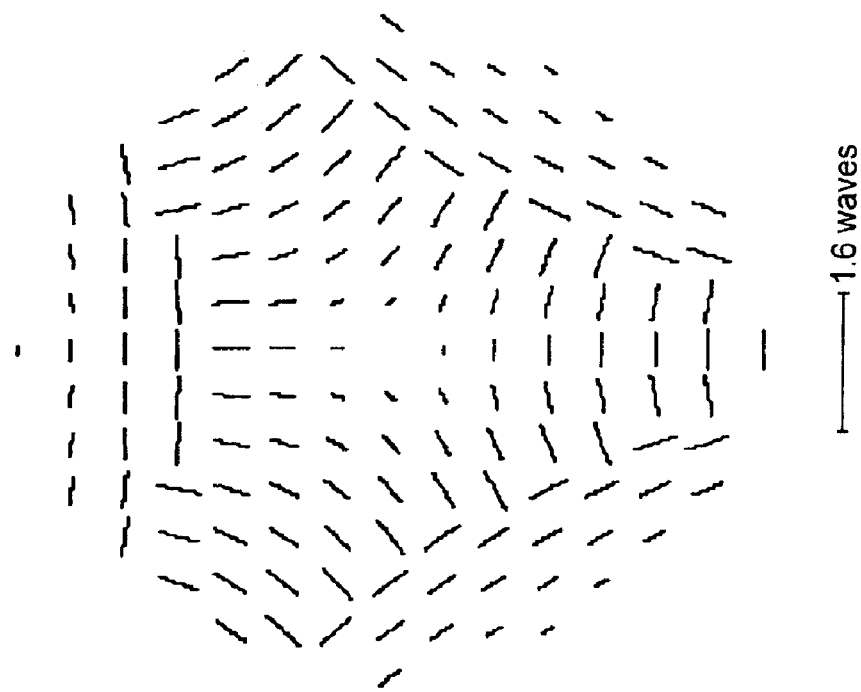
FIG. 13 shows the net retardance across the exit pupil of the mixing rod depicted in FIG. 12 comprising cubic crystalline material with the [111] crystal axis aligned with and corresponding to the optical axis of the mixing rod assuming that the reflections from the walls of the integrating rod do not change the polarization state of the light propagating therein.

FIG. 13 shows the net retardance across the exit pupil for a mixing rod 200 comprising calcium fluoride having a [111] crystal axis in the direction of the optical axis 212 of the mixing rod 200, assuming that the reflections from the walls 210 of the integrating rod 200 do not alter the polarization state of the light propagating therethrough. In these plots, the retardance orientation rotates by 90 degrees at one-half-wave ($\pi$ or 180°) intervals, i.e., the effect of a 0.75 wave retarder at 0 degrees is the same as a 0.25 wave retarder at 90 degrees. Thus, the peak retardance due to intrinsic birefringence in this example is approximately 0.8 waves at a wavelength of 157 nanometers.

As discussed above, cubic crystal wherein the [111] crystal axis is aligned with the optical axis 212 of the optical element, here a mixing rod 200, is preferred. Cubic crystalline optical elements having an optical axis along the [111] direction are easiest to grow with the low stress birefringence levels that are required for lithographic quality optics, as the stress birefringence coefficient is minimized along the [111] axis (see, e.g., U.S. Pat. No. 6,201,634 issued to S. Sakuma). While the [111] orientation is preferred, the reduction of retardance aberrations can achieved using the techniques described herein for other crystal orientations as well.

Figure 14:
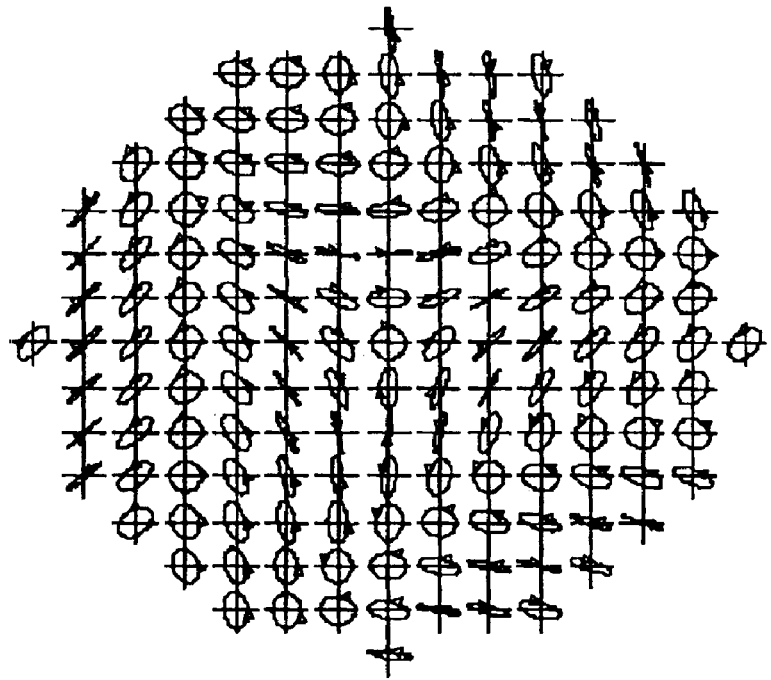
FIG. 14 depicts the polarization state of light across the exit pupil when a uniformly circularly polarized beam is incident on the entrance face of the mixing rod.

FIG. 14 shows the polarization state across the exit pupil when a uniformly circularly polarized beam is incident on the entrance face of the mixing rod 200. The output polarization state is not uniformly polarized as a result of retardance. Uniform polarization, however, is desirable for illumination of the reticle in photolithography applications, and without compensation, this mixing rod 200 will produce unacceptable reticle dependent distortion and linewidth variations.

In FIG. 14, and the polarization state pupil maps to follow, the polarization state of the beam is shown on a square grid across the system exit pupil for the optical system of interest and is described in general by ellipses which sometimes degenerate into lines. The shape and orientation of the ellipse or line at a given pupil coordinate depict the state and orientation of the output polarization state at the exit pupil.

Figure 15:
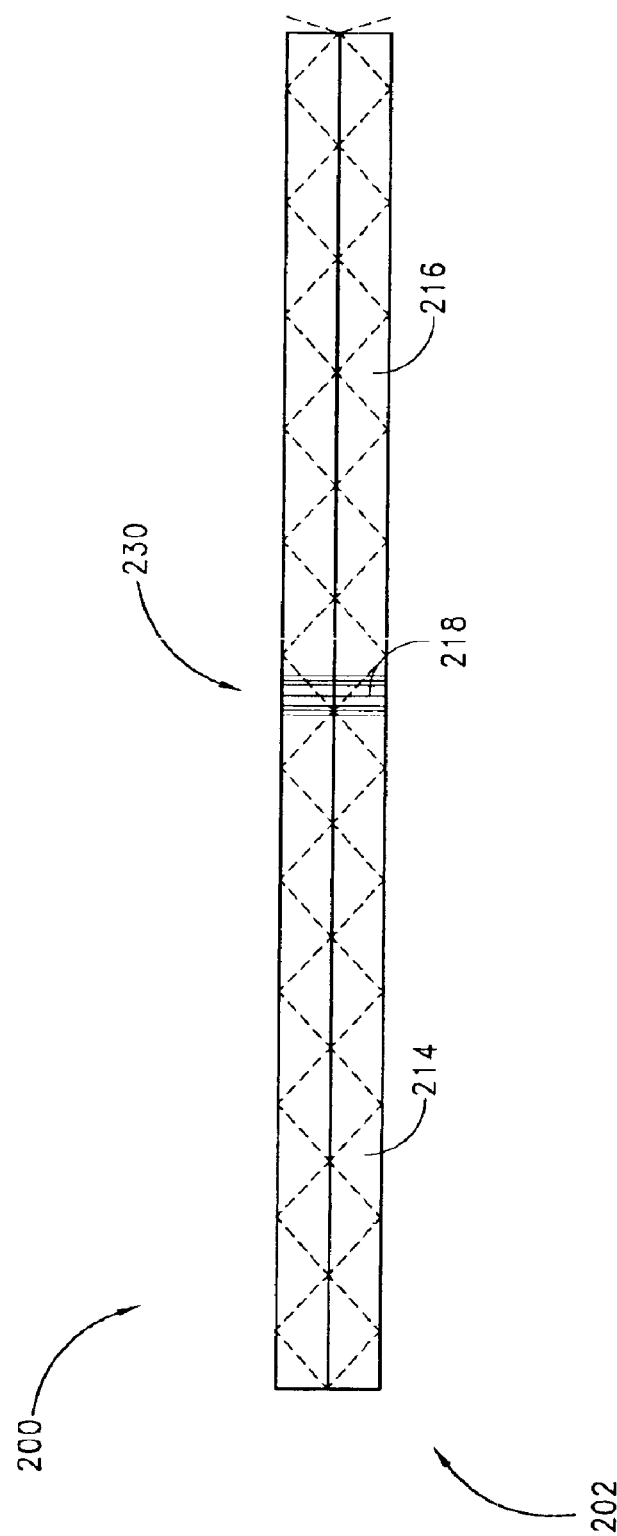
FIG. 15 is a schematic cross-sectional view of the mixing rod of FIG. 12 further including a 90° polarization rotator centrally disposed within the mixing rod, the rotator possibly comprising a pair of quarter waveplates on opposite sides of a halfwave plate.

FIG. 15 is a schematic side view of the mixing rod 200 further comprising polarization rotation optics 230 disposed at the axial center 218 of the mixing rod 200. Preferably, the polarization rotation optics 230 is a 90° rotator that rotates the polarization by about 90°. The polarization transforming optics 230 may be a reciprocal or non-reciprocal rotator. This rotator 230 is preferably positioned within the mixing rod 200 at the location 218 between the two sections 214, 216, which each preferably introduce equivalent retardance, i.e., both in magnitude and orientation. The rotator 230 is thus inserted between sections 214, 216 having matched birefringence and retardance properties.

In one exemplary embodiment, a stress birefringence wave plate rotator is employed, although other types of polarization rotation optics may also be used. As discussed above, a wave plate rotator may be constructed using two quarter wave plates with their fast axes at 90° with respect to one another on either side of a half wave plate whose fast axis is at 45° with respect to the fast axes of the quarter wave plates; see, e.g., U.S. Pat. No. 6,084,708 issued to K. H. Schuster and U.S. Pat. No. 6,324,003 issued to G. Martin, both of which are incorporated herein by reference in their entirety. In one embodiment, the half-wave plate comprises a 2 millimeter thick [100] calcium fluoride element and the quarter waveplates each comprise a 1 millimeter thick [100] calcium fluoride elements. The [100] orientation is advantageous because of the higher amount of birefringence in comparison with other orientatons like the [111] and [110].

Figure 16:
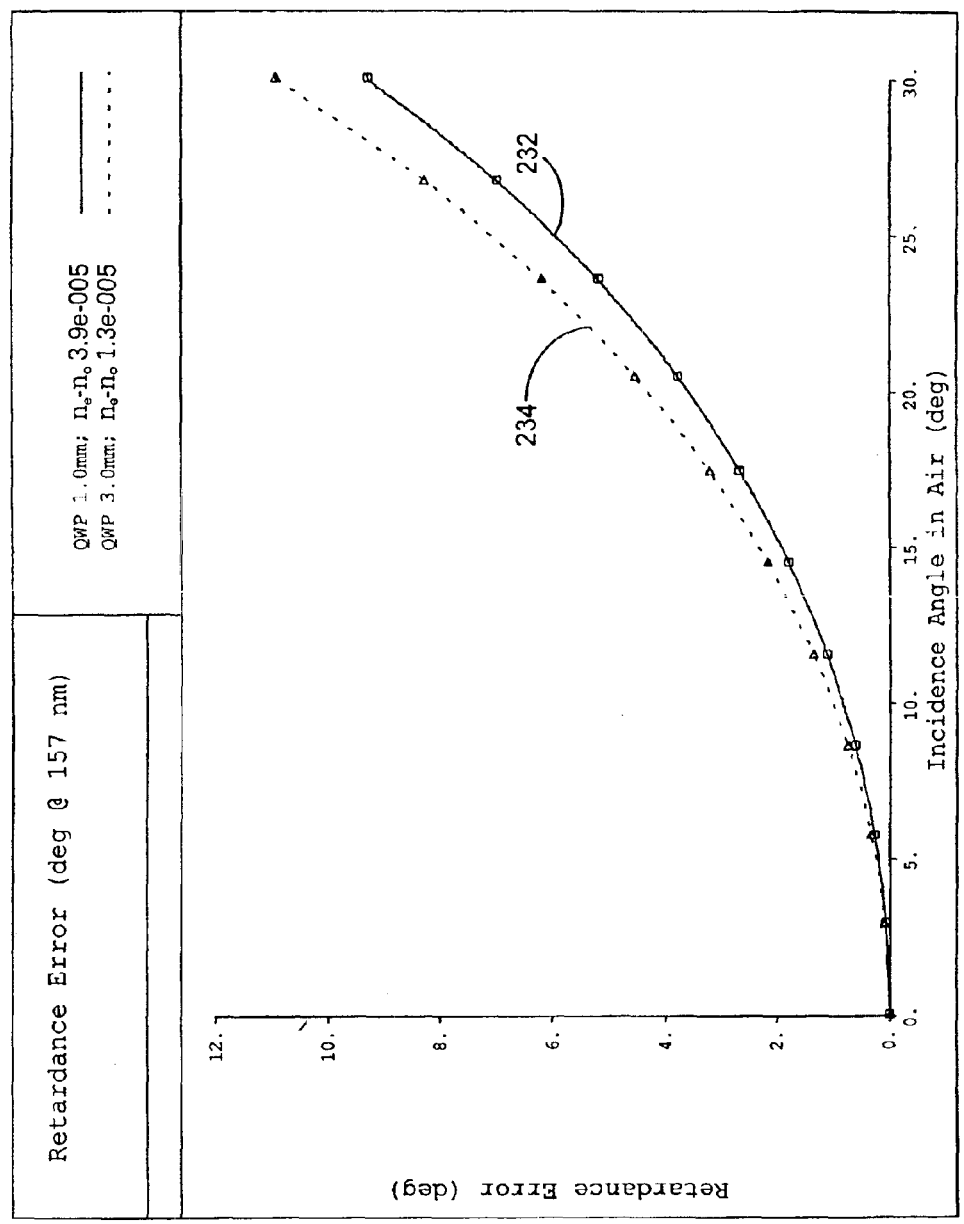
FIG. 16 is a plot, on axis of angle (in degrees) and retardance error (in degrees) of the magnitude of retardance error as a function of angle of incidence for 1 and 3 millimeter thick quarter wave plates surrounded by air.

On-axis, the 90° rotator 230 produces a rotation of each constituent input polarization state of approximately 90° or $\pi/4$ radians. The eigenpolarization states of a rotator are circularly polarized and the 90° rotator exhibits 90° of phase delay between the two orthogonally polarized circular states, or a quarter-wave of circular retardance. For off-axis rays, the retardance of the wave plates deviates from their on-axis values due to the variation of refractive index with angle as well as the change in the optical path through the waveplates. Thus, the rotator 230 will deviate from a quarter wave of circular retardance for off-axis rays. FIG. 16 shows the magnitude of the retardance error as a function of angle of incidence in air for 1 and 3 millimeter thick quarter wave plates (curves 232 and 234 respectively) for a wavelength of 157 nm. The index differences between the two orthogonal polarization states are $3.9 \times 10^{-5}$ and $1.3 \times 10^{-5}$ for curves 232 and 234, respectively, as indicated in the legend. Over a 30° angle of incidence range in air, the retardance error is within approximately 0.03 waves, which is acceptable for many illumination applications.

The polarization rotation optics 230 allows the retardance to be reduced for all polarization states, i.e., for any arbitrary polarization or for unpolarized light, both which comprise a weighted sum of orthogonal polarization states. For example, the polarization state of light entering the mixing rod 200 at the input 202 can be separated into the orthogonal eigenpolarization states associated with each of the first and second sections, 214, 216. Since the two sections are substantially identical, the eigenpolarizations of the two sections 214, 216 are the same. This characteristic can be exploited to compensate or offset the retardance introduced by each of the sections 214, 216.

In particular, light input into the mixing rod 200 will have first and second orthogonal polarization components corresponding to the slow and fast eigenpolarizations of the first section 214 of the mixing rod 200, respectively. The first polarization component will thus be retarded with respect to the second polarization component by an amount corresponding to the retardance introduced by the first section 214 of the mixing rod 200. This light will pass through the polarization rotation optics 230, which will rotate the polarization components 90° such that the first polarization component will correspond to the fast eigenpolarization of the second section 216 and the second polarization will correspond to the slow eigenpolarization of the second section 214. The second polarization component will thus be retarded with respect to the first polarization component by an amount corresponding to the retardance introduced by the second section 216 of the mixing rod 200. Since the birefringence of the first and second sections 214 and 216 are substantially the same, the birefringent and retardance properties of the two sections 214 and 216 being matched, the retardance encountered by the first and second components upon passing through the first and second sections 214, 216 will be offset. The first component is retarded by an equal amount in the first section as the second component is retarded in the second section. The retardance contributed by the first half 214 of the mixing rod 200 being substantially equal in magnitude but nearly orthogonal in orientation to the retardance contributed by the second half 216 of the mixing rod 200 at all pupil coordinates (i.e., for all ray angles), results in substantial cancellation of the retardance produced by the intrinsic birefringence.

Figure 17:
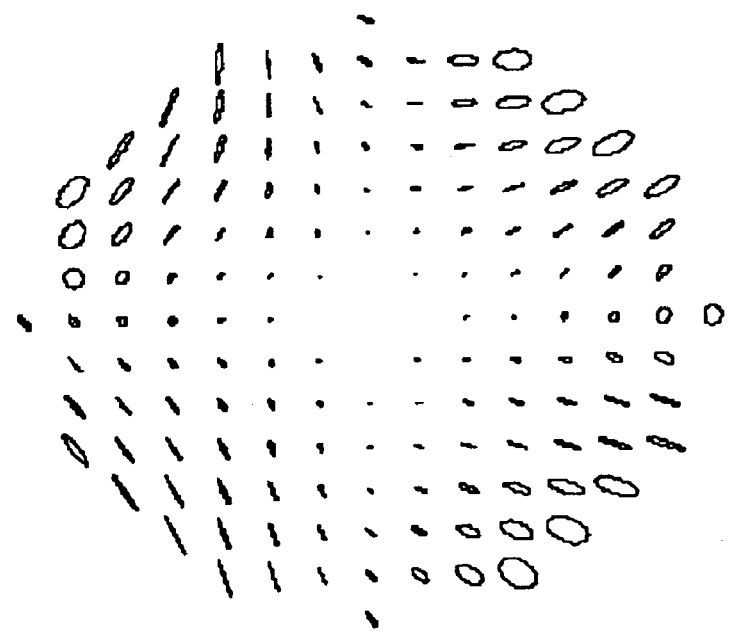
FIG. 17 is a graphical illustration of the net retardance across the exit pupil of the mixing rods shown in FIG. 15, which demonstrates the reduction of the net retardance resulting from introduction of the polarization rotator in the optical system.

FIG. 17 shows the net retardance across the exit pupil of the exemplary embodiment shown in FIG. 15. The peak retardance due to intrinsic birefringence in this example is less than 0.044 waves peak-to-valley at a wavelength of 157 nanometers, which is substantially reduced from the peak-to-valley retardance of 0.8 waves before the rotator was added.

Figure 18:
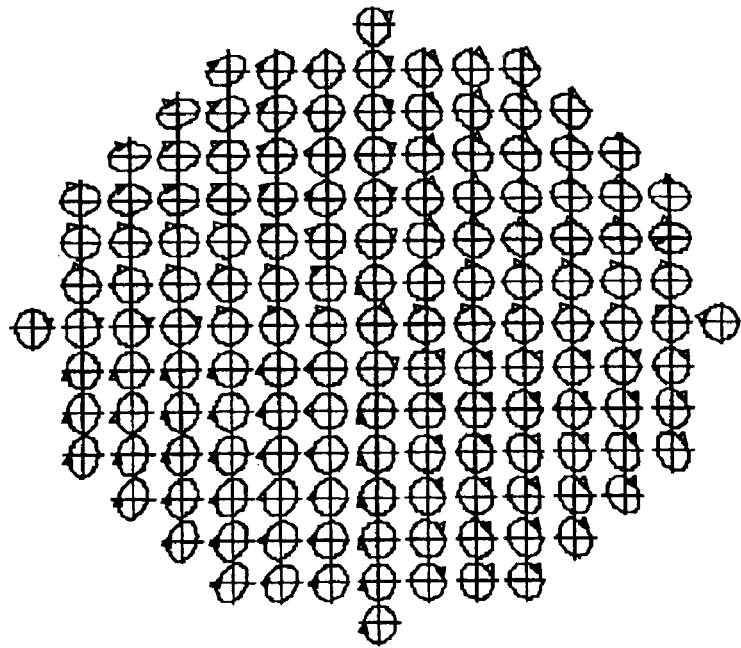
FIG. 18 shows the polarization state of the light across the exit pupil when a uniformly circularly polarized beam is incident on the entrance face of the mixing rod shown in FIG. 15, which includes the polarization rotator.

FIG. 18 shows the polarization state across the exit pupil when a uniformly circularly polarized beam is incident on the entrance face 206 of the mixing rod 200 shown in FIG. 15 which includes the polarization rotation optics 230. The output polarization state is substantially more uniform, i.e., circularly polarized, than the output polarization for the mixing rod 200 without the rotator 230 depicted in FIG. 12, and is thus more suitable for photolithography.

EXAMPLE 3

These techniques for reducing polarization aberrations caused by intrinsic birefringence are particularly well suited for providing wavefront correction of refractive imaging systems used for photolithography. In addition to the rigorous performance requirements associated with this application, photolithography lenses often include a large number of refractive optical elements, which together possess a significant amount of birefringence. Wavefront error caused by retardation aberrations can therefore substantially limit the resultant resolution obtained by the photolithographic projection system. An exemplary projection lens 100, one which contains all optically transmissive and, in particular, all refractive, powered, optical elements L1–L29 is illustrated in FIG. 1. A similar lens is provided in European Patent Application No. 0 828 172 by S. Kudo and Y. Suenaga, the contents of which are herein incorporated by reference. This optical system 100 is designed to operate at a central wavelength of 193.3 nanometers, provides a 4× reduction at a numerical aperture of 0.60, and has an image field diameter of 30.6 millimeters (mm). The exemplary design employs twenty-nine (29) optical elements L1–L29 comprising calcium fluoride and fused silica and uses only spherical surfaces. Retardation aberrations, however, are calculated below for a similar lens having the same prescription as disclosed in European Patent Application No. 0 828 172 but with all the lens comprising cubic crystalline material, namely calcium fluoride. Accordingly, each component L1–L29 is assumed to have an intrinsic birefringence of $-12 \times 10^{-7}$ in these baseline computations. The actual value of intrinsic birefringence may vary depending on the material or in the case where the material is crystal, the crystal orientation. Also, in other embodiments, one or more of the optical elements L1–L29 may comprise crystalline material other than cubic crystals as well as non-crystalline materials. Fused silica is an example of such a non-crystalline material that is substantially optically transmissive to UV wavelengths such as 248 nm and 193.3 nm and is therefore compatible with such UV applications. As discussed above, the exemplary system 100 includes an optical axis 106, the twenty-nine (29) optical elements L1–L29 being aligned along this optical axis 106 as is customary for on axis optical systems. An optical beam propagates along the optical axis 106, from the object plane 106 to the image plane 104 through the lens elements L1–L29 in the lens 100.

The RMS and maximum retardance and diattenuation over the exit pupil are listed in Table 2 below for the nominal design without intrinsic birefringence effects included for relative field heights of 0, 0.7, and 1.0. As described above, diattenuation, another form of polarization aberration, is a measure of the maximum difference in transmission between orthogonal polarization states. The relative field height is defined to be the actual field height normalized by the semi-field height. Thus, an image located on the optical axis 106 has zero field height and an image located at 15.30 mm in this lens 100 corresponds to unit relative field height. The retardance and diattenuation result from the single-layer anti-reflection coatings used-in the model. The retardance is radially oriented and is largest in magnitude at the edge of the pupil. The retardance due only to the anti-reflective coating is relatively small.

TABLE 2

| Relative Field Height | Retardance (waves at $\lambda_o$ = 193.3 nm) | | Diattenuation | |
|---|---|---|---|---|
| | RMS | Maximum | RMS | Maximum |
| 0.0 | 0.0021 | 0.0077 | 0.0019 | 0.0076 |
| 0.7 | 0.0024 | 0.0086 | 0.0023 | 0.0091 |
| 1.0 | 0.0028 | 0.0111 | 0.0031 | 0.0127 |

When the effects of intrinsic birefringence associated with the cubic crystalline lens material are taken into account, system performance degrades significantly. FIGS. 19A and 19B are graphical illustrations showing the net retardance across the system exit pupil for field points at the center and edge of the field, respectively, according to an exemplary embodiment in which all lens elements L1–L29, shown in FIG. 1, are identically aligned in three dimensions, with the elements having their [110] crystal axis direction along the optical axis 106. FIGS. 19A and 19B include the effects of intrinsic birefringence. FIG. 19A shows the net retardance at various positions across the exit pupil for a beam of light originating from a point in the object field location in FIG. 19A which is 0 mm away from the optical axis 106. FIG. 19B quantifies the net retardance at various locations across the exit pupil for a beam of light originating from a point in the object field at a height is 61.2 mm away from the optical axis 106. These two points correspond to the center and edge field points, respectively. This edge field point may, for example, map into a point at the edge of the frame of a photolithography instrument for processing semiconductor wafers. In the retardance pupil maps given in FIGS. 19A and 19B, and in others to follow in which the net retardance exceeds a magnitude of 0.5 waves, the retardance is plotted "modulo 1 wave." It can therefore be seen that the retardance orientation rotates by 90 degrees at one-half-wave ($\pi$ radians or 180°) intervals, i.e., the effect of a 0.75 wave retarder at 0 degrees is the same as a 0.25 wave retarder at 90 degrees. Thus, the peak retardance due to intrinsic birefringence in this exemplary arrangement is approximately 0.72 waves at a wavelength of 193.3 nanometers on axis and 0.87 waves at the extreme field.

Figure 20B:
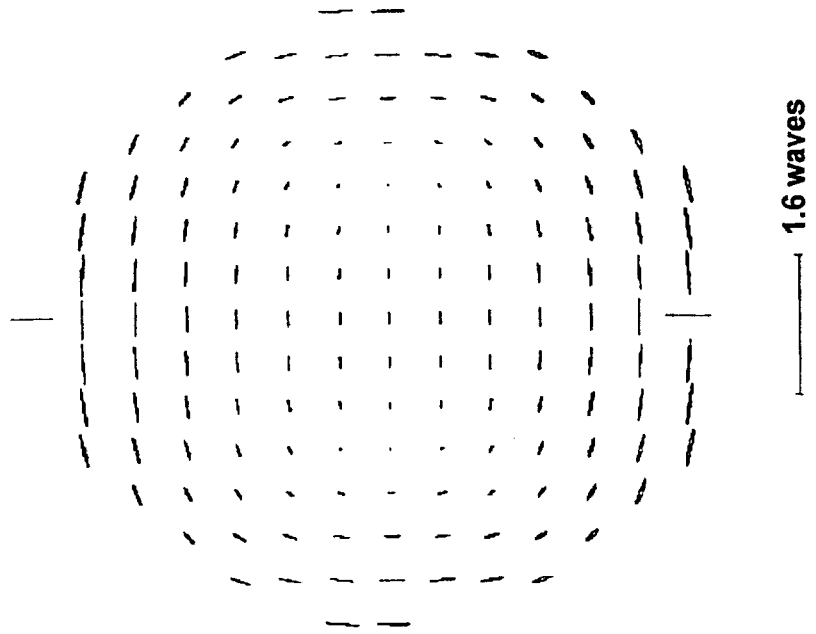
FIGS. 20A and 20B are graphical illustrations of the net retardance across the pupil for central and extreme field points, respectively, for the lens depicted in FIG. 1 wherein the optical elements comprise cubic crystalline material with crystal axes substantially identically aligned in three dimensions, with the optical axis extending along the [100] crystal lattice direction computed using a peak birefringence magnitude corresponding to that of calcium fluoride at a wavelength of 157 nm.
Figure 20A:
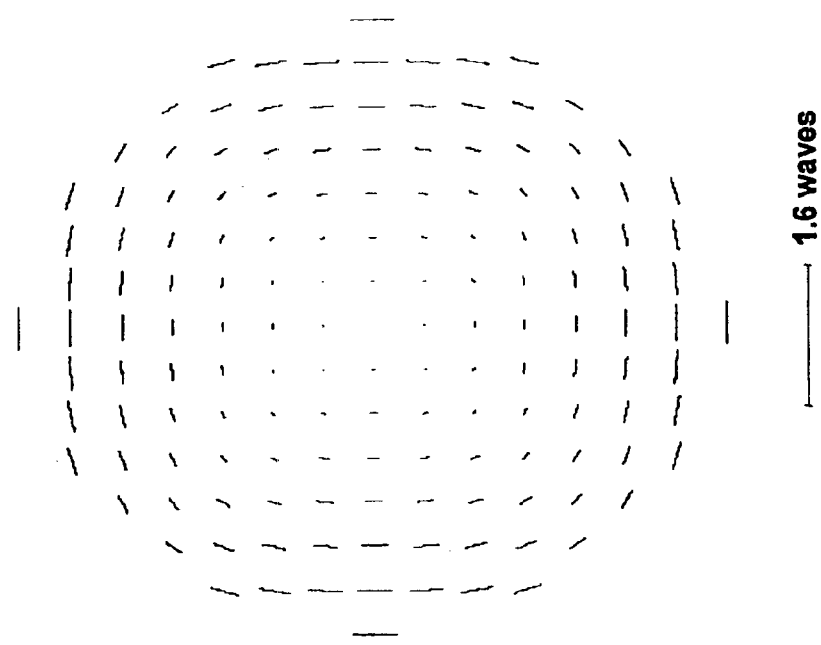

FIGS. 20A and 20B are graphical illustrations of the retardance for another exemplary embodiment of crystal lattice orientation of the lens system 100 shown in FIG. 1. In FIGS. 20A and 20B, the net retardance across the system exit pupil, including the effects of intrinsic birefringence, is depicted for field points at the center and edge of the field 102 with the crystal axes of all the elements L1–L29 substantially identically aligned, with the [100] crystal axes generally directed parallel to the optical axis 100. The peak retardance due to intrinsic birefringence in this example is approximately 0.49 waves at a wavelength of 193.3 nanometers on-axis and 0.54 waves at the extreme field.

Figure 21B:
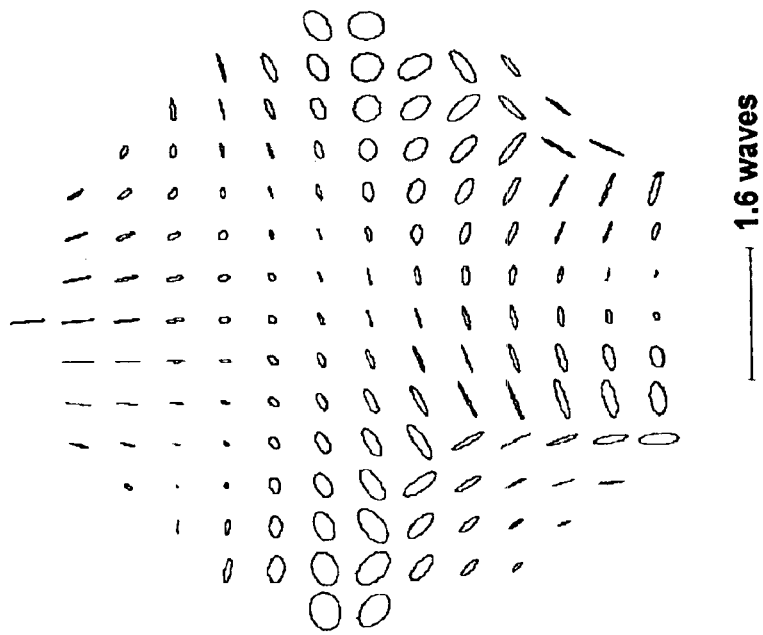
FIGS. 21A and 21B are graphical illustrations of the net retardance across the pupil for central and extreme field points, respectively, for the lens depicted in FIG. 1 wherein the optical elements comprise cubic crystalline material with crystal axes substantially identically aligned in three dimensions, with the optical axis extending along the [111] crystal lattice direction computed using a peak birefringence magnitude corresponding to that of calcium fluoride at a wavelength of 157 nm.
Figure 21A:
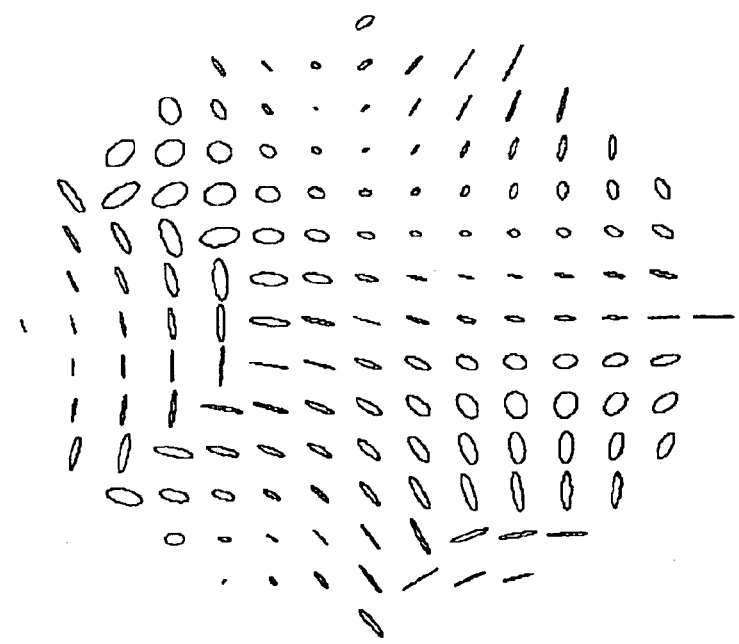

FIGS. 21A and 21B are graphical illustrations of the retardance of yet another exemplary embodiment of crystal lattice orientation of the lens system 100 shown in FIG. 1. In FIGS. 21A and 21B, the net retardance across the system exit pupil is depicted for field points at the center and edge of the field 102 with the crystal axes of all elements L1–L2 substantially identically aligned, for [111] optical elements, i.e., elements comprising [111] crystal with the [111] direction parallel to the optical axis 106. Again, the retardance orientation rotates by 90 degrees at one-half-wave ($\pi$ radians or 180°) intervals; thus, the peak retardance due to intrinsic birefringence is approximately 1.37 waves at a wavelength of 193.3 nanometers, and 1.40 waves at the extreme field.

In these three preceding examples, as illustrated in FIGS. 19A–21B, the intrinsic birefringence produces large retardance aberrations and consequently large wavefront aberrations, when each of the elements L1–L29 are oriented identically with respect to the optical axis 106. Without compensation, this wavefront aberration strongly exceeds the allowable wavefront error for high precision photolithography.

To reduce this aberration, two polarization rotators are added to the optical system 100 to compensate the retardance produced by the intrinsic birefringence of the optical elements L1–L29. See FIG. 22, which shows a similar lens 300 as presented in FIG. 1, but with two polarization rotators 310 and 320 which rotate the polarization of a beam of light passing therethrough by –90° and 90° respectively. This lens 300 has an optical axis 302, which defines an optical path for a beam of light to propagate from an object plane 306 to an image plane 308. The optical path follows a straight line in FIG. 22, however, in other embodiments, the optical path and the optical axis 302 may be other than straight and linear. The lens 300 comprises twenty-nine powered refractive optical elements L1–L29 that transmit and control the propagation of light from the object 306 to the image field 308.

Figure 22:
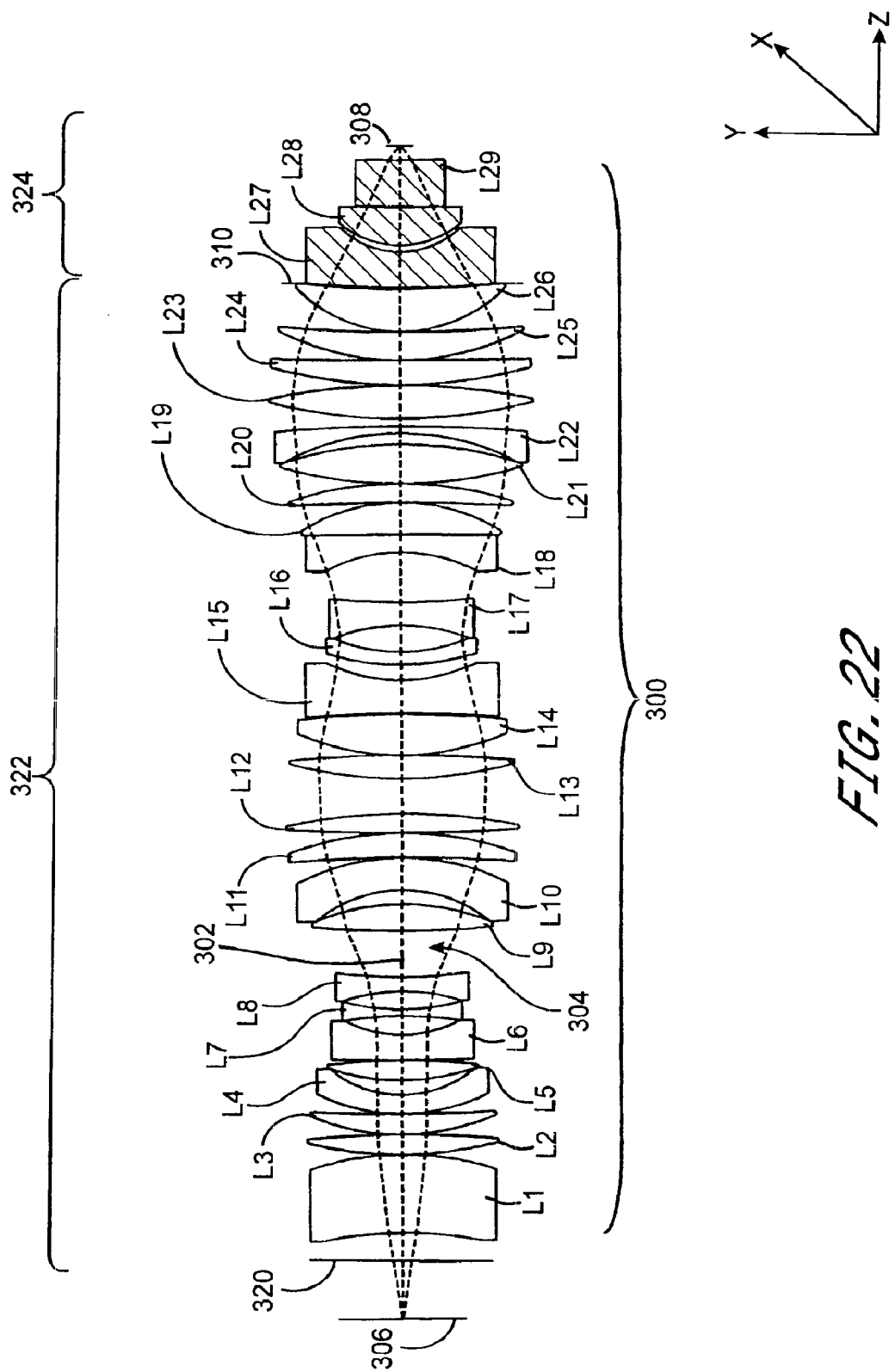
FIG. 22 is a schematic illustration showing the exemplary lens depicted in FIG. 1, in which the twenty-nine optical elements comprise cubic crystals having crystal axes substantially identically aligned in three dimensions, with the optical axis extending along the [100] crystal lattice direction, further comprising -90° and 90° polarization rotators.

In FIG. 22, the –90° rotator 320, which is optional, is located between the object plane 306 and the first element L1. The 90° rotator 310 is positioned at the location that minimizes the net system retardance without additional changes to the operation of the system 300. This position is preferably determined such that the birefringence of the optical element(s) L1–L26 in the portion of the optical path preceding the rotator 310 is equivalent to the birefringence of the optical element(s) L27–L29 in the optical path following the rotator 310. Similarly, the net retardance introduced by the optical elements L1–L26, L27–L29 in the path before and after the rotator 310 are matched and balance. Both the magnitude of the retardance and the orientation or the retardance axis substantially the same. Expressed yet another way, the eigenpolarizations states corresponding to the optical element or elements L1–L26 through which light passes prior to reaching the rotator 310 are preferably substantially identical to the eigenpolarization states corresponding to the optical element or elements, L27–L29 through which light passes after the rotator 310.

In calculating the improved performance of the lens 300, the rotators 310 and 320 are assumed to be ideal polarization rotators, such that each constituent polarization state is rotated by exactly 90 or –90°. Additionally, these rotators 310 and 320 are assumed to have zero thickness. The lens prescription may be adjusted and optimized for finite thickness rotators 310 and 320 as well. The optical axis 302 is defined along the Z direction, the field is oriented in the Y direction, and a right handed coordinate system is used; thus, a 90° rotation about the optical axis 302 represents a rotation of the X axis towards the Y axis. The order of the rotators 310, 320 may be switched without changing the performance, such that a 90° rotator 310 is used in object space, and a –90° rotator 320 is used between elements L26 and L27. Also, the rotator 320 in object space may, in principle, be alternatively used in image space (between the last element L29 and the image plane 308). However, for this particular design, as well as many photolithography lenses, the performance of a real rotator may be better if it is located in object space, since the range of incident angles is lower. Having some rays incident on the rotator 310, especially one comprising waveplates, at a high angles causes variations in the phase delay and thus not all rays experience the same polarization rotation. Preferably, the rotator 310 is positioned where the rays propagate through the optical system 300 are more closely parallel to the optical axis 302 and not substantially angled with respect thereto. Preferably, the polarization is rotated substantially uniformly across the beam of light that passes through the rotator 310. For rays substantially along or parallel to the optical axis, the retardance and phase shift is the same. Thus, at least rays having small angle with respect to the optical axis 302, will undergo substantially that same amount of polarization rotation.

Substantial benefit is obtained by inserting the 90° polarization rotator 310 between front and rear parts 322 and 324 of the lens 300. As discussed above, the location of the rotator 310 is chosen such that the net retardance produced by the cubic crystalline elements in the front part 322 of the system 300 are similar in magnitude as a function of field and pupil position to the net retardance produced by the cubic crystalline elements in the rear part 324 of the system 300. The rotator 310 allows the retardance contributions of the individual elements L1–L29 to be balanced to provide wavefront correction and reduce the net retardance produced by the intrinsic birefringence to an acceptable level. Under these conditions, the system 300 will have a uniform circular retardance of 90 degrees. The 90 degrees of circular retardance will rotate an arbitrary polarization state by 90 degrees. The light input into the optical system 300 will experience minimal wavefront aberrations, although the polarization state will be rotated by 90 degrees between the object and image planes 306 and 308, because of the 90° of circular retardance.

In order to evaluate the magnitude of the deviation of the retardance from 90 degrees, the –90 degree rotator 320, is inserted between the object 306 and first lens element L1. This second rotator 320 is used in this example as a computational aid and may or may not be included in the optical system 300. This second rotator 320 may be included in optical systems 300, for example, if the input and output polarizations need to be identical. Insertion of the second rotator 320 into the lens model also facilitates optimization of the system 300 by allowing the designer to simply optimize the retardance aberrations using a merit function that only contains the magnitude of the retardance. In this case, the designer just needs to reduce the magnitude of the retardance to zero. Without the second rotator, the designer would need to optimize on the magnitude and shape of the retardance to be constant across the pupil. This merit function would have twice as many terms and would take longer to optimize. An additional rotator 320, however, may introduce additional complexity and cost into the optical system 300 and thus may be excluded.

All the optical elements L1–L29 in the optical system 300 depicted in FIG. 22 comprise cubic crystalline material oriented with identical three-dimensional crystal lattice directions and with the [100] crystal lattice direction for each element L1–L29 along the system optical axis 302. Additionally, each of these optical elements comprise curved surfaces and are powered refractive optical elements. Operation is at a wavelength, 193.3 nanometers, where each optical element L1–L29 is substantially optically transmissive.

Figure 23B:
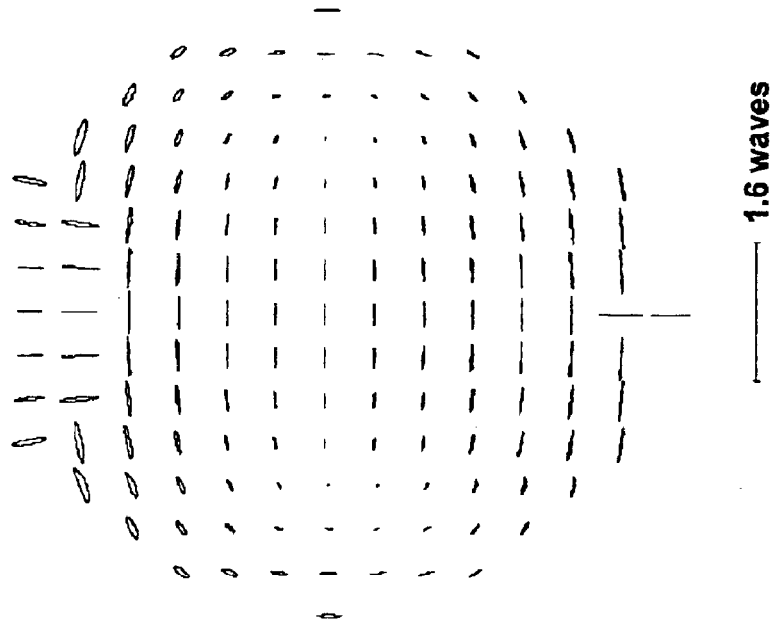
FIGS. 23A and 23B are graphical illustrations showing net retardance across the pupil for the central and extreme field points, respectively, due to intrinsic birefringence of the optical elements between the -90° and 90° polarization rotators for the exemplary lens depicted in FIG. 22.
Figure 23A:
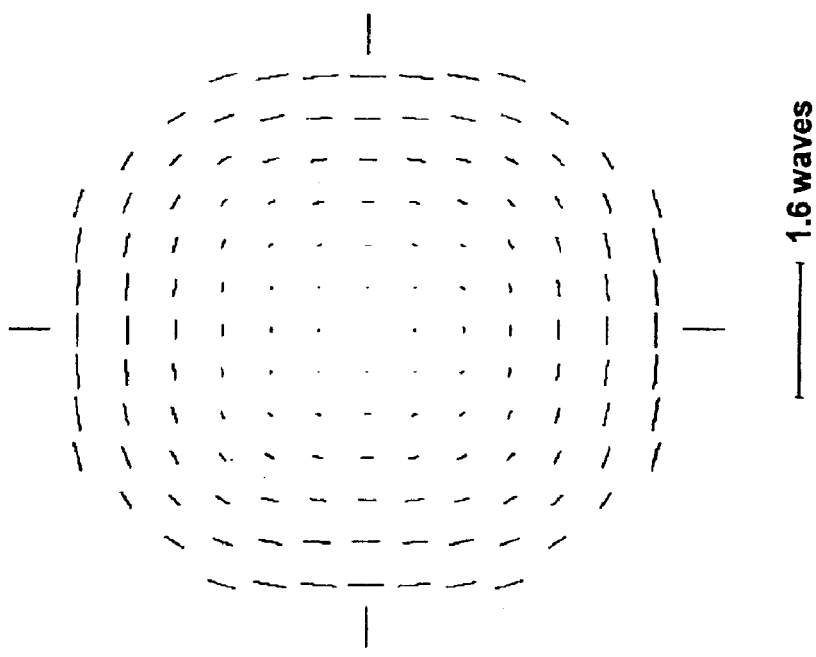

FIGS. 23A and 23B are graphical representations that depict the retardance across the system exit pupil for optical elements L1–L26 in the front portion 322 of the system 300, between the –90° and 90° rotators 310 and 320. The retardance is caused by the intrinsic birefringence and anti-reflection coatings. As previously shown in Table 2, the contribution due the coatings is relatively small; thus, the bulk of the retardance aberration is due to the intrinsic birefringence. FIG. 23A shows net retardance at the center field point and FIG. 23B shows net retardance at the edge field point.

Figures 24A, 24B:
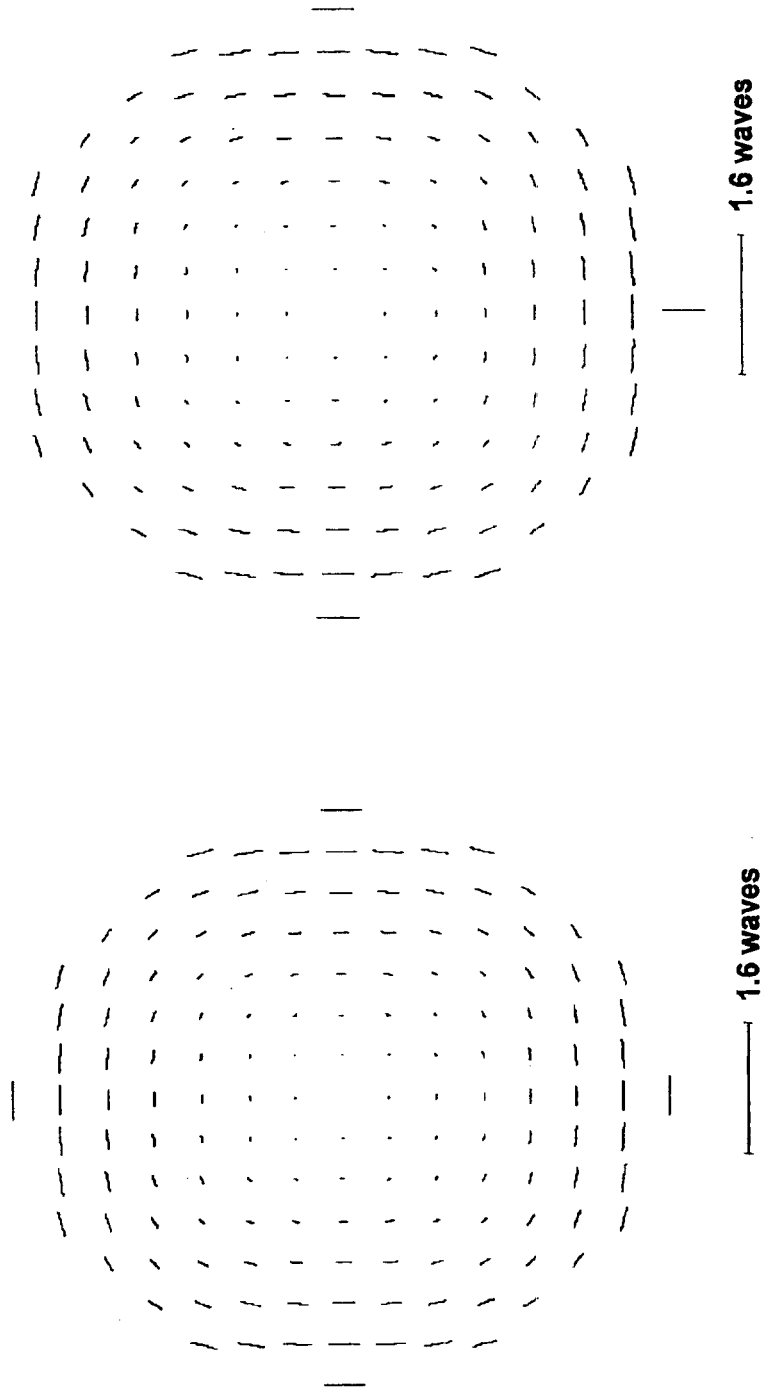
FIGS. 24A and 24B are graphical illustrations showing net retardance across the pupil for the central and extreme field points, respectively, due to intrinsic birefringence of the elements between the 90° polarization rotator and the image plane for the exemplary lens depicted in FIG. 22.

FIGS. 24A and 24B are graphical representations that depict the retardance across the system exit pupil for optical elements L27-29 in the rear portion 324 of the system 300, between the 90° rotator 310 and the image plane 308. FIG. 24A shows net retardance for the center field point and FIG. 24B shows net retardance for the edge field point.

Comparing FIGS. 23A and 24A, the net retardance from the front portion 322 of the system 300 is substantially similar to the net retardance from the rear portion 324 of the system 300 across the pupil for the beam emanating from the axial field point. Thus, because the 90° rotator 320 rotates each constituent polarization state by 90°, the retardance of the rear portion 324 of the system 300 will compensate the retardance of the front portion 322 of the system 300. The slow eigenpolarization states of the two portions 322 and 324, which are shown in FIGS. 23A and 24A, respectively, are linear across the exit pupil. Thus, in this case, light propagating through the first portion 322 having a first polarization component parallel to the slow eigenpolarization state of the first portion 322 is retarded with respect to a second orthogonal polarization component that is parallel to the fast eigenpolarization state. The phase of the first polarization is retarded with respect to that of the second polarization by an amount corresponding to the retardance introduced by the first portion 322. The polarization rotator 320, however, rotates the polarization of the first and second polarization components such that the first polarization component is parallel to the fast eigenpolarization state in the second portion 324 and the second polarization state is parallel to the slow eigenpolarization state. The second polarization component is therefore retarded with respect to the first polarization component in the second portion 324 by an amount equal to the retardance introduced to the first polarization in the first portion 322. The retardances thus cancel.

FIGS. 23B and 24B show that the net retardance across the pupil for the front and rear portions 322 and 324 of the optical system 300 are not as well matched at the extreme field. The retardance contribution of the front portion 322 is larger in magnitude and is not centered in the pupil.

Figure 25B:
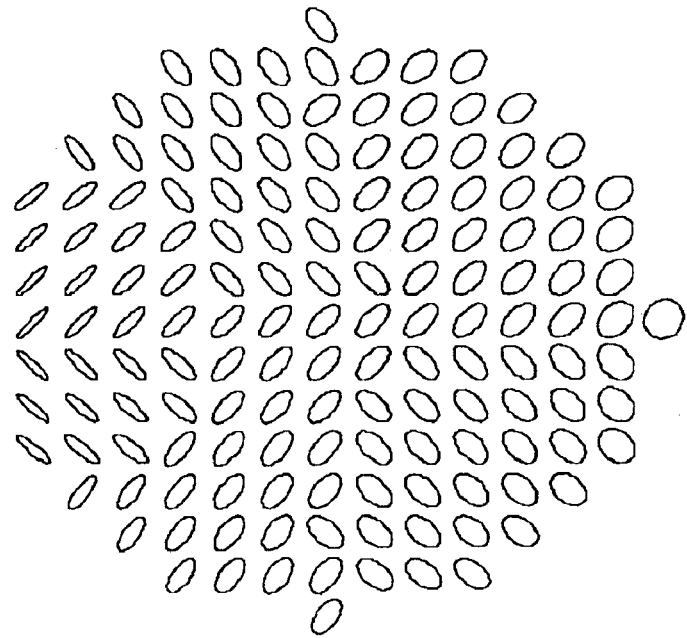
FIGS. 25A and 25B are graphical illustrations showing net retardance across the pupil for the central and extreme field points, respectively, for all lens elements and the 90° polarization rotator excluding the retardance of the -90° polarization rotator for the exemplary lens depicted in FIG. 22.
Figure 25A:
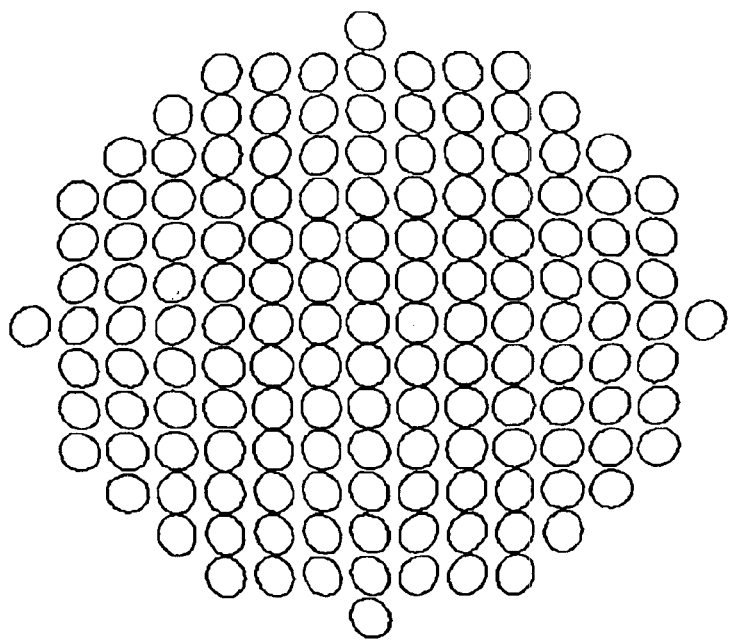

FIGS. 25A and 25B are graphical representations that depict the net retardance across the system exit pupil due to intrinsic birefringence of all elements L1–L29, including the 90° rotator 310, but excluding the –90° rotator 320. These plots show that the rotator 310 contributes a roughly constant retardance across the pupil that can be balanced with the retardance produced by a second rotator 320. In general, to reduce aberration, an optical system preferably has no variation in the polarization state across the pupil. This occurs when the retardance is constant or degenerately when there is no retardance. In the degenerate case, any polarization state is an eigenpolarization state.

Figures 26A, 26B:
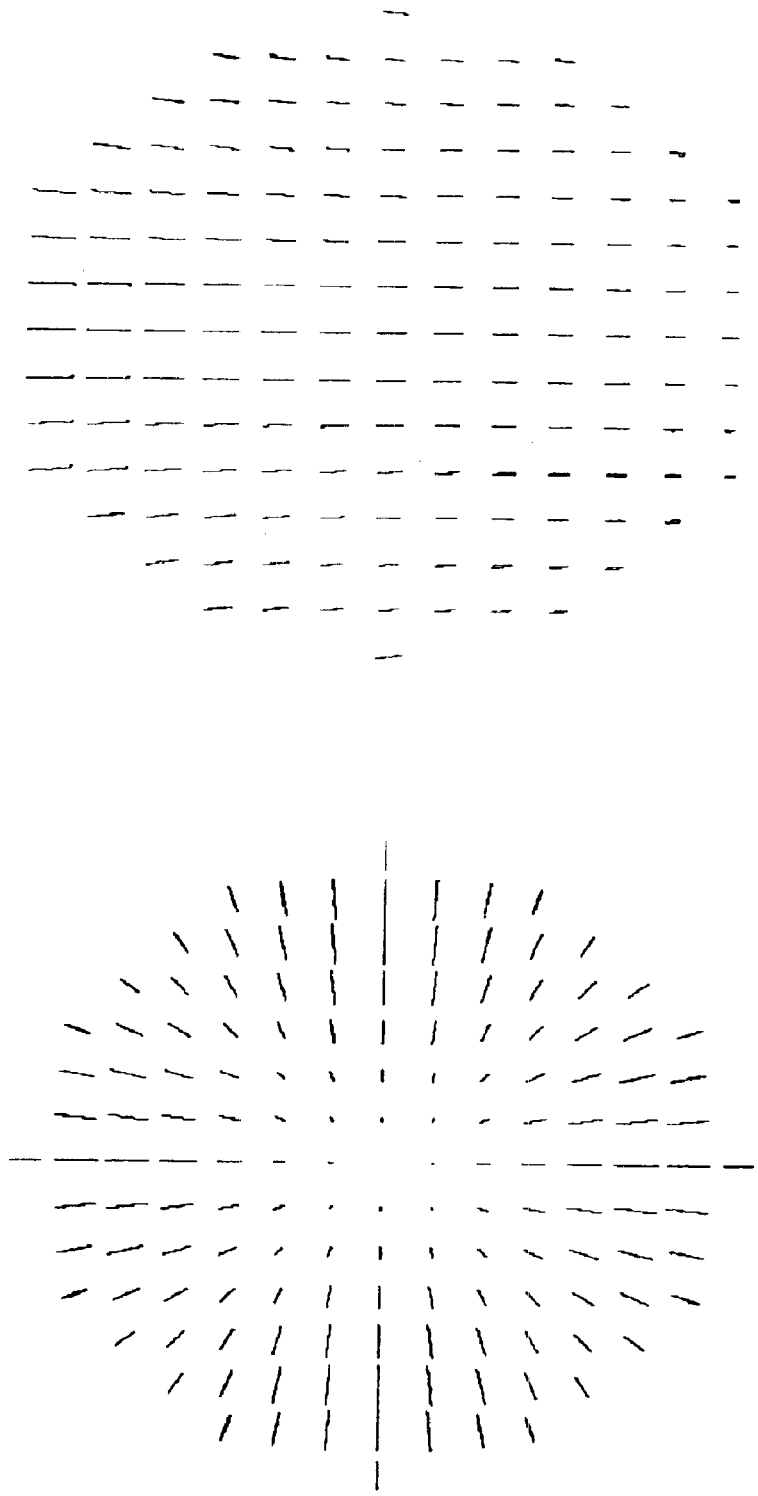
FIGS. 26A and 26B are graphical illustrations showing net retardance across the pupil at the central and extreme field points, respectively, for all elements and the 90° and −90° polarization rotators for the exemplary lens depicted in FIG. 22.

FIGS. 26A and 26B are graphical representations that depict the net retardance across the system exit pupil due to intrinsic birefringence of all elements L1–L29, including the 90° and –90° rotators 310 and 320. The retardance introduced by the 90° rotator 320 is offset by the retardance introduced by the –90° rotator 320 for further correction. As shown, the net retardance for the axial field has been significantly reduced compared with the retardance for all the [100] elements L1–L29 without rotators 310, 320 shown in FIG. 20A. FIG. 26B, however, shows larger residual retardance across the pupil.

The RMS and maximum retardance over the exit pupil are listed in Table 3 below for relative field heights of 0, 0.7, and 1.0. These include the effects of intrinsic birefringence and the single layer anti-reflection coatings used in the model. A relative field height of 0.0 corresponds to the center field point is associated with the retardance results shown graphically in FIG. 26A, and a relative field height of 1.0 corresponds to the edge field point, retardance results of which are shown graphically in FIG. 26B. The RMS retardance ranges from 0.0154 to 0.0677 waves at $\lambda_o$=193.3 nm.

TABLE 3

| Relative Field Height | Retardance (waves at $\lambda_o$ = 193.3 nm) | |
| --- | --- | --- |
| | RMS | Maximum |
| 0.0 | 0.0154 | 0.0606 |
| 0.7 | 0.0528 | 0.2486 |
| 1.0 | 0.0677 | 0.3826 |

Figure 27:
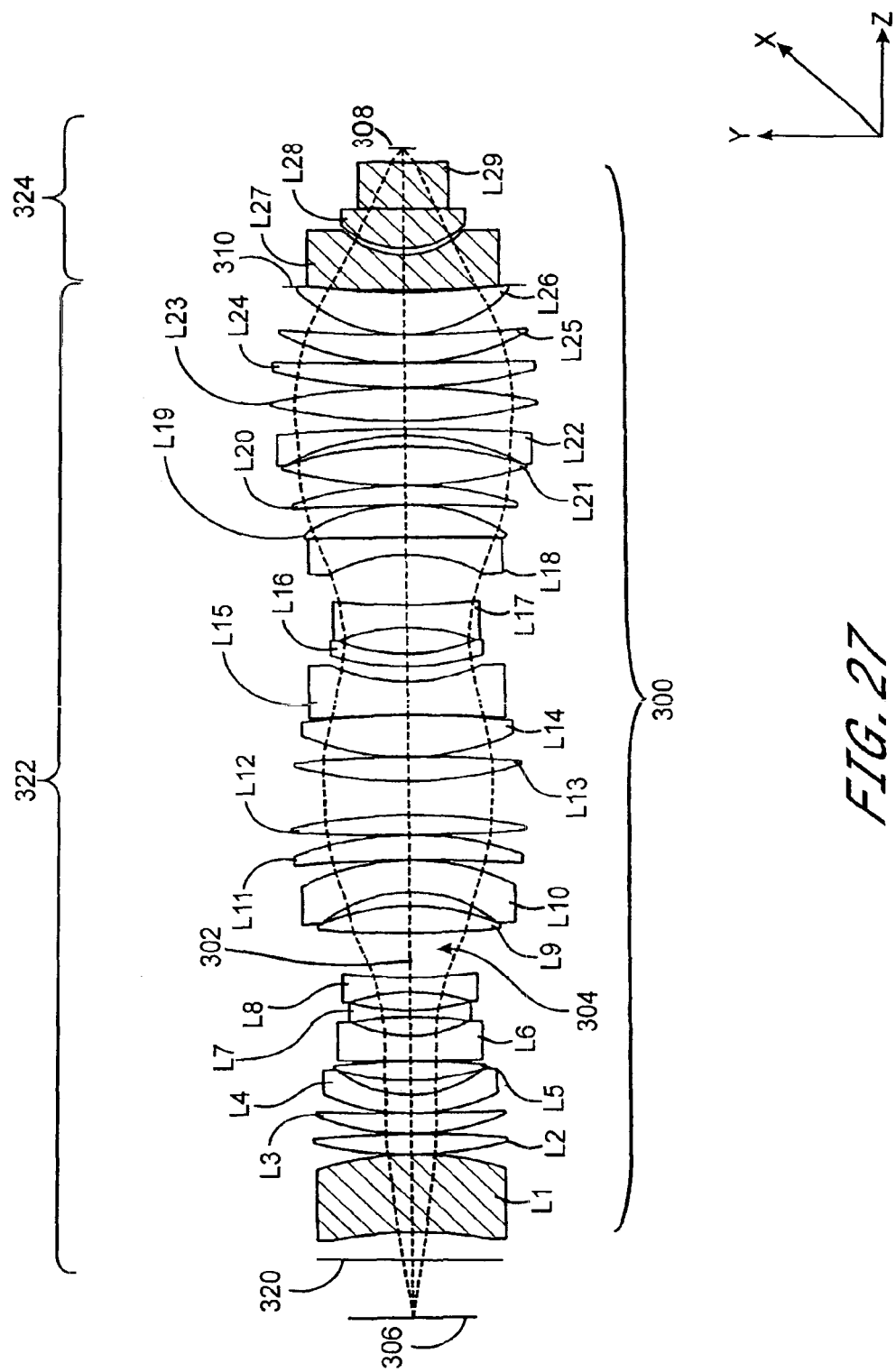
FIG. 27 is a schematic illustration showing the exemplary lens depicted in FIG. 22, in which the twenty-nine optical elements comprise cubic crystalline material substantially having crystal axes substantially identically aligned in three dimensions, with the optical axis generally along the [100] crystal lattice direction, including −90° and 90° polarization rotators and an element which has a hoop applied stress to induce radial stress birefringence therein.
Figures 28A, 28B, 28C:
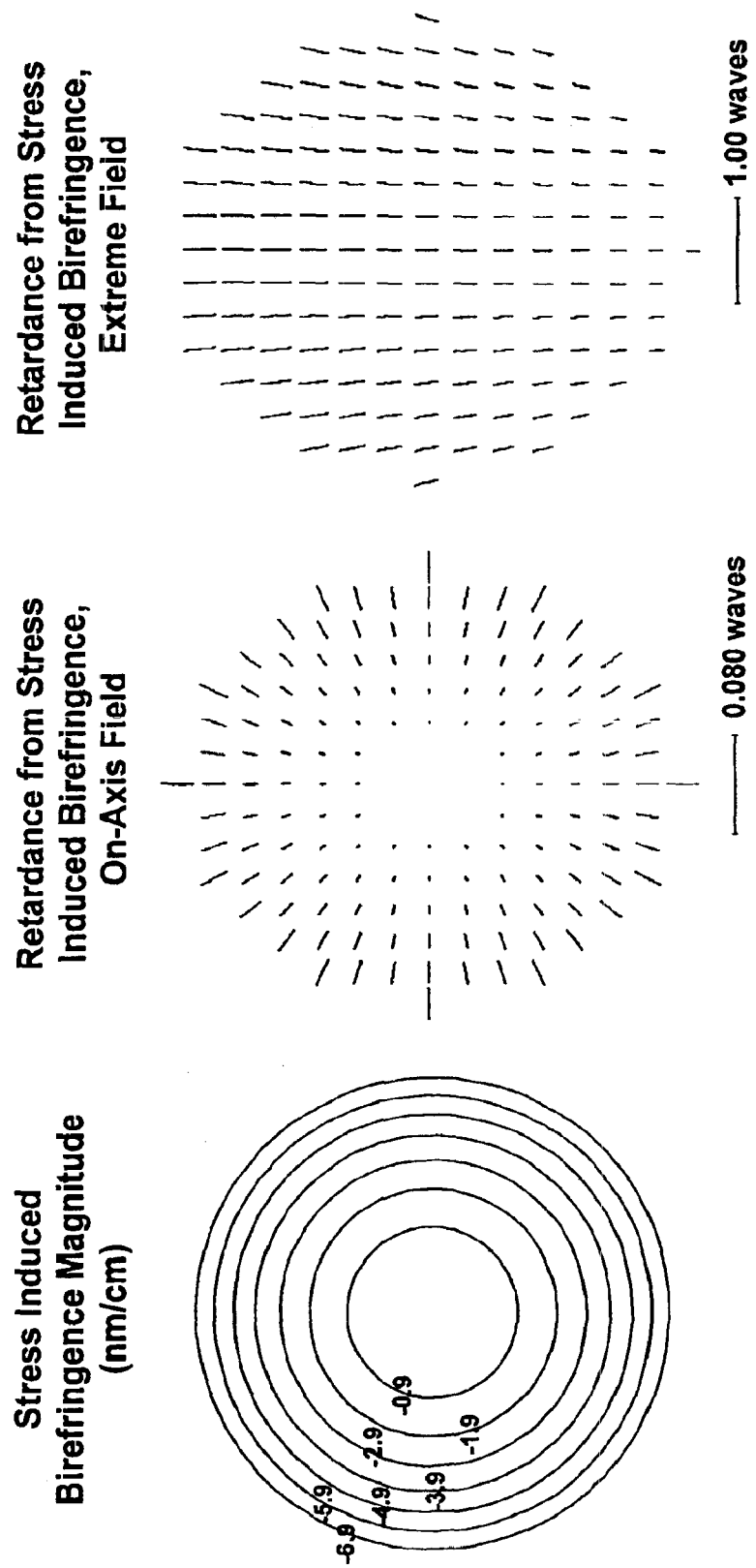
FIG. 28A is a contour plot showing the radial variation in birefringence in the first lens element having a hoop applied stress to induce radial stress birefringence therein in the exemplary lens depicted in FIG. 27, in which the variation is assumed to follow a quadratic profile with a peak birefringence of −6.95 nm/cm.
FIGS. 28B and 28C are graphical illustrations showing retardance across the pupil at the central and extreme field points, respectively, due to the birefringence induced by the hoop applied stress to the first lens element following the reticle.

Further correction may be achieved by applying stress to one or more elements to produce stress induced birefringence. For example, a clamp, brace, or other structure around a perimeter of an optical component can be employed to apply, e.g., tensile or compressive forces to the optical component. In the one embodiment depicted in FIG. 27, a tensile hoop stress was applied to the first element L1 of the optical system 300 depicted in FIG. 22. For purposes of calculations, the tensile hoop stress is assumed to produce a radial variation in birefringence with a peak birefringence magnitude of –6.95 nanometers/centimeter at the clear aperture diameter. FIG. 28A shows a contour plot of the assumed birefringence profile. FIGS. 28B and 28C are graphical representations that depict the retardance across the system exit pupil due to stress induced intrinsic birefringence and anti-reflection coatings associated with the first lens element L1. Table 4 lists the corresponding RMS and maximum retardance values as a function of relative field height. This data shows that there is a relatively small contribution on axis 302, with a peak retardance of 0.025 waves at $\lambda$=193.3 nm, while the retardance at the extreme field is much larger, with a maximum retardance of 0.31 waves.

The first element L1 in this design is particularly well suited for application of hoop stress to introduce birefringence. The first element L1 can provide a large variation in retardance with field since it is close to the object plane 306 thereby resulting in variation in displacement of the beam across the surface of the first element L1 with different field heights. Also, this element L1 in this example is particularly thick, which provides good mechanical stability for applying stress to the element.

TABLE 4

| | Retardance (waves at $\lambda_o$ = 193.3 nm) | |
|---|---|---|
| Relative Field Height | RMS | Maximum |
| 0.0 | 0.0070 | 0.0252 |
| 0.7 | 0.0383 | 0.1856 |
| 1.0 | 0.0505 | 0.3134 |

Comparing FIGS. 28B and 28C with the residual retardance maps given in FIGS. 26A and 26B, the retardance produced by the stress induced birefringence is substantially similar to the residual system retardance as a function of pupil and field position. Because a 90° rotator 310 is used following the element L1 with stress induced birefringence, the retardance contribution of the stressed element L1 balances the net retardance of the system 300 resulting from intrinsic birefringence.

Figure 29B:
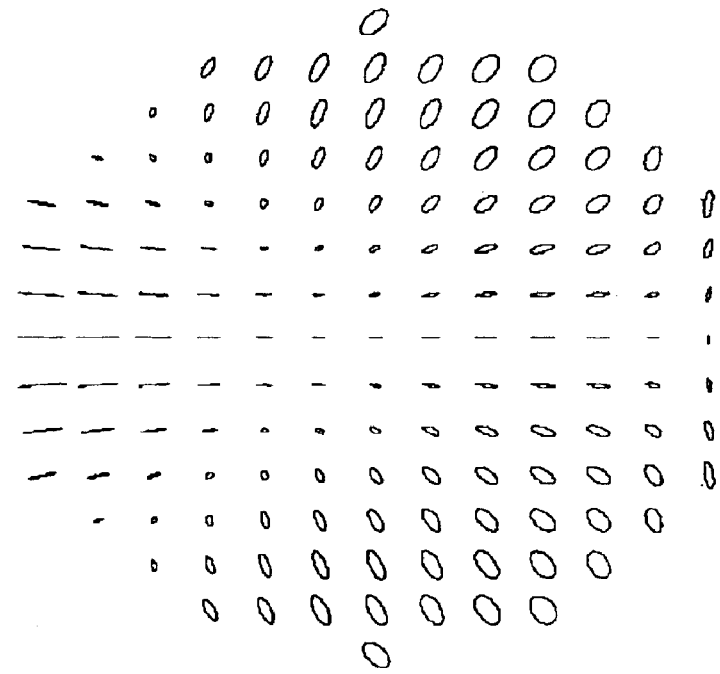
FIGS. 29A and 29B are graphical illustrations showing net retardance across the pupil for the central and extreme field points, respectively, for all elements, including the 90° and −90° rotators and the retardance produced by applying a hoop stress to the first element following the reticle for the exemplary lens depicted in FIG. 27.
Figure 29A:
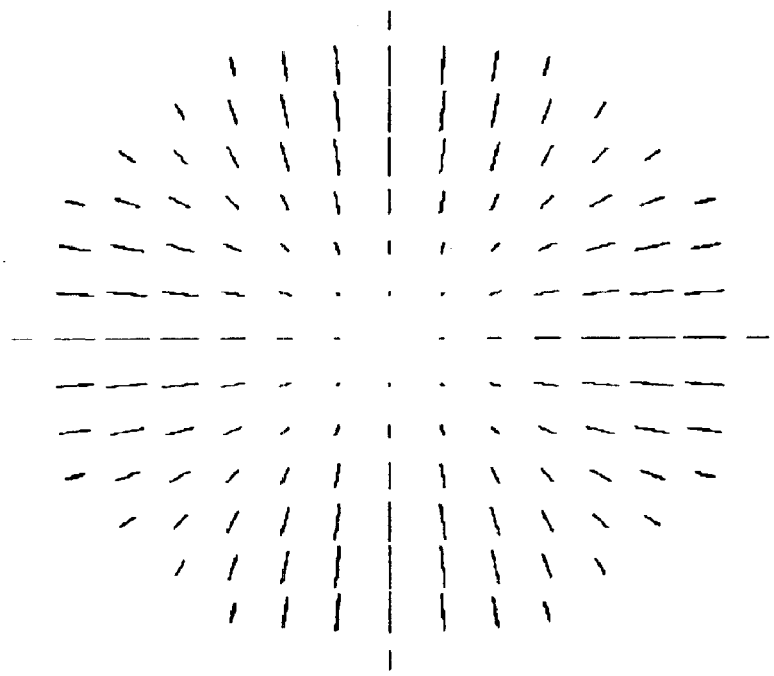

FIGS. 29A and 29B are graphical representations that depict the net retardance across the system exit pupil due to intrinsic birefringence of all elements L1–L29, including the 90° and −90° rotators 310 and 320 and the stress induced birefringence on the first element L1. Corresponding values for RMS and maximum retardance are listed in Table 5. As shown, the retardance produced by the stressed element L1 further improves the retardance correction.

TABLE 5

| | Retardance (waves at $\lambda_o$ = 193.3 nm) | |
|---|---|---|
| Relative Field Height | RMS | Maximum |
| 0.0 | 0.0127 | 0.0517 |
| 0.7 | 0.0146 | 0.0722 |
| 1.0 | 0.0161 | 0.0811 |

The retardance using all [100] elements without rotators 310 and 320 is shown in FIGS. 20A and 20B. With the two rotators 310 and 320 and the stressed first element L1, the maximum retardance was reduced from 0.488 waves to 0.0517 waves at λ=193.3 nm for the axial field (9.4× reduction) and a reduction in maximum retardance from 0.544 waves to 0.0811 waves at the extreme field (6.7× reduction).

Figure 30:
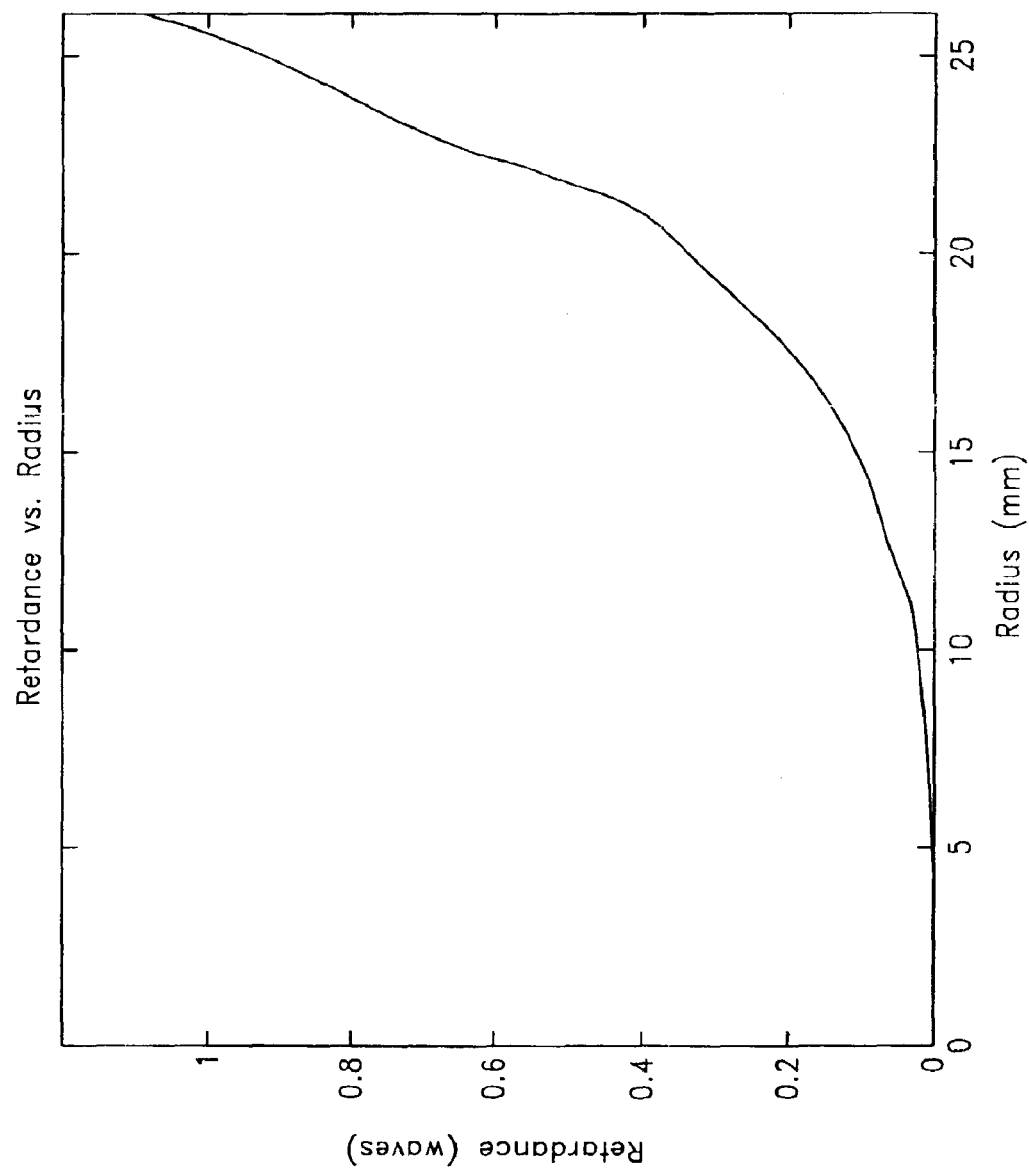
FIG. 30 is a plot on axis of radius (in millimeters) and retardance (in waves) illustrating the radial retardance variation across an exemplary optical element when a compressive hoop stress is applied around the perimeter of the element.

In this example, the application of hoop stress to an optical element L1 was assumed to produce a quadratic variation in the magnitude of the birefringence, with the birefringence axis oriented radially. In FIG. 30, the retardance as a function of element radius calculated using finite element analysis methods is shown for a meniscus shaped calcium fluoride element with 5 mm center thickness, radii of curvature of 40 and 35 mm, and a compressive stress of 1000 pounds per square inch. The fracture strength of a well-polished single crystal of calcium fluoride has been reported to be in excess of 20,000 pounds per square inch. Although this first lens element L1 differs from the meniscus shaped element, the variation in stress is expected to follow a similar functional form. In alternative embodiments, tensile stress, may be employed to create stress-induced birefringence.

Figure 31A:
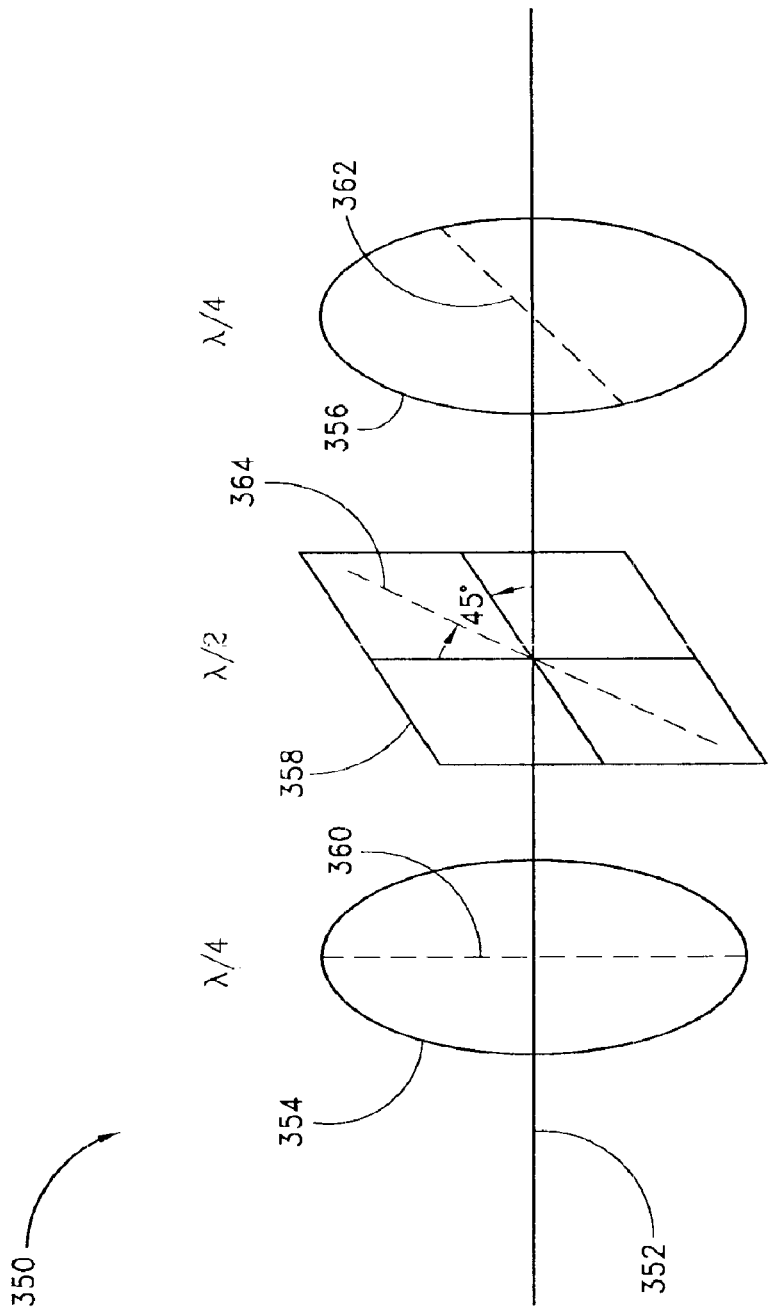
FIG. 31A is perspective view of a polarization rotator for rotating the polarization of any arbitrary polarization state by about 90° about the propagation direction.

As is commonly known in the art and shown in FIG. 31A, a real polarization rotator 350 for rotating polarization direction may be constructed using two quarter wave plates 354 and 356 and a half wave plate 358 aligned along a common optical axis 352. The two quarter wave plates 354 and 356 have fast axes 360 and 362 rotated about the optic axis 352 by 90° with respect to one another. The half wave plate 358 is inserted between the two quarter wave plates 354 and 356 and has a fast axis 364 at an angle of about 45° with respect to the fast axes 360 and 362 of the quarter wave plates 354 and 356. This rotator 350 will convert any arbitrary polarization state into a new polarization state corresponding to the old state with the polarization orientation rotated by 90°. Such a polarization rotator is describe in see, e.g., U.S. Pat. No. 6,084,708 issued to K. H. Schuster and U.S. Pat. No. 6,324,003 issued to G. Martin, both of which are incorporated herein by reference in their entirety.

Elements (not shown) with weak retardance, other than the half wave plate 356, may also be placed between the quarter wave plates 354 and 356 without substantially affecting the performance of the rotator 350. These additional elements may, for example, include powered optical elements. These wave plates 354, 356, and 358 may be created using stress induced birefringence or using uniaxial materials. For a waveplate constructed by applying stress to a cubic crystalline substrate, the stress birefringence coefficient is highest when the [100] crystal lattice direction is oriented along the system optical axis 352. The stress birefringence coefficient along the [100] direction is over 4 times larger than the coefficient along the [111] lattice direction. Thus, for a given plate thickness, the stress necessary to create a given retardance may be minimized by orienting the wave plate with its [100] crystal lattice direction along the optical axis 352, and cubic crystalline stress elements are often used with this orientation. See for example, U.S. Pat. No. 6,201,634 issued to S. Sakuma, et al., and U.S. Pat. No. 6,324,003 issued to G. Martin, which are incorporated herein by reference.

Figure 31B:
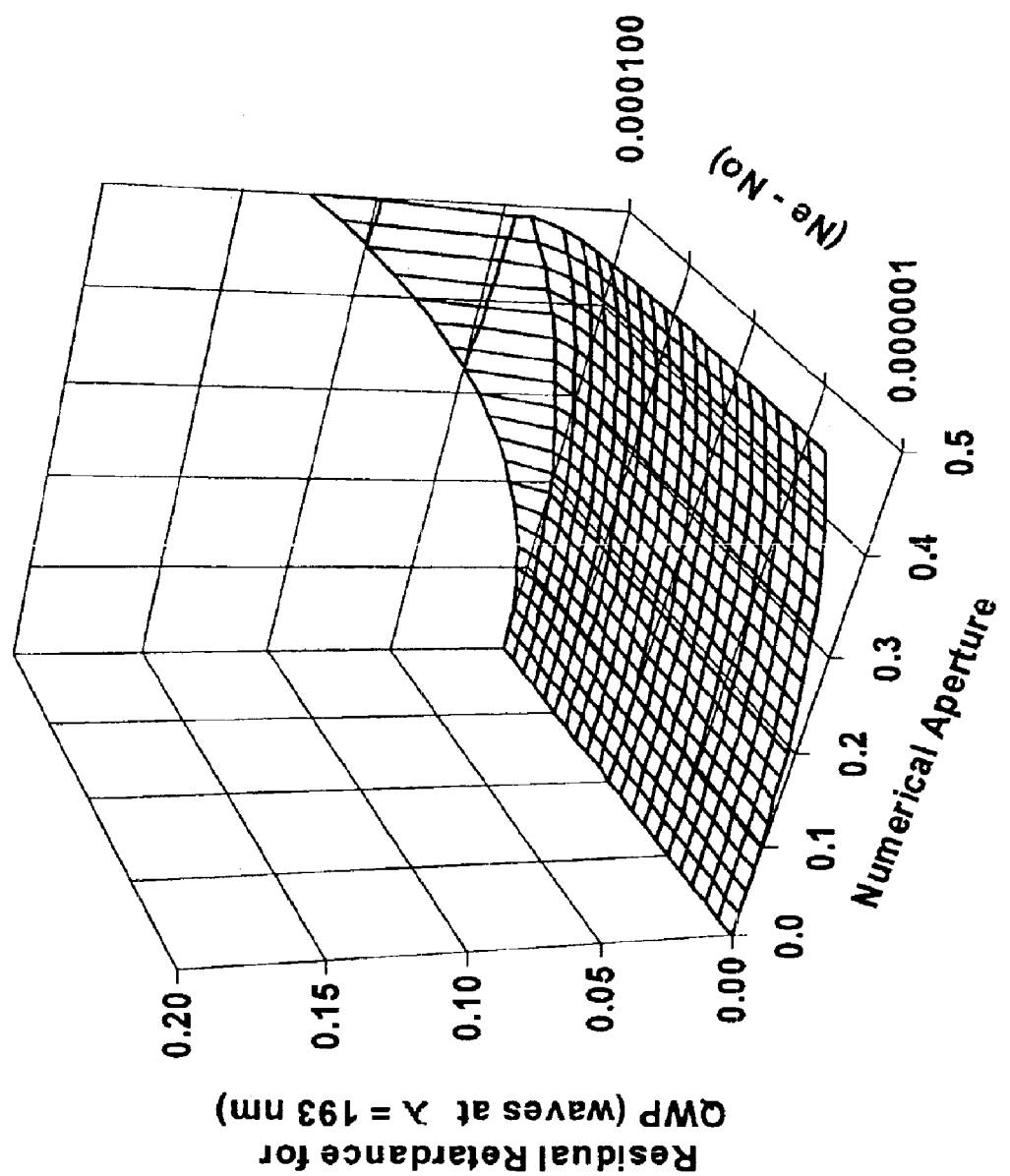
FIG. 31B is a plot of the variation in residual retardance for a quarter wave plate as a function of numerical angle, sin θ, (from 0.0 to 0.5) and peak stress birefringence magnitude (from $1 \times 10^{-6}$ to $1 \times 10^{-3}$) for a polarization rotator constructed from single order wave plates employing stress induced birefringence.

A real quarter wave plate has a residual retardance error that depends on numerical aperture and birefringence magnitude. In FIG. 31B, the estimated residual retardance error is plotted over a numerical aperture range of 0.0 to 0.5 and a range of intrinsic birefringence from $1 \times 10^{-6}$ to $1 \times 10^{-4}$. Over these ranges, the residual retardance error is less than $\frac{1}{8}^{th}$ wave; these results suggest that the performance for real rotators constructed from wave plates should be acceptable for compensation in many applications such as for lithography lenses.

Other types of polarization rotators 350 different than that shown in FIG. 31A may alternatively be employed. These include, but are not limited to, Faraday rotators and rotators constructed using an optically active material such as crystal quartz or sugar water. When making a quartz rotator, the material is cut so that the birefringence axis is parallel to the optical axis, whereas the birefringence axis is perpendicular to the optical axis in quartz linear retarders.

In addition, although the polarization rotator 350 shown in FIG. 31A rotates the polarization by 90 degrees, compensation and reduction in polarization aberrations can be provided if odd integer multiples of 90 degrees (i.e., ±90, ±270, etc.) are provided as well. For example, a polarization rotator that rotates an arbitrary polarization by ±270 about the direction of propagation may be situated between two portions 322, 324 of the optical system 300 having equivalent birefringence.

Also, although 90° of rotation is introduced at one location along the axis 302 of the optical system 300, the optical system 300 is not so limited. In other designs, an odd number of 90° of rotators may be used. For example, three polarization rotators each rotating the polarization by 90° may be inserted in three locations within the optical system 300. Preferably, these three 90° polarization rotators would separate the optical system into four portions. The locations would preferably be selected such that the birefringence from each of the four portions would substantially cancel out. In other designs, the polarization can be rotated by amounts other than 90°. Specifically, if there is an odd number of rotators, n, the rotation of each rotator can be 180°/(n+1). For example, three polarization rotators each rotating the polarization by 45° may be inserted in three locations within the optical system 300. Preferably, these three 45° polarization rotators would separate the optical system into four portions. The locations would preferably be selected such that the birefringence from each of the four portions would substantially cancel out. There are many possible ways to use rotators to cancel the intrinsic birefringence and these examples are merely illustrative and not restrictive. It is expected that the single rotator solution will usually be the very cost effective, because it is the simple.

Also, although non-powered waveplates 354, 356, and 358, are shown as forming the polarization rotator 350, the waveplate (and/or rotator) functions may be integrated with lens functions in other designs. The waveplates 354, 356, and 358 may, for example, contain curved surfaces and thus possess power, which contributes to the operation of the optical system 300. Such integration may increase the complexity of the design but also provides additional possibilities. Accordingly, polarization rotation elements which contain power are considered possible.

Also, rotations other than 90° may be desired when the birefringence of two portions 322, 324 of the optical system to not completely match but are rotated with respect to each other. For example, if the birefringence in first and second portions 322, 324 of the optical system 300 have birefringence rotated about 10° with respect to each other, a 100° polarization rotator, may be inserted between the two portions 322, 324 to provide for compensation and cancel out the retardance contributed by the two portions 322, 324.

EXAMPLE 4

Figure 32:
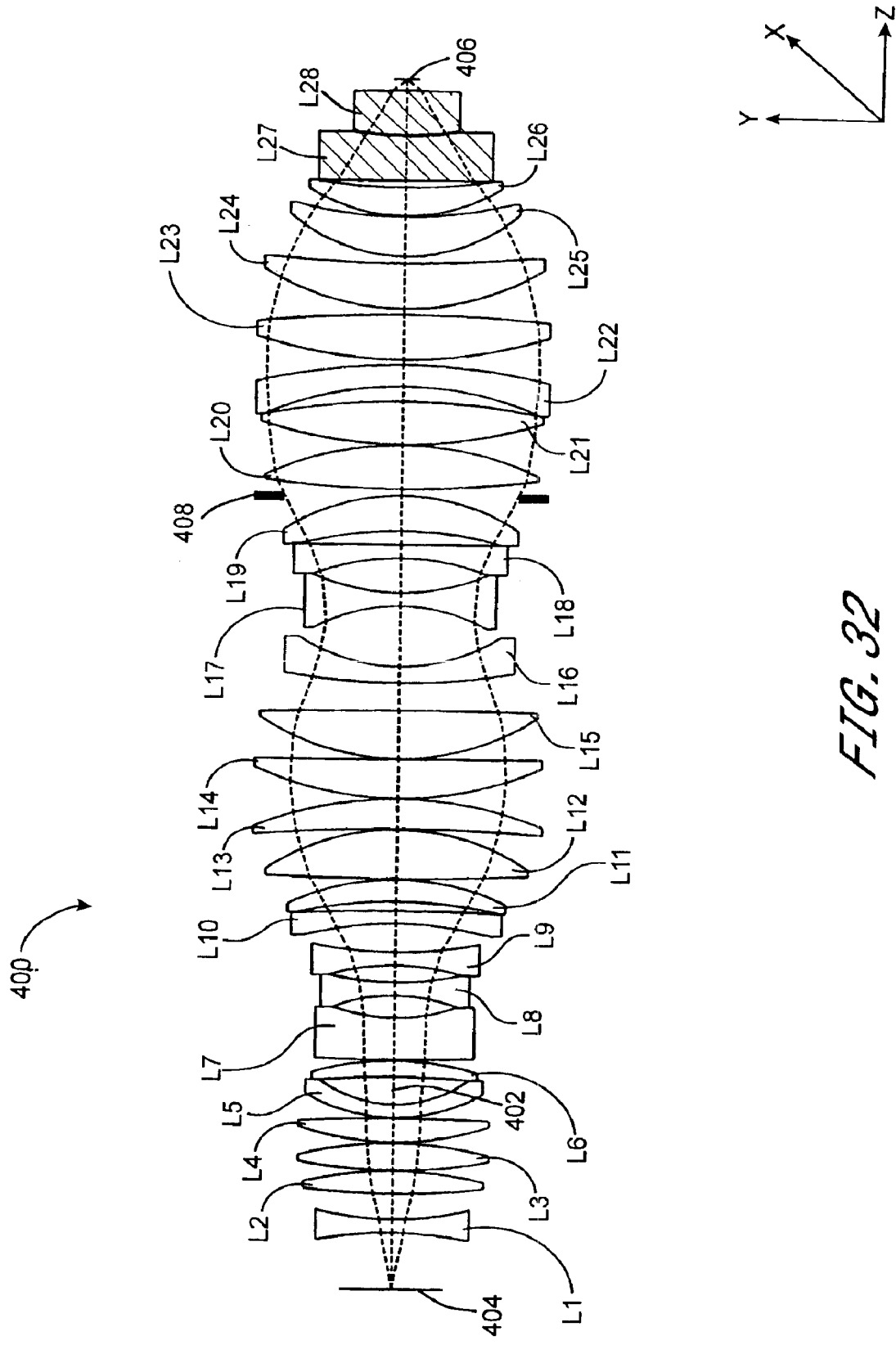
FIG. 32 is a cross-sectional view of an exemplary large format refractive projection lens comprising twenty-eight refractive optical elements comprising cubic crystalline material.

Another exemplary all-refractive projection lens 400 comprising powered refractive optical elements is depicted in FIG. 32. Such an exemplary imaging lens 400 may be used for photolithography and, in particular, may be used in the semiconductor manufacturing industry. A similar lens disclosed in European Patent No. 1 139 138 A1 issued to Y. Ohmura is designed to operate at a central wavelength of 193.3 nanometers, provides 4x reduction at a numerical aperture of 0.75, and has an image field diameter of 27.5 mm. The design employs twenty-eight optical elements L1–L28 aligned on an optical axis 402, each lens element L1–L28 being constructed from calcium fluoride and fused silica. Three of the surface on the optical elements L1–L28 are aspheric. These optical elements L1–L28 are substantially optically transmissive to UV light. The lens 400 depicted in FIG. 32 possesses substantially the same lens prescription as that disclosed in European Patent No. 1 139 138 A1 except that all the lens elements L1–L28 in lens 400 of FIG. 32 comprise calcium fluoride and are assumed to have an intrinsic birefringence of $-12 \times 10^{-7}$ for purposes of calculations. In other embodiments, however, some of the lens elements L1–L28 may be formed of non-cubic crystalline material or additional lens elements or other optically transmissive elements may be formed of non-cubic crystalline material. Various suitable non-cubic crystalline materials such as dry fused silica may be used, for example.

FIG. 32 shows the imaging lens 400 with object plane 404, which may be, e.g., a reticle or photomask, image plane 406, which may be, for example, a substrate upon which the image is formed, and aperture stop, AS, 408.

RMS and maximum retardance and diattenuation over the exit pupil are listed in Table 6 for the nominal design without intrinsic birefringence effects included for relative field heights of 0, 0.7, and 1.0. The retardance and diattenuation result from the single-layer anti-reflection coatings used in the model. The retardance is radially oriented and is largest in magnitude at the edge of the pupil.

TABLE 6

| Relative Field Height | Retardance (waves at $\lambda_o$ = 193.3 nm) | | Diattenuation | |
|---|---|---|---|---|
| | RMS | Maximum | RMS | Maximum |
| 0.0 | 0.0048 | 0.0177 | 0.0068 | 0.0273 |
| 0.7 | 0.0049 | 0.0184 | 0.0069 | 0.0274 |
| 1.0 | 0.0053 | 0.0216 | 0.0075 | 0.0310 |

Table 7 shows RMS and peak-to-valley wavefront error for the nominal design, without the effects of intrinsic birefringence. Wavefront errors are given for relative field heights of 0, 0.7, and 1.0 in the Y direction, and are listed for two orthogonal polarization components. The X component represents the wavefront error for an input polarization in the X direction assuming a linear polarizer along the X direction at the system exit pupil. The Y component represents the wavefront error for an input polarization in the Y direction assuming a linear polarizer along the Y direction at the exit pupil. Without cubic crystalline optical elements, or the effect of intrinsic birefringence considered, the nominal design includes a peak RMS wavefront error of 0.004 waves.

TABLE 7

| Relative Field Height | RMS Wavefront Error (waves at $\lambda_o$ = 193.3 nm) | | Peak-to-Valley Wavefront Error (waves at $\lambda_o$ = 193.3 nm) | |
|---|---|---|---|---|
| | X Component | Y Component | X Component | Y Component |
| 0.0 | 0.003 | 0.003 | 0.017 | 0.017 |
| 0.7 | 0.003 | 0.004 | 0.022 | 0.033 |
| 1.0 | 0.003 | 0.004 | 0.022 | 0.029 |

FIGS. 33A, 33B, 33C, and 33D show wavefront errors plotted at the system exit pupil as contour maps for the nominal design without intrinsic birefringence effects included. FIGS. 33A and 33B show contour plots of the residual wavefront error for the exemplary lens 400 depicted in FIG. 32 corresponding to an input polarization in the X direction, perpendicular to the field height, used with an exit pupil analyzer in the X direction for the center and extreme field points, respectively. For the wavefront error at the central field point, the maximum peak-to-valley optical path difference is 0.017 waves at a wavelength of 193.3 nanometers, and for the wavefront error at the extreme field, the maximum peak-to-valley optical path difference is 0.022 waves. FIGS. 33C and 33D show contour plots of the residual wavefront error for the lens depicted in FIG. 32 corresponding to an input polarization in the Y direction, parallel to the field height, used with an exit pupil analyzer in the Y direction for the central and extreme field points, respectively. For the wavefront error at the central field point, the maximum peak-to-valley optical path difference is 0.017 waves at a wavelength of 193.3 nanometers, and for the wavefront error at the extreme field, the maximum peak-to-valley optical path difference is 0.029 waves.

Table 8 shows the distortion for the nominal design, calculated based on centroid of the point spread function, and the telecentricity error in the Y direction at relative field heights of 0, 0.7, and 1.0. Distortion is the deviation of the image location from the ideal position. Distortion is preferably reduced or minimized in lithography systems, so that features printed on one layer of an integrated circuit are precisely registered with the other layers which are potentially fabricated using a different lithography tool. Because the distortion must be controlled even when the object and image are not perfectly focused, the cones of light must be normal to the object and image. Otherwise, the image centroids will deviate depending on the focus position (i.e. focus dependent distortion). Deviations from normal incidence of the image cones are known as telecentricity errors.

TABLE 8

| Relative Field Height | X PSF Centroid Distortion (nm) | Y PSF Centroid Distortion (nm) | Y Telecentricity Error (mrad) |
|---|---|---|---|
| 0.0 | 0.00 | 0.00 | 0.00 |
| 0.7 | 0.00 | 7.70 | 0.11 |
| 1.0 | 0.00 | 10.70 | 0.51 |

When each of the optical elements L1–L28 in the lens 400 depicted in FIG. 32 comprises cubic crystalline material exhibiting intrinsic birefringence in FIG. 32, the optical performance degrades significantly. FIGS. 34A and 34B show the net retardance across the system exit pupil for field points at the center and edge of the field (at object field heights of 0 and 55 mm) according to an exemplary embodiment in which all elements L1–L28 comprise cubic crystal substantially identically aligned in three dimensions, with the [110] crystal axis directed along optical axis 402. In these plots, the retardance orientation rotates by 90 degrees at one-half-wave (π radians or 90°) intervals, i.e., the effect of a 0.75 wave retarder at 0 degrees is the same as a 0.25 wave retarder at 90 degrees. Thus, the peak retardance due to intrinsic birefringence in this example is approximately 2.1 waves at a wavelength of 193.3 nanometers.

Figure 35A:
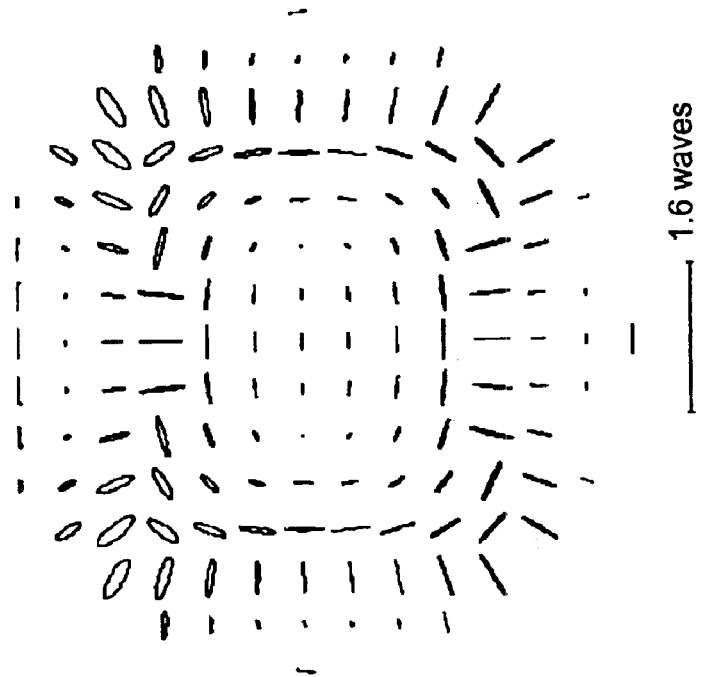
FIGS. 35A and 35B are graphical illustrations showing net retardance across the pupil for the exemplary lens depicted in FIG. 32 at central and extreme field points, respectively, in which all elements are cubic crystals with crystal axes substantially identically aligned in three dimensions, with the optical axis extending generally along the [101] crystal lattice direction computed for a peak birefringence magnitude corresponding to that of calcium fluoride at a wavelength of 157 nm.
Figure 35B:
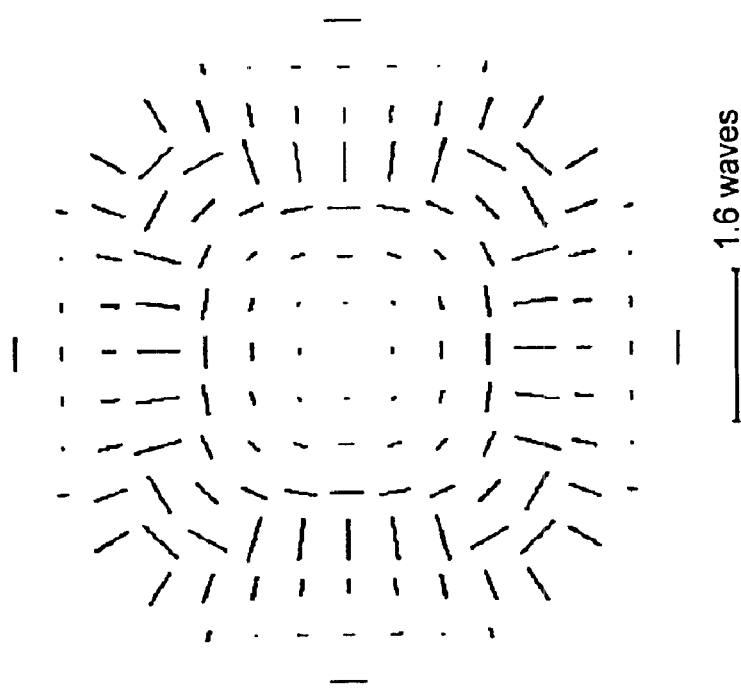

FIGS. 35A and 35B show the net retardance across the system exit pupil for field points at the center and edge of the field 404, respectively, according to another exemplary arrangement in which all elements are identically aligned in three dimensions, with the elements' L1–L28 [100] crystal axes direction parallel to optical axis 402. Again, the retardance orientation rotates by 90 degrees at one-half-wave intervals; thus, the peak retardance due to intrinsic birefringence in this example is approximately 1.5 waves at a wavelength of 193.3 nanometers.

Figure 36B:
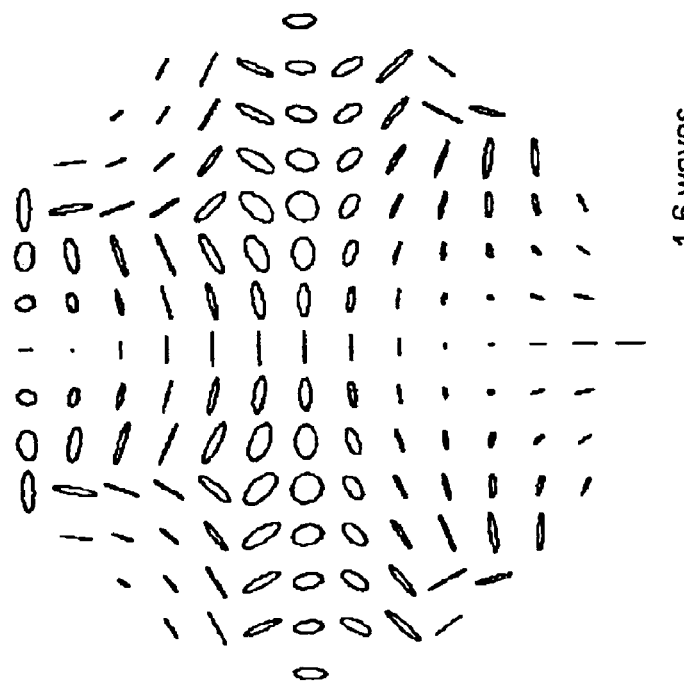
FIGS. 36A and 36B are graphical illustrations showing net retardance across the pupil for the exemplary lens depicted in FIG. 32 at central and extreme field points, respectively, in which all elements are cubic crystals with crystal axes substantially identically aligned in three dimensions, with the optical axis extending generally along the [111] crystal lattice direction computed for a peak birefringence magnitude corresponding to that of calcium fluoride at a wavelength of 157 nm.
Figure 36A:
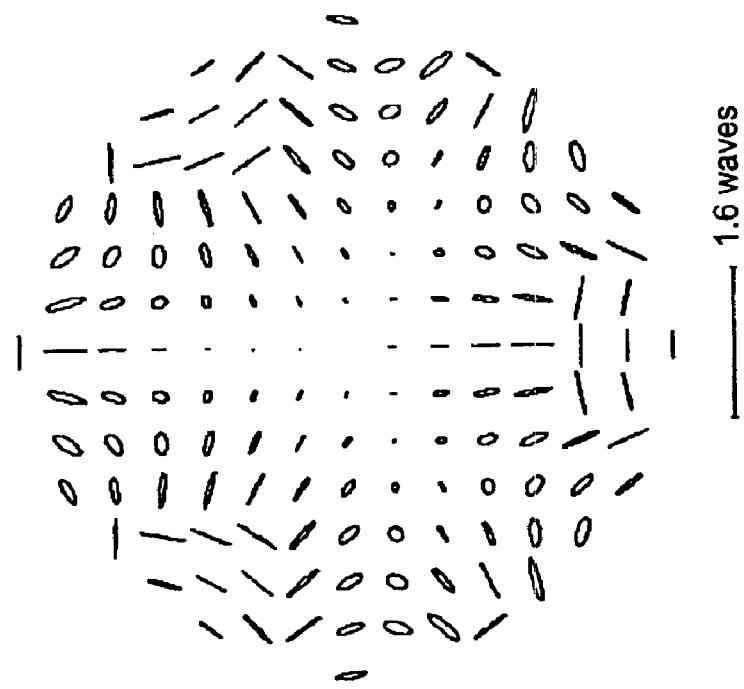

FIGS. 36A and 36B show the net retardance across the system exit pupil for field points at the center and edge of the field 404, respectively, according to another exemplary arrangement in which all elements are aligned identically in three dimensions, with the respective [111] crystal axes of the different optical elements directed along optical axis 402. In this exemplary arrangement, the peak retardance due to intrinsic birefringence is approximately 0.8 waves at a wavelength of 193.3 nanometers.

With the crystal axes of each of the optical elements L1–L28 oriented identically in three dimensions, the retardance produced by intrinsic birefringence produces large wavefront aberration. Without compensation, this aberration strongly exceeds the desirable wavefront error required for photolithography processes, particularly for photolithography processes used to produce the small feature sizes in today's semiconductor manufacturing industry.

Figure 37:
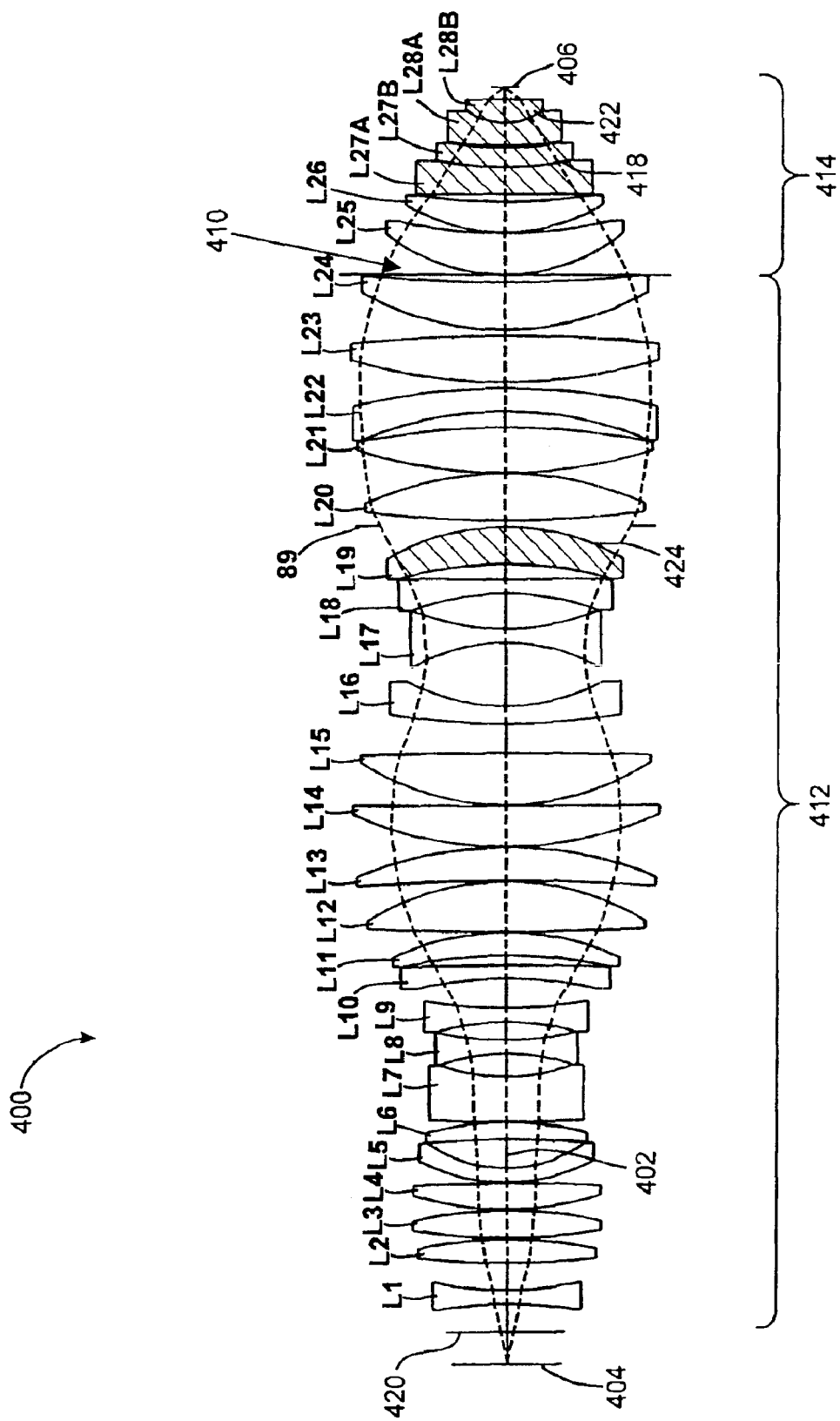
FIG. 37 is a schematic illustration showing the exemplary lens depicted in FIG. 32, in which all the refractive optical elements comprise cubic crystalline material with crystal axes substantially identically aligned in three dimensions, with the optical axis extending along the [110] crystal lattice direction, comprising −90° and 90° polarization rotators with the two elements closest to the wafer derived by splitting a single optical element, and having a toroidal surface.

To reduce retardance aberration at least one polarization converter 410 in inserted in the optical system 400 as illustrated in FIG. 37. The polarization converter 410 comprises a 90° polarization rotator, which is placed in the optical system 400 thereby dividing the system into first and second (front and rear) groups 412 and 414. The net retardance produced by the cubic crystalline elements in the front group 412 is preferably substantially similar in magnitude and variation with pupil and field position to the net retardance produced by the rear group 414. The location of the polarization rotator 410 is so chosen such that the retardance introduced by the second group 414 may compensate of the retardance produced by intrinsic birefringence.

In addition to the 90° polarization rotator 410, a −90° polarization rotator 420 is added to the lens 400 in between the object plane 404 and the first lens element L1 to balance the circular retardance produced by the 90° rotator 410. The addition of this second polarization converter 420 in the lens model is a computational aid for calculating the differences in retardance from 90 degrees. With the second rotator, the designer may reduce the magnitude of the retardance to zero. Without the second rotator, the designer would monitor the magnitude and shape of the retardance and adjust the design, for example, so that the magnitude and shape of the retardance are substantially constant across the pupil. This latter merit function would have twice as many terms and would take longer to compute and optimize.

To minimize variation in retardance with field, each optical element L1–L28B is oriented with its [110] crystal lattice direction substantially parallel with the system optical axis 402, such that the peak birefringence node is along the optical axis 402 and the outer peak birefringence lobes are at an angle of 60° with respect to the optical axis 402.

Furthermore, in the lens 400 illustrated in FIG. 37, two of the lens elements L27A and L27B, which were combined in one element L27 in the exemplary lens system of FIG. 32 have each been split into two that have the same total thickness and power. Also, two of the lens elements L28A and L28B, which were combined in one element L28 in the lens system of FIG. 32 have each been split into two that have the same total thickness and power. These lenses are marked by cross-hatching in FIGS. 32 and 37. The thicknesses for the sets of segments L27A, L27B and L28A, L28B as well as the curvature of the respective buried surfaces 418 and 422 between them is optimized to minimize the net system retardance. These additional degrees of freedom are shown to improve the achievable retardance compensation without requiring redesign of the lens 400.

A toroidal surface 424 is also provided on one of the optical elements L19, identified by cross-hatching, to compensate residual astigmatism due to variations in average index of refraction. Another effect produced by intrinsic birefringence in the cubic crystal lattice is variation of the average index of refraction as a function of ray angle through the crystal. In addition to compensating for retardance errors resulting from intrinsic birefringence, residual wavefront aberrations resulting from the variations in average index of refraction can be corrected. If uncorrected, this variation in average index of refraction may produce astigmatism in the wavefront. As such, the optical design includes this toroidal surface 424 to compensate for the effects of variations in average index of refraction. This toroidal surface 424 has a radii of curvature of −218.60371 mm along the local Y direction and −218.603789 mm along the local X direction.

These techniques may be applied to allow the retardance contributions of the elements L1–L24 preceding the 90° polarization rotator 410 to substantially balance the net retardance of the elements L25–L28B following the 90° rotator 410 and provide an overall wavefront correction that is acceptable for high numerical aperture lithography systems.

Further improvement in retardance compensation can be achieved by optimizing the relative rotations of the lens elements L1–L28B about the optical axis 402. The process of rotating one or more of the optical element L1–L28B about the optical axis 402 is referred to as clocking and is discussed in U.S. patent application Ser. No. 10/071,375, filed Feb. 7, 2002, entitled "Correction of Birefringence in Cubic Crystalline Optical Systems" now U.S. Pat. No. 6,683,710 which is incorporated herein in its entirety by reference. This form of rotation of the optical element L1–L28B itself may be employed to reduce net retardance, as the birefringence axes across the pupil plane are reoriented so as to at least partially cancel out the retardance introduced by the different elements L1–L28.

In one embodiment, the lens elements L1–L28B have clockings given in Table 9. The clocking of each element is given relative to an orientation that produces peak birefringence along the optical axis 402 and that is oriented with the retardance axis substantially parallel to the X axis (horizontal, in the direction perpendicular to the specified field of view).

TABLE 9

| Element | Element Clocking (degrees) |
|---|---|
| L1 | 137.42 |
| L2 | −177.91 |
| L3 | −137.96 |
| L4 | −21.23 |
| L5 | 49.30 |
| L6 | 112.63 |
| L7 | −71.76 |
| L8 | 23.92 |
| L9 | 49.96 |
| L10 | 56.81 |
| L11 | 132.09 |
| L12 | −154.83 |
| L13 | −17.35 |
| L14 | 96.91 |
| L15 | 146.55 |
| L16 | 148.96 |
| L17 | −41.95 |
| L18 | −21.28 |
| L19 | 100.60 |
| L19, Surface 2 (Toroid) | 169.00 |
| L20 | 178.67 |
| L21 | −124.36 |
| L22 | −44.90 |
| L23 | 134.50 |
| L24 | 137.49 |
| L25 | −124.00 |
| L26 | 43.52 |
| L27A | 81.40 |
| L27B | 160.62 |
| L28A | −49.38 |
| L28B | 27.57 |

Accordingly, a given lens prescription can be improved by splitting at least one of the individual lens element (L27 or L28 in this case) into (i.e. replacing it with), two or more sub-elements L27A, L27B, and L28A, L28B. The sub-elements L27A, L27B, and L28A, L28B each include the same overall radius of curvature and include the same thickness so that the overall optical qualities of the original lens prescription are not adversely affected. For each individual element L27, L28 being replaced, the sub-elements L27A, L27B, and L28A, L28B are oriented to reduce net system retardance relative to the retardance correction achievable using the individual lens element L27, L28 which they combine to replace. Each of the sub-elements L27A, L27B, and L28A, L28B may be aligned with the same crystal axis along the optical axis 402, and the sub-elements L27A, L27B, and L28A, L28B may be clocked relative to each other. For example, each of the sub-elements may be a [110] or [100] optical element. In another exemplary embodiment, the sub-elements may include different crystal axes aligned along the optical axis, for example, a [100] optical element and a [110] optical element. Compensating [110] elements with [100] elements is disclosed in U.S. patent application Ser. No. 10/071,375, filed Feb. 7, 2002, entitled "Correction of Birefringence in Cubic Crystalline Optical Systems" now U.S. Pat. No. 6,683,710 which is hereby incorporated herein in its entirety by reference.

In one embodiment the optical element L27 of FIG. 32 is split into two [110] optical sub-components L27A and L27B of FIG. 37 and optical element L28 of FIG. 32 is split into two [110] optical sub-components L28A and L28B of FIG. 37 to provide fine adjustment of the compensation. The combined thickness of lens sub-elements L28A and L28B of FIG. 37 is substantially the same as the thickness of lens element L28 of FIG. 32. The thicknesses and radii of curvature of buried surfaces 418 and 422 provide control over the retardance aberrations at the center and edge of the pupil. Table 10 lists the clocking, radii of curvature and thicknesses of the optical sub-elements produced by splitting components L27 and L28.

TABLE 10

| Element | Element Clocking (degrees) | Front Radius of Curvature (mm) | Back Radius of Curvature (mm) | Thickness (mm) |
|---|---|---|---|---|
| L27A | 81.40 | −10831.21505 | 348.95732 | 29.677503 |
| L27B | 160.62 | 348.95732 | 322.39407 | 20.322497 |
| L28A | −49.38 | 399.72415 | 58.37955 | 24.114117 |
| L28B | 27.57 | 58.37955 | −1901.87993 | 25.885883 |

Figure 38B:
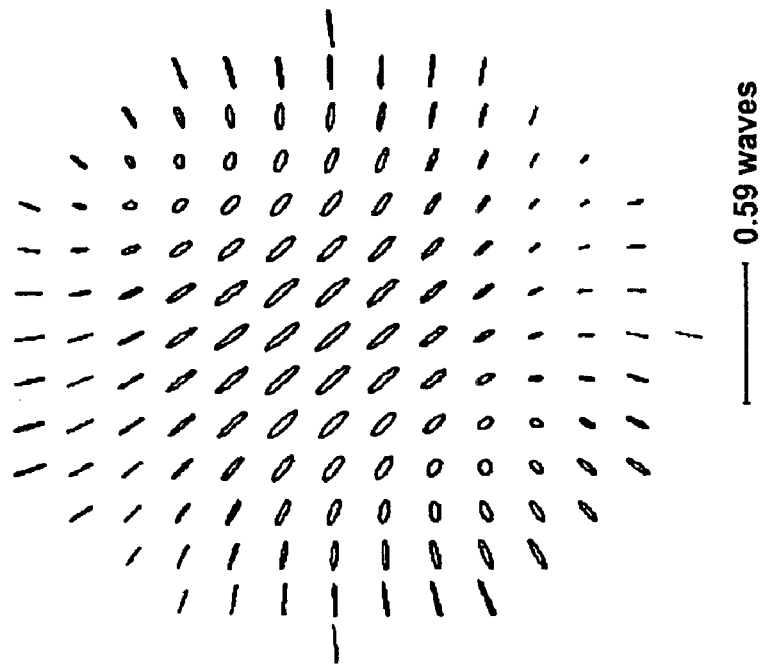
FIGS. 38A and 38B are graphical illustrations showing net retardance across the pupil for the central and extreme field points, respectively, for the optical elements between the −90° and 90° polarization rotators for the exemplary lens depicted in FIG. 37.
Figure 38A:
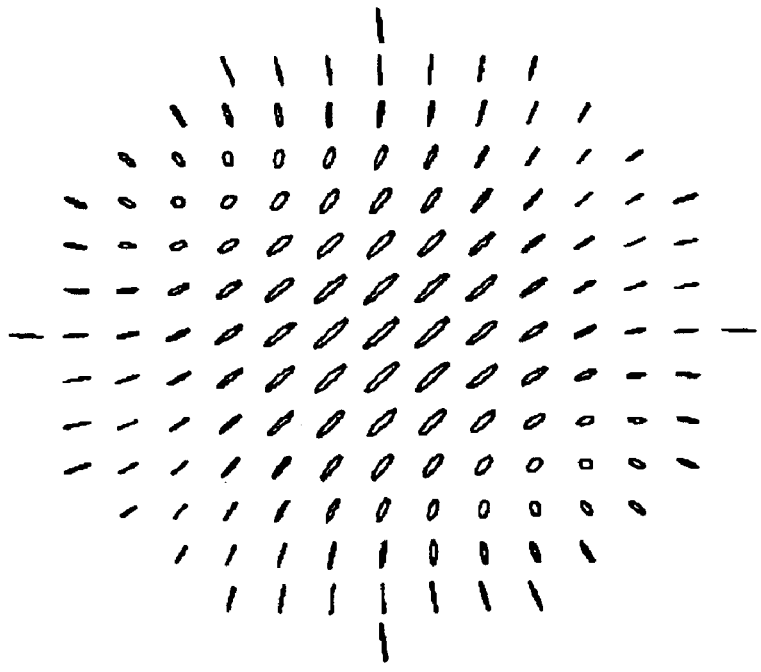

FIGS. 38A and 38B are graphical representations that depict the retardance across the system exit pupil for optical elements L1–L24 in the front group 412 of lens in the system 400, between the −90° and 90° rotators 410 and 420. The retardance is caused by the intrinsic birefringence and anti-reflection coatings. As previously shown in Table 6, the contribution due the coatings is relatively small; thus, the bulk of the retardance aberration is due to the intrinsic birefringence. FIG. 38A shows net retardance at the center field point and FIG. 38B shows net retardance at the edge field point. It can also be seen in FIGS. 38A and 38B that the retardance is substantially similar for the center and edge field points, showing that alignment of each element L1–L24 with its [110] crystal lattice direction along the optical axis 402 results in low sensitivity to angle of incidence variations resulting from changes in field height.

Figure 39A:
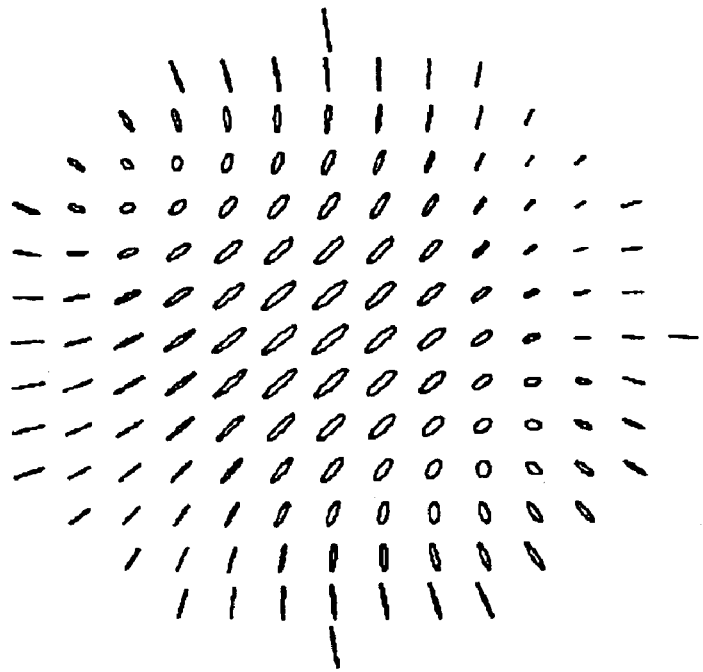
FIGS. 39A and 39B are graphical illustrations showing net retardance across the pupil at the central and extreme field points, respectively, for the optical elements between the 90° polarization rotator and the image plane for the exemplary lens depicted in FIG. 37.
Figure 39B:
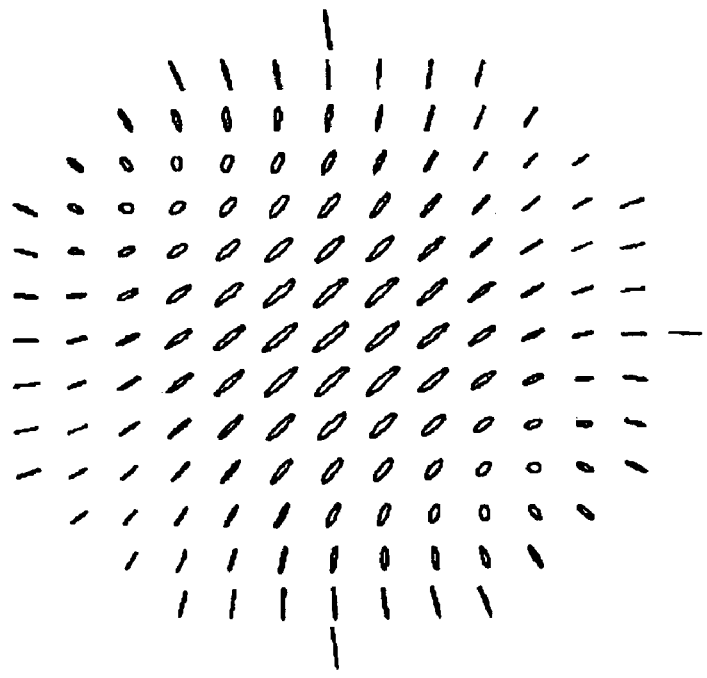

FIGS. 39A and 39B are graphical representations that depict the retardance across the system exit pupil for optical elements L25–L28B in the rear group 414 of the system 400, between the 90° rotator 410 and the image plane 406. FIG. 39A shows net retardance at the center field point and FIG. 29B shows net retardance at the edge field point.

Comparing FIGS. 38A, 39A, 38B, and 39B, the net retardance from the front group 412 of the system 400 is substantially similar to the net retardance from the rear group 414 of the system 400 across the pupil and at center and edge field points. Thus, because the 90° rotator 410 rotates each constituent polarization state by 90°, the retardance introduced by the rear group 414 of the 400 system will compensate the retardance introduced by the front group 412 of the system 400.

Figure 40B:
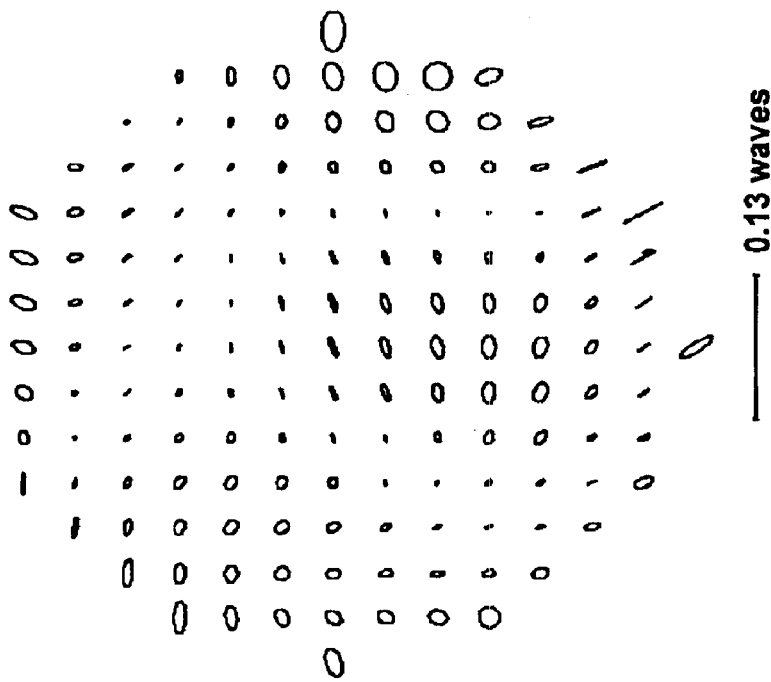
FIGS. 40A and 40B are graphical illustrations showing net retardance across the pupil for the central and extreme field points, respectively, for all elements and the 90° and −90° polarization rotators for the exemplary lens depicted in FIG. 37.
Figure 40A:
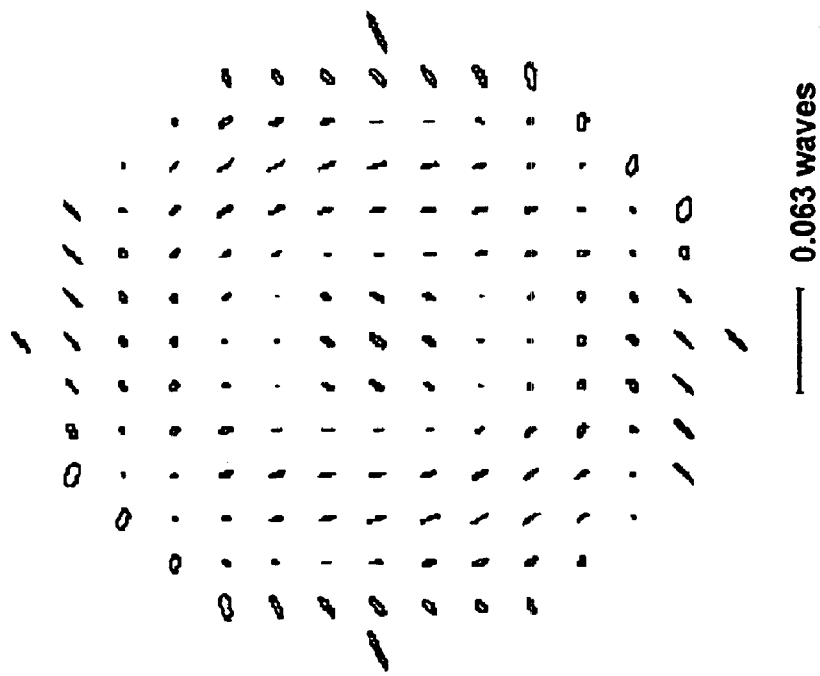

FIGS. 40A and 40B are graphical representations that depict the net retardance across the system exit pupil at central and edge field points due to intrinsic birefringence of all elements L1–L28B, including the 90° and –90° rotators 410 and 420. As shown, the net retardance has been significantly reduced at both fields compared with the retardance for all [110] elements without rotators 410 and 420 shown in FIGS. 34A and 34B.

The RMS and maximum retardance over the exit pupil are listed in Table 11 below for relative field heights of 0, 0.7, and 1.0. These include the effects of intrinsic birefringence and the single layer anti-reflection coatings used in the model. A relative field height of 0.0 corresponds to the center field point, for which the results are graphically in FIG. 40A, and a relative field height of 1.0 corresponds to the edge field point, the retardance contributions of which is shown graphically in FIG. 40B. The RMS retardance ranges from 0.0033 to 0.0065 waves at $\lambda_0$=193.3 nm.

TABLE 11

| Relative Field Height | Retardance (waves at $\lambda_o$ = 193.3 nm) | |
|---|---|---|
| | RMS | Maximum |
| 0.0 | 0.0033 | 0.0198 |
| 0.7 | 0.0044 | 0.0228 |
| 1.0 | 0.0065 | 0.0383 |

The retardance using all [110] elements without polarization converters 410 and 420 was shown in FIGS. 34A and 34B. With the two rotators 410 and 420, optimized clocking of the elements L1–L28B, and splitting of two elements L27 and L28, the maximum retardance was reduced from 2.12 waves to 0.0198 waves at $\lambda$=193.3 nm for the axial field (107× reduction) and a reduction in maximum retardance from 2.14 waves to 0.0383 waves at the extreme field (56× reduction).

The RMS and peak-to-valley wavefront error are listed in Table 12 for the compensated design that includes the effects of intrinsic birefringence. The wavefront errors are given for relative field heights of 0, 0.7, and 1.0 in the Y direction, and are listed for two orthogonal polarization components. The X component represents the wavefront error for an input polarization in the X direction assuming a linear polarizer along the X direction at the system exit pupil. The Y component represents the wavefront error for an input polarization in the Y direction assuming a linear polarizer along the Y direction at the exit pupil. An RMS wavefront error that varies from 0.010 to 0.014 waves across the field is achieved. The peak-to-valley wavefront error is reduced by a factor ranging from approximately 8 to 22, in exemplary lenses in which all elements are [110], [100], or [111] optical elements oriented substantially identically. Thus, this embodiment demonstrates that intrinsic birefringence effects can be reduced to a level acceptable for high numerical aperture lithography.

TABLE 12

| | RMS Wavefront Error (waves at $\lambda_o$ = 193.3 nm) | | Peak-to-Valley Wavefront Error (waves at $\lambda_o$ = 193.3 nm) | |
|---|---|---|---|---|
| Relative Field Height | X Component | Y Component | X Component | Y Component |
| 0.0 | 0.010 | 0.010 | 0.056 | 0.050 |
| 0.7 | 0.011 | 0.013 | 0.079 | 0.077 |
| 1.0 | 0.011 | 0.014 | 0.097 | 0.088 |

Figure 41B:
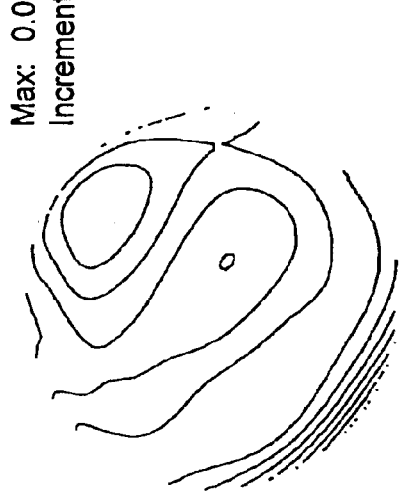
FIGS. 41A, 41B, 41C, and 41D are contour plots showing the residual wavefront error for the exemplary lens depicted in FIG. 37.
Figure 41D:
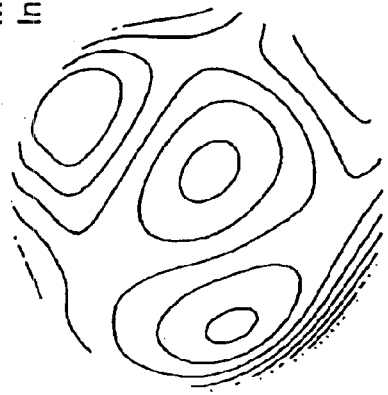
Figure 41A:
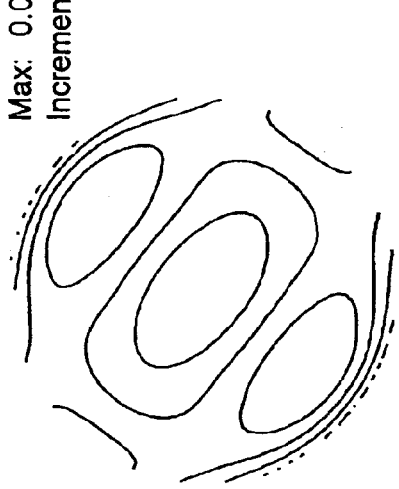
Figure 41C:
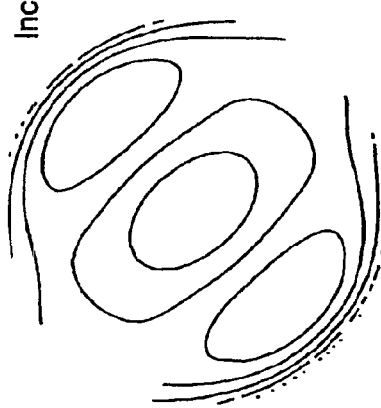

In FIGS. 41A, 41B, 41C, and 41D, wavefront errors are plotted at the system exit pupil as contour maps. FIGS. 41A and 41B show contour plots of the residual wavefront error for the lens 400 depicted in FIG. 37 corresponding to an input polarization in the X direction, perpendicular to the field height, used with an exit pupil analyzer in the X direction for the central and extreme field points, respectively. For the central field point, the maximum peak-to-valley optical path difference is 0.056 waves at a wavelength of 193.3 nanometers, and at the extreme field, the maximum peak-to-valley optical path difference is 0.097 waves. FIGS. 41C and 41D show contour plots of the residual wavefront error for the lens 400 depicted in FIG. 37 corresponding to an input polarization in the Y direction, parallel to the field height, used with an exit pupil analyzer in the Y direction for the central and extreme field points, respectively. For the central field point, the maximum peak-to-valley optical path difference is 0.050 waves at a wavelength of 193.3 nanometers, and at the extreme field, the maximum peak-to-valley optical path difference is 0.088 waves.

The centroid distortion for the compensated design with intrinsic birefringence, calculated based on the point spread function, and the telecentricity error in the Y direction are listed at relative field heights of 0, 0.7, and 1.0 in Table 13 below. As shown, there was an increase in maximum X distortion of about –0.3 nm and an increase in maximum Y distortion of 6.7 nm, compared with the distortion for the nominal design without intrinsic birefringence given in Table 8. Adjustment of some of the radii of curvature of the design allows these changes in distortion to be compensated and reduced. Changes in telecentricity error from the nominal design are negligible.

TABLE 13

| Relative Field Height | X PSF Centroid Distortion (nm) | Y PSF Centroid Distortion (nm) | Y Telecentricity Error (mrad) |
|---|---|---|---|
| 0.0 | 0.00 | 0.00 | 0.00 |
| 0.7 | –0.28 | 10.63 | 0.11 |
| 1.0 | 0.22 | 17.39 | 0.51 |

Although lens 400 depicted in FIG. 37 included thirty refractive optical elements L1–L28B, other embodiments may comprise more or less optical elements which may be reflective, diffractive, and/or refractive. Similarly, the optical elements may have spherical or aspheric surfaces, may be powered or unpowered, may be off-axis or on axis. Other optically transmissive elements may include diffractive and holographic optical elements, plates, filters, mirrors, beamsplitters, windows, to name a few. Additionally, all the optical elements need not comprise the same material. These optical elements may be crystalline or non-crystalline such as amorphous glasses. In the case where at least some of the elements are crystalline, they do not need to all be the same crystal orientation. For example, various combinations of cubic crystal optical element having a [111], [100], and/or [110] crystal direction may be suitable employed.

EXAMPLE 5

Figure 42:
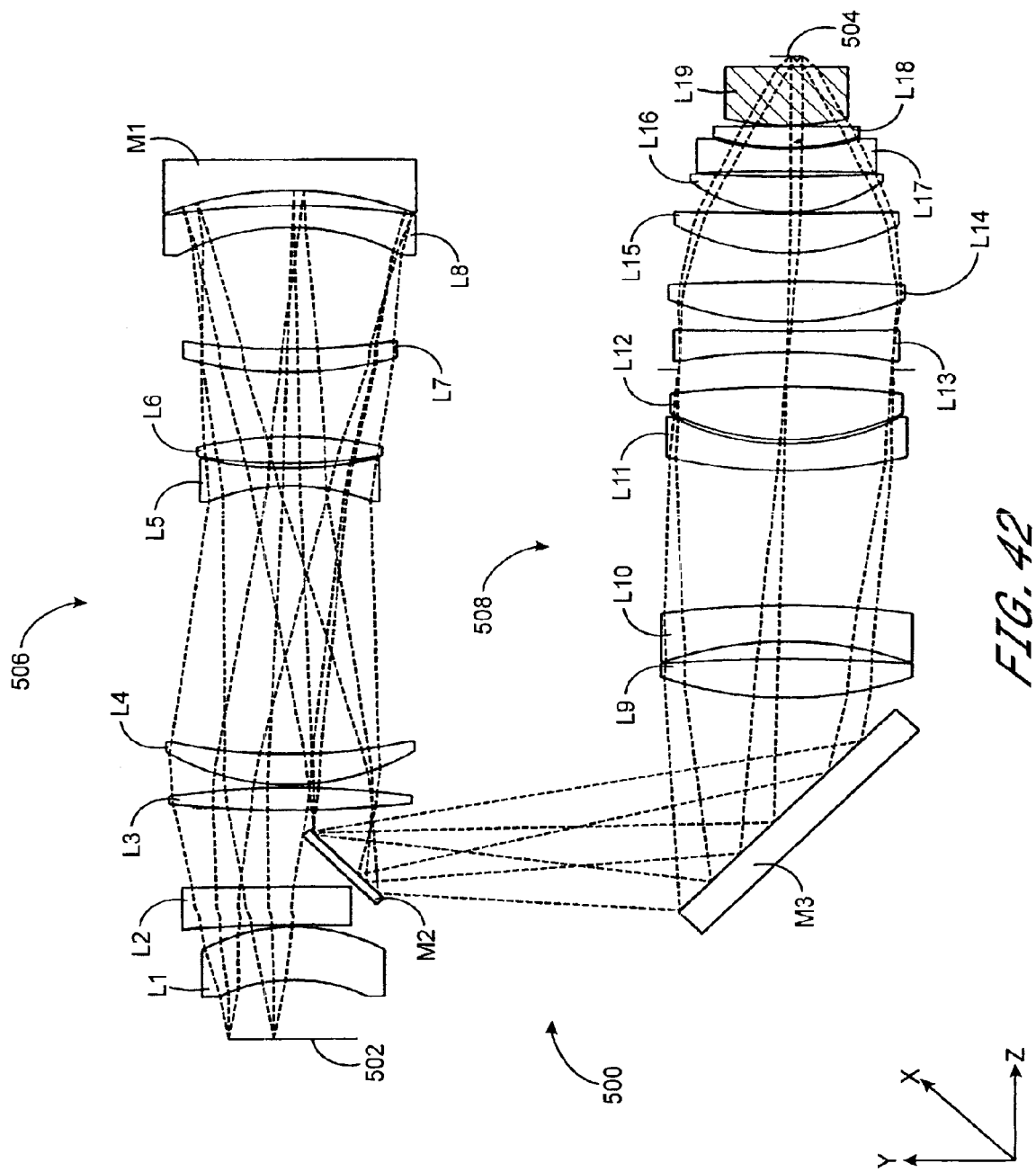
FIG. 42 is a schematic illustration showing an exemplary large format catadioptric projection lens comprising nineteen powered refractive optical elements and one powered reflective optical element.

A catadioptric optical system 500, which has both refractive and reflective optical elements L1–L19 and M1–M3, such as depicted in FIG. 42, can be used as a projection lens for photolithography. Such an exemplary lens 500 is disclosed in U.S. Pat. No. 6,195,213 by Y. Ohmura, the contents of which are hereby incorporated herein by reference. This system 500 includes an object field 502, and image field 504, and multiple optical axes. The system 500 is separated into two arms 506 and 508, the first arm 506 including a portion of the lens elements, L1–L8, as well as the first mirror M1 substantially aligned along a first optical axis. The second arm 508 includes the remainder of the lens elements L9–L19 substantially aligned along a second optical axis. The two arms are optically connected via planar folding mirrors M2 and M3. The system 500 advantageously operates at a central wavelength of $\lambda_0$=193.3 nm and at a numerical aperture of 0.75 and provides 4x reduction. The image field 504 is 34.25 mm in diameter, but the fold mirror M2 at an intermediate image partially obscures the beam, giving an image field 504 that extends from a height of 5 mm to 17.125 mm with respect to second optical axis in the plane of the folded beam. All lens elements L1–L19 are constructed from fused silica in the design shown by Y. Ohmura in U.S. Pat. No. 6,195,213, but may comprise cubic crystal material and in particular cubic crystal calcium fluoride. For the purpose of calculation, the results of which are provided below, each transmissive optical component is assumed to have an intrinsic birefringence of $-12 \times 10^{-7}$. According to other exemplary embodiments, however, some of the lens elements L1–L19 may be formed of non-cubic crystalline material or additional lens elements or other optically transmissive components formed of non-cubic crystalline material may be used. Various suitable non-cubic crystalline materials such as dry fused silica may be employed for operation in the ultraviolet.

The RMS and maximum retardance and diattenuation over the exit pupil are listed in Table 14 below for the nominal design without intrinsic birefringence effects included for image field heights of 5, 11, and 17.125 mm. The retardance and diattenuation result from the single-layer anti-reflection coatings used in the model. The retardance varies radially outward and is largest in magnitude at the edge of the pupil. The retardance due only to the anti-reflective coating is relatively small.

TABLE 14

| Image Field | Retardance (waves at $\lambda_0$ = 193.3 nm) | | Diattenuation | |
|---|---|---|---|---|
| Height (mm) | RMS | Maximum | RMS | Maximum |
| 5 | 0.0039 | 0.0146 | 0.0054 | 0.0225 |
| 11 | 0.0039 | 0.0156 | 0.0054 | 0.0240 |
| 17.125 | 0.0040 | 0.0176 | 0.0056 | 0.0268 |

Figure 43B:
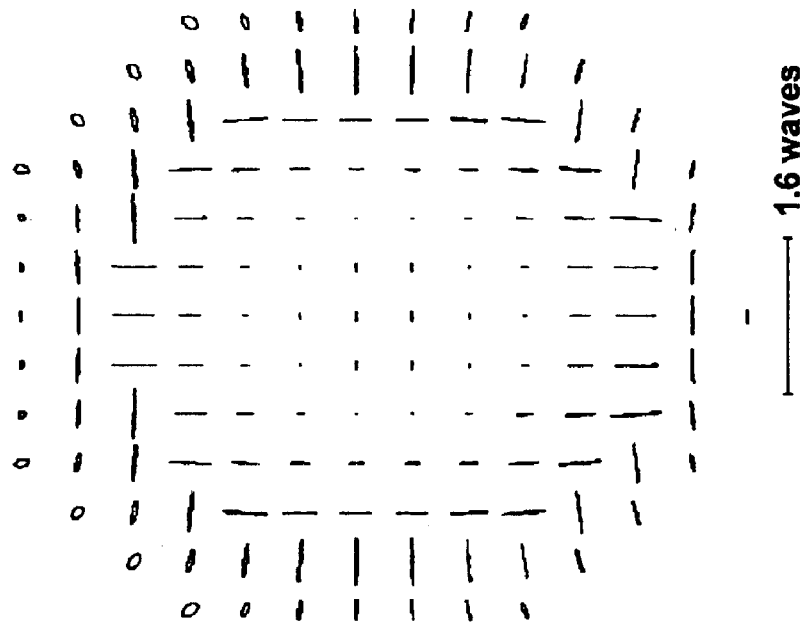
FIGS. 43A and 43B are graphical illustrations' showing net retardance across the pupil for the exemplary lens depicted in FIG. 42 for central and extreme field points, respectively, in which the nineteen powered refractive optical elements comprise cubic crystals with crystal axes substantially identically aligned in three dimensions, with the optical axis extending generally along the [110] crystal lattice direction computed for a peak birefringence magnitude corresponding to that of calcium fluoride at a wavelength of 157 nm.
Figure 43A:
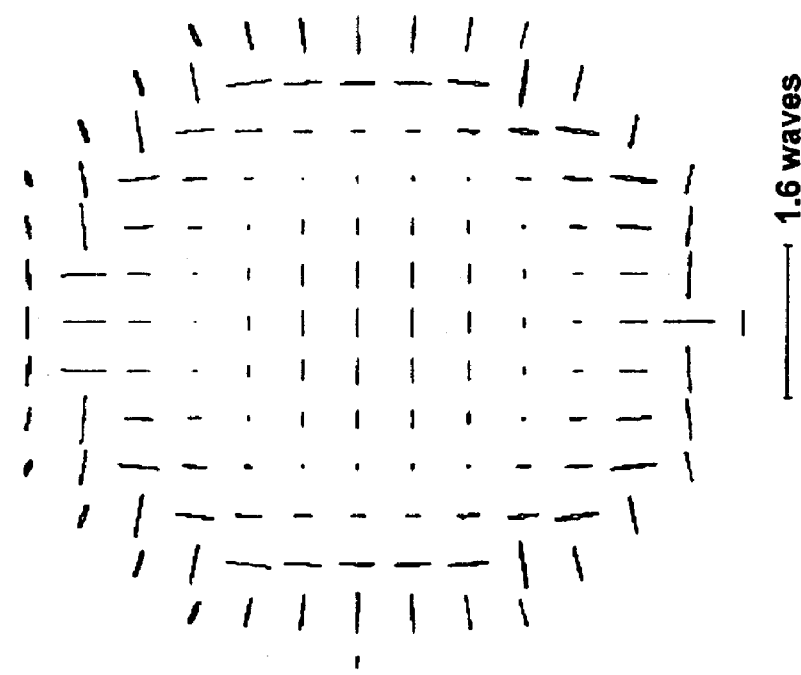

When the effects of intrinsic birefringence associated with the cubic crystalline lens material are taken into account, system performance degrades significantly. FIGS. 43A and 43B are graphical illustrations showing the net retardance across the system exit pupil for image field points of 5 and 17.125 mm, respectively, according to the exemplary embodiment in which all refractive lens elements L1–L19, shown in FIG. 42, have crystal axes that are identically aligned in three dimensions, with the elements L1–L19 having their [110] crystal axis along the respective optical axis for the particular lens elements L1–L19. FIGS. 43A and 43B include the effects of intrinsic birefringence. In the retardance pupil maps given in FIGS. 43A and 43B, and in others to follow in which the net retardance exceeds a magnitude of 0.5 waves, the retardance is plotted "modulo 1 wave." It can therefore be seen that the retardance orientation rotates by 90 degrees at one-half-wave intervals, i.e., the effect of a 0.75 wave retarder at 0 degrees is the same as a 0.25 wave retarder at 90 degrees. Thus, the peak retardance due to intrinsic birefringence in this exemplary arrangement is approximately 0.8 waves at a wavelength of 193.3 nanometers at image heights of 5 mm and 17.125 mm.

Figure 44B:
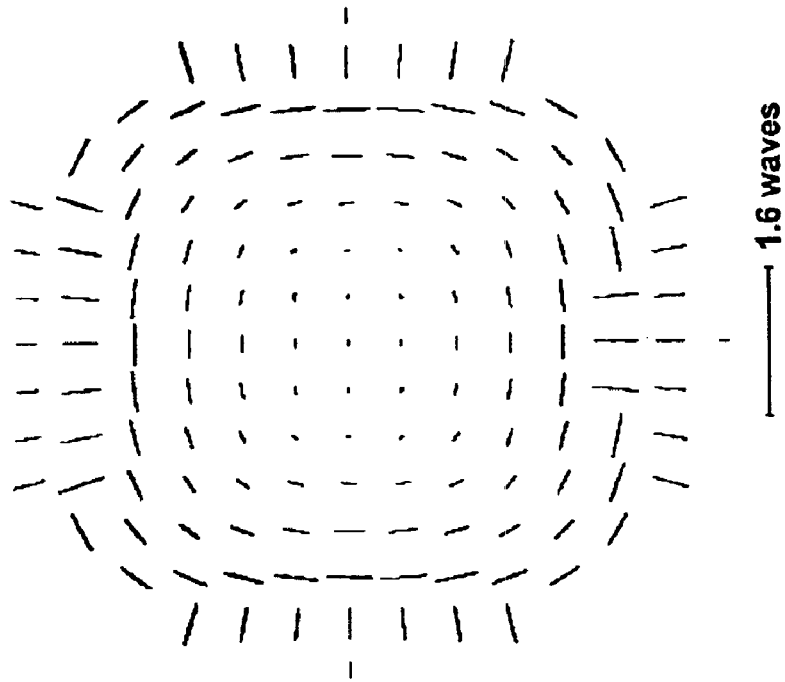
FIGS. 44A and 44B are graphical illustrations showing net retardance across the pupil for the exemplary lens depicted in FIG. 42 for central and extreme field points, respectively, in which the nineteen powered refractive optical elements comprise cubic crystals with crystal axes substantially identically aligned in three dimensions, with the optical axis extending along the [100] crystal lattice direction computed for a peak birefringence magnitude corresponding to that of calcium fluoride at a wavelength of 157 nm.
Figure 44A:
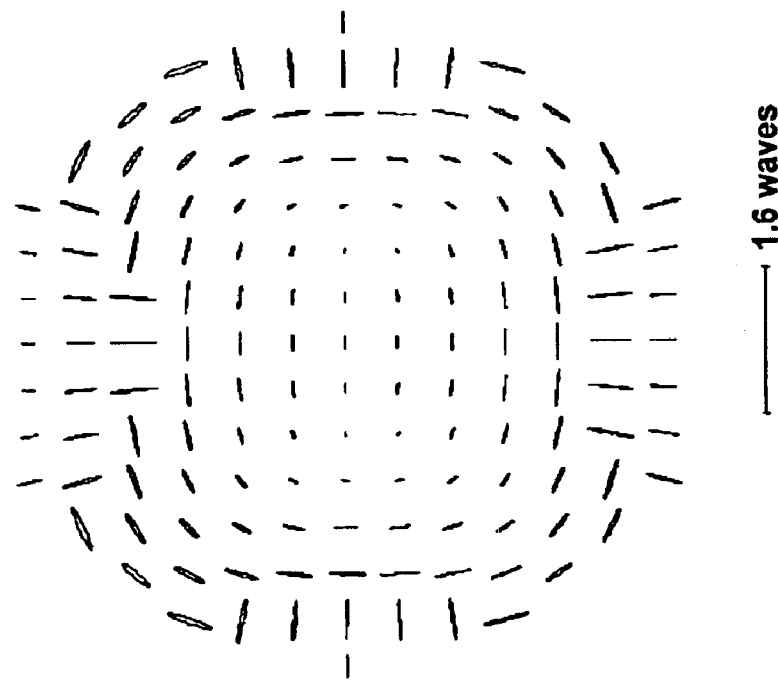

FIGS. 44A and 44B are graphical illustrations of the retardance of another exemplary embodiment of crystal lattice orientation of the lens system 500 shown in FIG. 42. In FIGS. 44A and 44B, the net retardance across the system exit pupil, including the effects of intrinsic birefringence, is depicted for field points at the center and edge of the field with all elements L1–L19 having crystal axes aligned identically in three dimensions, with their [100] crystal axes along the respective optical axis for the particular lens element L1–L19. Again, the retardance orientation rotates by 90 degrees at one-half-wave intervals; thus, the peak retardance due to intrinsic birefringence is approximately 1.4 waves at a wavelength of 193.3 nanometers at an image height of 5 mm and 1.2 waves at the extreme field, if the retardance were not plotted "modulo 1 wave"

Figures 45A, 45B:
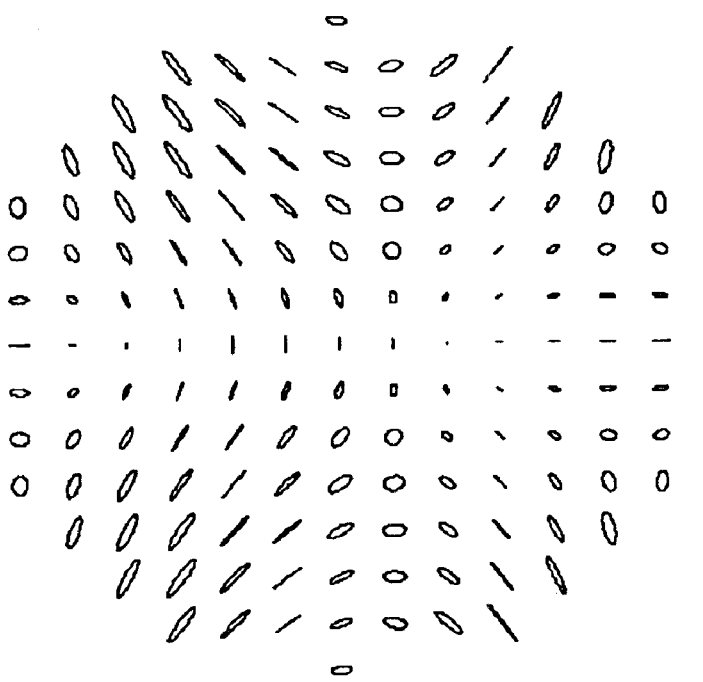
FIGS. 45A and 45B are graphical illustrations showing net retardance across the pupil for the exemplary lens depicted in FIG. 42 for central and extreme field points, respectively, in which the nineteen powered refractive optical elements comprise cubic crystals with crystal axes substantially identically aligned in three dimensions, with the optical axis extending along the [111] crystal lattice direction computed for a peak birefringence magnitude corresponding to that of calcium fluoride at a wavelength of 157 nm.

FIGS. 45A and 45B are graphical illustrations of the retardance of another exemplary embodiment of crystal lattice orientation of the lens system 500 shown in FIG. 42. In FIGS. 45A and 45B, the net retardance across the system exit pupil is depicted for field points at the center and edge of the field with all elements L1–L19 having crystal axes aligned identically in three dimensions, for [111] optical elements having the [111] crystal direction substantially parallel to the optical axis for the particular lens element L1–L19. The peak retardance due to intrinsic birefringence is approximately 0.5 waves at a wavelength of 193.3 nanometers at image heights of 5 mm and 17.125 mm.

These cubic crystal elements are described as [111] optical elements based on the direction of the crystal axis at the optical axis. Since many of the rays in the beam propagating through the optical system are clustered around the optical axis, many of the rays will be nearly parallel to the crystal axis. Because of the symmetry of the lens design, the element optical axis corresponds to the system optical axis.

Each of three preceding examples, as illustrated in FIGS. 43A–45B, shows that the intrinsic birefringence produces large retardance aberrations and consequently large wavefront aberrations, when each of the crystal elements are oriented identically with respect to the respective optical axis. Without compensation, this aberration strongly exceeds the allowable wavefront error for high precision photolithography.

To correct this wavefront aberration, two polarization rotators 510 and 520 are added to the optical system 500 to reduce the retardance produced by the intrinsic birefringence of the refractive optical elements L1–L19 as shown in FIG. 46. All these refractive optical elements L1–L19 are oriented in this embodiment with identical three-dimensional crystal lattice directions, and are [111] elements. The [111] crystal lattice direction for each element L1–19 is along the system optical axis.

Choosing as many cubic crystalline elements with their respective [111] crystal lattice directions along the system optical axis is particularly advantageous for construction of optical systems. High purity cubic crystals, such as $CaF_2$ crystals for VUV optical lithography systems, naturally cleave along the (111) plane, and single crystals are more easily grown along the [111] direction. As a result, lens blanks for construction of [111] optical elements are typically less expensive and more easily available than lens blanks oriented along other lattice directions. Furthermore, the stress optic coefficient is lower along the [111] direction than along the [100] or [110] directions, reducing image degradation resulting from mount-induced stress. Accordingly, an example of this preferred arrangement is presented, in which all powered cubic crystalline elements comprise [111] refractive optical element are oriented with their respective [111] crystal axes along the optical axis.

Alternate embodiments, however, may include optical components comprising other cubic crystal material having their crystal axes oriented differently. The lens may for example include one or more [100] and/or [110] optical elements with the respective [100] and [110] lattice directions substantially parallel to the optical axis 540. Such lens elements, appropriately clocked, can be included to compensate for retardance produced, for example, by [111] optical elements as discussed in U.S. patent application Ser. No. 10/071,375, filed Feb. 7, 2002, entitled "Correction of Birefringence in Cubic Crystalline Optical Systems" now U.S. Pat. No. 6,683,710, which is incorporated herein in its entirety by reference. Preferably, however, the majority or more preferably a substantial majority of the cubic crystal optical elements through which the beam passes in the optical system comprise [111] optical elements. For example, 70, 80, 90, percent or more of the cubic crystalline optical elements in the path of the beam in the optical system 500 preferably comprise [111] cubic crystal optics. These percentages may apply to just the cubic crystal lens elements or may many include both lens elements as well as other optical elements, such as, e.g., waveplates. Alternatively, the percentage, by weight, of [111] cubic crystal of all the cubic crystal material in the optical path of the lens 500 is preferably more than 50%, more preferably at least about 80% and most preferably 90% or more. This percentage may include only powered refractive optical elements as well as powered and non-powered optical elements such as waveplates, windows, etc. For example, 90% of net weight of the cubic crystal lens may comprise cubic crystal having a [111] axis oriented along the optic axis. In another example, 80% of the net weight of the cubic crystal optics, including the waveplates that form the polarization rotators, may be [111] cubic crystal, with the [111] axis parallel to the optic axis. The cost of materials for such a system is significantly reduced in comparison with optical systems that employ more [110] or [100] crystal material. The use of the polarization converter in reducing the retardance aberration enables such a large percentage by weight of [111] crystal material to be used without unduly degrading the optical performance of the system. In other embodiments, some of the lens elements or other optical elements may be formed of non-cubic crystalline material or additional lens and/or optical elements formed of non-cubic crystalline material may be used. Various suitable non-cubic crystalline materials such as dry fused silica may offer other lower cost alternatives.

As discussed above, however, all the refractive optical elements L1–L19 in the lens 500 shown in FIG. 46, comprise [111] cubic crystal with the [111] crystal direction parallel to the optical axis. The 90° rotator. 510 is positioned between the sixteenth and seventeenth lens elements L16 and L17 to reduce the net system retardance. The −90° rotator 520 is located between the object plane 502 and the first element L1. For purposes of calculations, the rotators 510 and 520 are assumed to be ideal polarization rotators, such that each constituent polarization state is rotated by exactly 90 or −90°. Additionally, the polarization rotators 510 and 520 are assumed to have zero thickness. As discussed above, the lens prescription may be adjusted and optimized for finite thickness rotators 310 and 320 as well.

As discussed above, the 90° polarization rotator 510 splits the lens 500 into two parts, a front and rear section of the lens 500. The location of the rotator 510 is chosen such that the net retardance produced by the cubic crystalline elements L1–L16 in the front part of the system 500 is similar in magnitude and orientation as a function of field and pupil position to the net retardance produced by the cubic crystalline elements L17–L19B in the rear part of the system 500. The rotator 510 allows the retardance contributions of the individual elements L1–L19B to be balanced to provide wavefront correction and reduce the net retardance produced by the intrinsic birefringence to a level that is acceptable for the particular application, e.g., for high numerical aperture lithography systems.

With this design, the system will have a uniform circular retardance of 90 degrees and the input will experience reduced wavefront aberrations, although the polarization state will be rotated by 90 degrees between the object (reticle) and image (wafer) planes, because of the introduction of 90 degrees of circular retardance. In order to evaluate the magnitude of the deviation of the retardance from 90 degrees, a perfect circular retarder 520 of −90 degrees (i.e., a −90 degree rotator) has been inserted between the object and first lens element. The second rotator cancels out the nearly constant 90 degrees of circular retardance introduced by the first rotator, leaving only the small residual retardance aberrations. This second rotator 520 is used in this example as a computational aid and may or may not be included in a particular optical system, unless the input and output polarizations need to be identical (which is not usually the case). It is much easier to visualize small retardance variation with the large constant 90 degree circular retardance removed. The second rotator also simplifies the construction of the optimization merit function as it only has to include the magnitude of the retardance and not the shape of the retardance. Insertion of the second rotator 520 into the lens model also facilitates optimization of the system 500 by allowing the designer to reduce the magnitude of the deviation of the retardance from 90 degrees. However, an additional rotator 520 would introduce further complexity and cost to the optical system 500.

The optical axis in each of the arms 506 and 508 are substantially along the Z direction, the field is oriented in the Y direction, and a right-handed coordinate system is used; thus, a 90° rotation about the optical axis represent a rotation of the X axis towards the Y axis. The order of the rotators 510 and 520 may be switched without changing the performance, such that the 90° rotator 510 is used in object space, and the −90° rotator 520 is used between the sixteenth and seventeenth lens L16 and L17. Also, the rotator 520 in object space may, in principle, be alternatively used in image space (between last element L19B and image plane 504).

As disussed above, the lens elements L1–L19B in an optical system 500 can be rotated about the optical axis, herein termed clocking, to reduce retardance. The birefringence contributions across the lens pupil are repositioned and potentially reoriented such that the birefringence of two or more lenses compensate and offset each other. In one preferred embodiment, for example, the lens elements L1–L19B in the lens 500 of FIG. 46 have clockings given in Table 15. The clocking of each element L1–L19B is given relative to an orientation that produces peak birefringence along the optical axis that is oriented with the retardance axis substantially parallel to the X-axis (horizontal, in the direction perpendicular to the specified field of view).

TABLE 15

| Element | Element Clocking (degrees) |
|---|---|
| 1 | 325.71 |
| 2 | 7.06 |
| 3 | 143.41 |
| 4 | 76.83 |
| 5 | 230.04 |
| 6 | 113.19 |
| 7 | −2.21 |
| 8 | 56.48 |
| 9 | 208.29 |
| 10 | 170.00 |
| 11 | −9.41 |
| 12 | 379.75 |
| 13 | −14.21 |
| 14 | 95.43 |
| 15 | 198.23 |
| 16 | 140.64 |
| 17 | 236.41 |
| 18 | 168.37 |
| 19 (19A) | 178.09 |
| 20 (19B) | 4.18 |

In addition, in one preferred embodiment, the last element L19 in FIG. 42 has been replaced by, i.e., split into, two sub-elements, L19A and L19B of FIG. 46 with buried surface 512 between them. These lens elements L19, L19A, and L19B, are cross-hatched in FIGS. 42 and 46. The sub-elements L19A and L19B each include the same overall outer radii of curvature. The sub-elements L19A and L19B are oriented (clocked) to reduce net system retardance relative to the retardance correction achievable using the element L19 which they combine to replace. Here, each of the sub-elements L19A and L19B has its [111] crystal axis parallel to the system optical axis, but the other crystal axes of the two elements L19A and L19B are rotated about the optical axis with respect to one another. The radius of curvature of buried surface 512 and the thicknesses of sub-elements L19A and L19B were optimized to minimize net retardance.

Here, the combined thickness of sub-elements L19A and L19B was allowed to vary relative to the thickness of element L19 in FIG. 42. The center thickness of element L19 was initially 65 mm, but the combined thickness of L19A and L19B was reduced to 45.5820 mm. Also, the thickness of element L1 in FIG. 42 was reduced in thickness from 59.9763 mm to 41.2024 mm. These changes to the nominal lens prescription introduce additional wavefront, not retardance aberrations, that may be corrected by means which are commonly practiced by those skilled in the art. The lens design has not been further modified to correct for the additional wavefront errors, so as to illustrate the correction of the retardance aberrations. Additionally, the current embodiment has not been reoptimized to correct for the changes in element thicknesses; therefore, this example shows reduction of net system retardance to an acceptable level for lithographic imaging.

Table 16 lists the radii of curvature and thicknesses optical sub-elements L19A and L19B produced by splitting component L19 in the design shown in FIG. 42.

TABLE 16

| Element | Element Clocking (degrees) | Front Radius of Curvature (mm) | Back Radius of Curvature (mm) | Thickness (mm) |
|---|---|---|---|---|
| 19 | 178.09 | −316.06140 | −218.78841 | −26.391552 |
| 20 | 364.18 | −218.78841 | 12272.48200 | −19.190442 |

FIGS. 47A and 47B are graphical representations that depict the retardance across the system exit pupil for optical elements L1–L16 in the front part of the system 500, between the −90° rotator 520 and the 90 rotator 510. FIG. 47A shows net retardance at an image height of 5 mm and FIG. 47B shows net retardance at an image height of 17.125 mm.

FIGS. 48A and 48B are graphical representations that depict the retardance across the system exit pupil for optical elements L19–L19B in the rear part of the system 500, between the 90° rotator 510 and the image plane 504. FIG. 48A shows net retardance at an image height of 5 mm and FIG. 48B shows net retardance at an image height of 17.125 mm.

Comparing FIGS. 47A, 48A, 47B, and 48B, the net retardance from the front part of the system 500 is similar to the net retardance from the rear part of the system 500 across the pupil and at image heights of 5 mm and 17.125 mm. Thus, because the 90° rotator 510 rotates each constituent polarization state by 90°, the retardance of the rear part of the system 500 will compensate the retardance of the front part of the system 500.

FIGS. 49A and 49B are graphical representations that depict the net retardance across the system exit pupil at central and edge field points due to intrinsic birefringence of all elements L1–L19B, 510, 520, including the 90° and −90° rotators 510, 520. As shown, the net retardance has been significantly reduced at both fields compared with the retardance for all [111] elements without rotators 510 and 520 shown in FIGS. 45A and 45B. Thus, substantial retardance correction for a system 500 comprising all [111] optical elements L1–L19, is possible, by using a polarization converter that transforms the polarization of the light within the optical system 500 into a polarization state rotated by 90°. In particular, the intrinsic birefringence effects and system retardance of this catadioptric optical system 500 are significantly reduced to levels acceptable for high numerical aperture lithography.

The RMS and maximum retardance over the exit pupil are listed in Table 17 below for image field heights of 5 mm, 11 mm, and 17.125 mm. These include the effects of intrinsic birefringence and the single layer anti-reflection coatings used in the model. The RMS retardance ranges from 0.0037 to 0.0059 waves at $\lambda_o$=193.3 nm.

TABLE 17

| | Retardance (waves at $\lambda_o$ = 193.3 nm) | |
|---|---|---|
| Relative Field Height | RMS | Maximum |
| 0.0 | 0.0043 | 0.0244 |
| 0.7 | 0.0037 | 0.0206 |
| 1.0 | 0.0059 | 0.0314 |

This catadioptric lens 500 of FIG. 46 has twenty (20) lens elements L1–L19B, six of which are used in double pass (L3–L8), each comprising [111] cubic crystal material with the [111] crystal axis parallel to the optical axis passing through the respective lens element. The catadiopric lens 500 further includes one powered mirror M1, and two fold mirrors M2, M3. The refractive optical elements L1–L19B are clocked, i.e., rotated about the optical axis passing therethrough to reduce retardance. The 90° polarization rotator 510, which divides the optical system 500 into two parts having similar net birefringence, causes the retardance introduced by the two parts to compensate for and offset each other. The −90° polarization rotator 520 in object space compensates for the constant retardance produced by the 90° rotator 510. The element L19 in FIG. 42 closest to the image plane is split into two [111] components L19A and L19B with different relative clockings, and the thicknesses of the components and radius of curvature of the buried surface 412 are optimized to minimize net retardance. The peak-to-valley retardance can thereby be improved by a factor ranging from 15.6× to 18.9×.

Other compensation techniques may be applied to reduce retardance. In an exemplary embodiment, one or more stress birefringent elements, wave plates, or combinations thereof may additionally be used to provide compenation and correct for residual birefringence variation and constant residual retardance which remains in the catadioptric system after the above-described system corrections have been made. Techniques disclosed in U.S. patent application Ser. No. 10/071,375, filed Feb. 7, 2002, entitled "Correction of Birefringence in Cubic Crystalline Optical Systems" now U.S. Pat. No. 6,683,710, which is incorporated herein in its entirety by reference may also be employed, One of these techniques includes, for example, adding [100] optical elements that are appropriately rotated with respect to the optical axis to provide compensation.

In addition, stress may be applied to a reflective element such as mirror surfaces M1, M2, or M3 to alter the base radius of curvature in orthogonal directions. This stress may correct for residual astigmatism in the catadioptric optical system. The use of at least one optical element whose base radius of curvature differs in orthogonal directions may additionally or alternatively be used to compensate for residual astigmatism. For example, residual astigmatism due to variations in the average index of refraction from [110] optical elements can be countered by varying the base radius of curvature of at least one surface of an optical element, in orthogonal directions. Residual trefoil wavefront aberrations due to variations in the average index of refraction in [111] optical elements can also be compensated by varying the shape, e.g., radius of curvature, of at least one surface of an optical element with an azimuthal angular dependence of $3\theta$ to reduce this aberration. If the optical axis is along the z-axis, the azimuthal angle, $\theta$, is in the x-y plane and measured from the x-axis. Quadrafoil wavefront aberrations due to variations in the average index of refraction from [100] crystals can likewise be countered. Compensation may be achieved by varying the shape of at least one optical element with an azimuthal angular dependence of $4\theta$.

Another example of a catadioptric systems that include beam splitters or wave plates, is described in U.S. Pat. No. 6,081,382 by Ohmura, et al, which is incorporated herein in its entirety by reference. The polarization aberrations in this system also may be corrected, for example, with the addition of at least one polarization rotator to divide the optical system into multiple groups, such as two groups with similar net retardance. In addition, relative clocking of the optical elements, the inclusion of various combinations of [111], [110], and [100] optical elements, stress-induced birefringent elements with radially varying stress, stress induced birefringent elements with stress varying along axes perpendicular to the optical axis, the optimization of lens element thicknesses, spacings, radii of curvature and aspheric coefficients can be used to decrease the affect of aberrations that degrade optical performance. Similarly, residual astigmatism, trefoil aberration, and quadrafoil aberration due to variations in the average index of refraction in [110], [111], and [100] cubic crystalline optical elements, can be reduced through the use of at least one optical element whose base radius of curvature varies as $2\theta$, $3\theta$, and $4\theta$.

Some of the preceding examples are based on lens prescriptions published in the prior art. These examples are intended to be exemplary only and the principles applied with reference to these examples can be extended to any of various other lens designs. However, application of techniques described above for reducing retardance aberration are of particular interest for high numerical aperture optical systems for photolithography at an exposure wavelength near 157 nm, such as that produced by an $F_2$ excimer laser. Because many of the available optical systems described in the art include lower numerical apertures and operate at longer wavelengths such as 193 nm, the techniques are illustrated by application to exemplary known optical systems designed for an exposure wavelength near 193 nm, corresponding to the wavelength produced by an ArF excimer laser, commonly used in photolithography. It should be understood, however, that these principles and techniques apply equally to high numerical aperture systems and systems operating at 157 nm.

Furthermore to estimate the effects of intrinsic birefringence in high numerical aperture lenses designed for a central wavelength of 157 nm, in which the refractive elements are primarily constructed from calcium fluoride, each element is assumed to have a peak intrinsic birefringence of $(n_e - n_o) = -12 \times 10^{-7}$, which is roughly equivalent to the measured peak intrinsic birefringence in calcium fluoride at a wavelength of 157 nm. In other embodiments, however, one or more of the optical elements may be constructed from other materials such as barium fluoride, lithium fluoride, strontium fluoride, and fused silica. In addition, optical elements comprising material exhibiting positive birefringence can be included to compensate for the effects of optical elements comprising material exhibiting negative birefringence.

In this manner, the method for compensation of intrinsic birefringence in similar high numerical aperture lenses designed for 157 nm may be demonstrated using known exemplary lens descriptions designed for a central wavelength of 193 nm as starting points. The change in central wavelength may result in a change in refractive index of the refractive components and may warrant the use of fluoride materials such as calcium fluoride, but the types of elements used and distributions of ray angles for a given numerical aperture are similar enough to allow a lens designed for a central wavelength of 193 nm to be used to demonstrate the innovative techniques for mitigating the effects of intrinsic birefringence in high numerical aperture lenses, at a central wavelength of 157 nm. The design techniques presented above, however, may be employed for reducing polarization aberration in optical systems operating at other wavelengths.

In calculating the performance of some of optical systems in the examples discussed above, the refractive surfaces are assumed to have a hypothetical, single layer anti-reflection coating with an index of refraction equal to the square root of the element index of refraction and with an optical thickness of a quarter wave at a wavelength of 193.3 nm. The indices of refraction for calcium fluoride and fused silica used in some of the examples described above are assumed to be 1.501455 and 1.560326, respectively, at a wavelength of 193.3 nm. Different coatings will introduce different retardance and phase aberrations and may require slightly different compensation. It should be understood, however, that the method demonstrated for the single hypothetical coating is applicable to systems with various other physical coatings or no coating at all.

The preceding examples are intended to be illustrative, not restrictive. Furthermore, it is intended that the various exemplary techniques for countering the effects of intrinsic birefringence, including retardance aberrations and wavefront aberrations produced by variations in average index of refraction may also be applied to the other embodiments. More generally, these basic principles used to compensate for polarization aberrations such as retardation and diattenuation can be extended to at least partially correct for these effects in various other optical systems. The principles apply both to refractive and catadioptric lens systems as well as other systems containing substantially optically transmissive material that imparts polarization aberrations on a beam propagating therethrough.

In other optical systems, the optical features of the optical components may vary. For example, the individual thicknesses, radii of curvature, aspheric coefficients, and ray angles may differ significantly from component to component. Additionally the materials comprising these optical elements is not limited and may include non-cubic crystalline optical elements as well as crystalline elements.

These principles may be used when designing new optical systems or to improve a known lens prescription. In some of the examples above, the corrected optical system is based on a given lens prescription, which may be maintained and the effects of intrinsic birefringence compensated for, using the techniques described above. Alternatively, retardation may be reduced by splitting of one or more lens elements of the given prescription, into two or more sub-elements. The location of the buried surface, its curvature and the thicknesses of the respective sub-elements are degrees of freedom that may be adjusted to reduce aberration or provide other performance attributes. For example, the optical power may be substantially evenly split into the sub-elements, which may or may not have same center thickness. The techniques and designs described above, however, may be advantageously applied to various other new lens prescriptions being designed.

Ray tracing software may be used to generate or revise the lens prescription including positioning of the individual lens elements, as well as thicknesses, radii of curvature, aspheric coefficients, material properties, and the like. In one embodiment, the RMS retardance may be computed over a pupil grid at each field point and used as the merit function for a damped least squares optimization using the commercially available ray tracing software, CODE V®, for example. A computer may be used to optimize the orientation and clocking of each of the elements in the system. The thicknesses of the components, the spacings between the components, and the radii of curvature and aspheric coefficients of the lens elements, may similarly be optimized to balance aberrations and reduce retardance across the field. One or more birefringent elements, wave plates, or combinations thereof, may additionally be used to correct for residual birefringence variation and constant residual retardance. Phase aberrations, such as astigmatism, trefoil aberration, and quadrafoil aberration, introduced by the average index variations in [110], [111], and [100] elements, respectively, may be compensated using one or more surfaces with radii of curvature that vary as 20, 30, and 40, respectively.

When cubic crystalline materials like calcium fluoride are used, a substantial portion of these crystal elements preferably comprise lesser expensive [111] cubic crystal with the [111] crystal lattice direction parallel to the optical axis. Although [100] and [110] elements appropriately clocked can be added to compensate for the birefringence introduced by [111] elements, the cost of these [100] and [110] elements is higher. The techniques described above, advantageously permit the birefringence of the [111] elements to be compensated for by other the lesser expensive [111] elements. Accordingly, the fraction of cubic crystalline elements that comprise [111] crystal with the [111] crystal lattice direction along the optical axis is preferably large, i.e., at least 70–90%, by weight. Although the polarization rotator may be formed from various materials, it may comprise cubic crystal, such as [110], [100], or [111] cubic crystal elements. In some embodiments where the polarization rotator comprises cubic crystal, preferably it comprises mostly [111] cubic crystal, most preferably, all [111] cubic crystalline material. As discussed above, having many of the cubic crystal elements comprise [111] material reduced the cost of the optics. Most preferably, a majority of the transmissive optical elements have an optical axis generally aligned with the [111] crystal lattice direction. In one preferred embodiment, substantially all the optically transmissive cubic crystal elements comprise this [111] crystal.

As discussed above, polarization rotation can be employed to correct polarization aberrations other than retardance. Diattenuation, for example, can also be reduced or substantially eliminated by inserting a polarization rotation device in an optical system. In one preferred embodiment, the diattenuation introduced by optical elements on opposite sides of the polarization rotator is matched or balanced. Accordingly, a first polarization propagating through a first set of elements on a first side of the rotator will be attenuated more than a second orthogonal polarization. The two polarizations will be rotated and the passed through a second set of elements on second opposite side of the rotator. If the first and second sets of lens elements on the two sides are matched, the second polarization will be attenuated by an amount of attenuation experienced by the first polarization in the first set of lens elements. Accordingly, both the first and second polarizations will be attenuated by substantially the same amount thereby reducing at least in part the net diattenuation of the optical system. Other examples of correction of polarization dependent aberrations and considered possible.

As mentioned above, the various exemplary cubic crystalline optical systems and methods for forming aberration-free patterns on semiconductor substrates are particularly advantageous as feature sizes become increasingly smaller and approach the half wavelength of the light used to produce the patterns. Such techniques find particular advantage in high numerical aperture (NA) lens systems but the various aspects these methods and innovations find application in optical systems having both relatively high and relatively low numerical apertures.

Although described in conjunction with photolithography tools used to pattern substrates in the semiconductor industry, the techniques and designs discussed above will find use in a wide variety of applications, both imaging and non-imaging, in infrared, visible, and ultraviolet. Optical systems used for medical, military, scientific, manufacturing, communication, and other applications are considered possible candidates for benefiting from the innovations described herein.

Although described above in connection with particular embodiments of the present invention, it should be understood the descriptions of the embodiments are illustrative of the invention and are not intended to be limiting. Accordingly, various modifications and applications may occur to those skilled in the art without departing from the true spirit and scope of the invention. The scope of the invention is not to be limited to the preferred embodiment described herein, rather, the scope of the invention should be determined by reference to the following claims, along with the full scope of equivalents to which those claims are legally entitled.

What is claimed is:

1. A photolithography tool comprising:
condenser optics positioned to receive light from a light source, said condenser optics positioned to direct an optical beam formed from said light through a reticle; and
projection optics configured to form an image of said reticle onto a substrate, said projection optics including:
one or more cubic crystalline lens elements receiving said directed optical beam propagated through said reticle, said one or more cubic crystalline lens elements having intrinsic birefringence which introduces retardance into said optical beam, and
polarization rotation optics comprising a circular retarder having orthogonal circular eigenpolarization states with about ±90(2n+1) degrees phase delay between the two orthogonal circular eigenpolarization states, where n is an integer, said polarization rotation optics positioned along a common optical pathway with said reticle and said one or more cubic crystalline lens elements, the polarization rotation optics rotating the polarization of said optical beam transmitted through said one or more cubic crystalline lens elements.

2. The photolithography tool of claim 1, wherein said light source outputs light having a wavelength less than or equal to about 248 nm.

3. The photolithography tool of claim 1, wherein said light source outputs light having a wavelength less than or equal to about 193 nm.

4. The photolithography tool of claim 1, wherein said light source outputs light having a wavelength less than or equal to about 157 nm.

5. The photolithography tool of claim 1, wherein said light source comprises an excimer laser.

6. The photolithography tool of claim 1, wherein at least a first of the one or more cubic crystalline lens elements comprises a [111] cubic crystal having a [111] crystal lattice direction substantially aligned with an optical axis passing through said first optical element.

7. The photolithography tool of claim 1, wherein said one or more cubic crystalline lens elements comprise material selected from the group consisting of calcium fluoride, barium fluoride, lithium fluoride, and strontium fluoride.

8. The photolithography tool of claim 1, wherein said projection optics comprises a catadioptric system including at least one reflective surface.

9. The photolithography tool of claim 1, wherein said projection optics comprises a catadioptric system including at least one reflective surface, wherein said at least one reflective surfaces has an asymmetrical stress applied thereto to thereby reduce astigmatism, trefoil aberration, or quadrafoil aberration.

10. The photolithography tool of claim 1, wherein said projection optics further comprises at least one additional optical element.

11. The photolithography tool of claim 1, wherein said projection optics further comprises at least one additional optical element, wherein said at least one additional optical element is a non-cubic crystalline optical element.

12. The photolithography tool of claim 1, wherein at least one cubic crystalline lens element of said one or more cubic crystalline lens elements comprises [100] calcium fluoride having a [100] crystal lattice direction substantially aligned with an optical axis passing through said at least one cubic crystalline lens element.

13. The photolithography tool of claim 11, wherein said at least one additional optical element is a powered fused silica lens element having a surface with asymmetric variation in curvature.

14. The photolithography tool of claim 1, wherein at least one cubic crystalline lens element of said one or more cubic crystalline lens elements has an aspheric surface.

15. The photolithography tool of claim 1, wherein said projection optics has a numerical aperture greater than or about 0.7.

16. A method for forming a semiconductor device comprising:
propagating a beam of light through a reticle;
forming an optical image of said reticle by
directing said beam of light into a first part of a projection lens, said first part of said projection lens including one or more refractive optical elements, said beam of light becoming aberrated as a result of first polarization aberrations introduced by said first part of said projection lens, said first polarization aberrations resulting from variation in an optical property with polarization;
rotating vertical and horizontal polarizations in said beam of light by about ±90°(2n+1), where n is an integer;
propagating said beam of light through a second part of said projection lens, said second part of said projection lens including one or more refractive optical elements, said second part of said projection lens selected to introduce second polarization aberrations which at least partially cancel said first polarization aberrations, said second polarization aberrations resulting from variation in an optical property with polarization; and
positioning a substrate, such that said optical image formed by said beam of light output by said projection lens, is formed on said substrate.

17. The method of claim 16, wherein said first and second parts of said projection lens are substantially balanced such that for two orthogonal polarization states, said variation in said optical property is substantially identical for both said first and second parts.

18. The method of claim 16, wherein said beam of light has a wavelength less than or equal to about 193 nm.

19. The method of claim 16, wherein at least one refractive optical element of said one or more refractive optical elements in the first part, at least one refractive optical element of said one or more refractive optical elements in the second part, or both comprises [111] calcium fluoride having a [111] crystal lattice direction substantially aligned with an optical axis passing through said at least one refractive optical element of said one or more refractive optical elements in the first part, said at least one refractive optical element of said one or more refractive optical elements in the second part, or both.

20. The method of claim 16, wherein at least one refractive optical element of said one or more refractive optical elements in the first part, at least one refractive optical element of said one or more refractive optical elements in the second part, or both comprises [100] calcium fluoride having a [100] crystal lattice direction substantially aligned with an optical axis passing through said at least one refractive optical element of said one or more refractive optical elements in the first part, said at least one refractive optical element of said one or more refractive optical elements in the second part, or both.

21. The method of claim 16, comprising transmitting said beam of light through a catadioptric system including at least one reflective surface.

22. The method of claim 16, further comprising transmitting said beam of light through at least one additional optical element, wherein said at least one additional optical element comprises fused silica.

23. The method of claim 22, wherein said at least one additional optical element is a powered lens element having a surface with asymmetric variation in curvature.

24. The method of claim 16, wherein at least one refractive optical element of said one or more refractive optical elements in the first part, at least one refractive optical element of said one or more refractive optical elements in the second part, or both has an aspheric surface.

25. A photolithography tool comprising:
condenser optics positioned to receive light from a light source, said condenser optics positioned to direct an optical beam formed from said light through a reticle; and
projection optics configured to form an image of said reticle onto a substrate,
wherein said condenser optics include:
one or more cubic crystalline optical elements receiving said light from said light source, said one or more cubic crystalline optical elements having intrinsic birefringence which introduces retardance into said optical beam, and
±90(2n+1) degree polarization rotation optics positioned along a common optical pathway through said one or more cubic crystalline optical elements, the polarization rotation optics rotating any arbitrary polarization of light transmitted through said one or more cubic crystalline optical elements by about ±90(2n+1) degrees, where n is an integer.

26. The photolithography tool of claim 25, wherein said condenser optics includes mixing rods.

27. The photolithography tool of claim 25, wherein said light source outputs light having a wavelength less than or equal to about 193 nm.

28. The photolithography tool of claim 25, wherein at least one cubic crystalline lens element of said one or more cubic crystalline lens elements comprises [111] calcium fluoride having a [111] crystal lattice direction substantially aligned with an optical axis passing through said at least one cubic crystalline lens element.

29. The photolithography tool of claim 25, wherein at least one cubic crystalline lens element of said one or more cubic crystalline lens elements comprises [100] calcium fluoride having a [100] crystal lattice direction substantially aligned with an optical axis passing through said at least one cubic crystalline lens element.

30. The photolithography tool of claim 25, wherein said projection optics comprises a catadioptric system including at least one reflective surface.

31. The photolithography tool of claim 25, wherein said projection optics further comprises at least one additional optical element, wherein said at least one additional optical element comprises fused silica.

32. The photolithography tool of claim 31, wherein said at least one additional optical element is a powered lens element having a surface with asymmetric variation in curvature.

33. The photolithography tool of claim 25, wherein at least one cubic crystalline lens element of said one or more cubic crystalline lens elements has an aspheric surface.

34. The photolithography tool of claim 25, wherein said projection optics has a numerical aperture greater than or about 0.7.

35. A photolithography tool comprising:
condenser optics positioned to receive light from a light source, said condenser optics positioned to direct an optical beam formed from said light through a reticle; and
projection optics configured to form an image of said reticle onto a substrate, said projection optics including:
one or more cubic crystalline lens elements receiving said directed optical beam propagated through said reticle, said one or more cubic crystalline lens elements having intrinsic birefringence which introduces retardance into said optical beam, and
±90(2n+1) degree polarization rotation optics that rotates any arbitrary polarization by about ±90(2n+1) degrees, where n is an integer, said ±90(2n+1) degree polarization rotation optics positioned along a common optical pathway with said reticle and said one or more cubic crystalline lens elements, the polarization rotation optics rotating the polarization of said optical beam transmitted through said one or more cubic crystalline lens elements.

36. The photolithography tool of claim 35, wherein said light source outputs light having a wavelength less than or equal to about 193 nm.

37. The photolithography tool of claim 35, wherein at least one cubic crystalline lens element of said one or more cubic crystalline lens elements comprises [111] calcium fluoride having a [111] crystal lattice direction substantially aligned with an optical axis passing through said at least one cubic crystalline lens element.

38. The photolithography tool of claim 35, wherein at least one cubic crystalline lens element of said one or more cubic crystalline lens elements comprises [100] calcium fluoride having a [100] crystal lattice direction substantially aligned with an optical axis passing through said at least one cubic crystalline lens element.

39. The photolithography tool of claim 35, wherein said projection optics comprises a catadioptric system including at least one reflective surface.

40. The photolithography tool of claim 35, wherein said projection optics further comprises at least one additional optical element, wherein said at least one additional optical element comprises fused silica.

41. The photolithography tool of claim 40, wherein said at least one additional optical element is a powered lens element having a surface with asymmetric variation in curvature.

42. The photolithography tool of claim 35, wherein at least one cubic crystalline lens element of said one or more cubic crystalline lens elements has an aspheric surface.

43. The photolithography tool of claim 35, wherein said projection optics has a numerical aperture greater than or about 0.7.

44. A method for forming a semiconductor device comprising:
propagating a beam of light through a reticle;
forming an optical image of said reticle by
directing said beam of light into a first part of a projection lens, said first part of said projection lens including one or more refractive optical elements, said beam of light becoming aberrated as a result of first polarization aberrations introduced by said first part of said projection lens, said first polarization aberrations resulting from variation in an optical property with polarization;
introducing an odd number of quarter waves of circular retardance into the beam so as to rotate the polarization of said beam of light by about ±90(2n+1), where n is an integer; and
propagating said beam of light through a second part of said projection lens, said second part of said projection lens including one or more refractive optical elements, said second part of said projection lens selected to introduce second polarization aberrations which at least partially cancel said first polarization aberrations, said second polarization aberrations resulting from variation in an optical property with polarization; and
positioning a substrate, such that said optical image formed by said beam of light output by said projection lens, is formed on said substrate.

45. The method of claim 44, wherein said beam of light has a wavelength less than or equal to about 193 nm.

46. The method of claim 44, wherein at least one refractive optical element of said one or more refractive optical elements in the first part, at least one refractive optical element of said one or more refractive optical elements in the second part, or both comprises [111] calcium fluoride having a [111] crystal lattice direction substantially aligned with an optical axis passing through said at least one refractive optical element of said one or more refractive optical elements in the first part, said at least one refractive optical element of said one or more refractive optical elements in the second part, or both.

47. The method of claim 44, wherein at least one refractive optical element of said one or more refractive optical elements in the first part, at least one refractive optical element of said one or more refractive optical elements in the second part, or both comprises [100] calcium fluoride having a [100] crystal lattice direction substantially aligned with an optical axis passing through said at least one refractive optical element of said one or more refractive optical elements in the first part, said at least one refractive optical element of said one or more refractive optical elements in the second part, or both.

48. The method of claim 44, comprising transmitting said beam of light through a catadioptric system including at least one reflective surface.

49. The method of claim 44, further comprising transmitting said beam of light through at least one additional optical element, wherein said at least one additional optical element comprises fused silica.

50. The method of claim 49, wherein said at least one additional optical element is a powered lens element having a surface with asymmetric variation in curvature.

51. The method of claim 44, wherein at least one refractive optical element of said one or more refractive optical elements in the first part, at least one refractive optical element of said one or more refractive optical elements in the second part, or both has an aspheric surface.

52. A photolithography tool comprising:
condenser optics positioned to receive light from a light source, said condenser optics positioned to direct an optical beam formed from said light source through a reticle; and
projection optics configured to form an image of said reticle onto a substrate, said projection optics including:
one or more cubic crystalline lens elements receiving said directed optical beam propagated through said reticle, said one or more cubic crystalline lens elements having intrinsic birefringence which introduces retardance into said optical beam, and
polarization rotation optics comprising a circular retarder having orthogonal circular eigenpolarization states with about ±90(2n+1) degrees phase delay between the two orthogonal circular eigenpolarization states, where n is an integer, said polarization rotation optics positioned along a common optical pathway with said reticle and said one or more cubic crystalline lens elements, the polarization rotation optics rotating the polarization of said optical beam transmitted through said one or more cubic crystalline lens elements.

53. The photolithography tool of claim 35, wherein said light source outputs light having a wavelength less than or equal to about 193 nm.

54. The photolithography tool of claim 52, wherein at least one cubic crystalline lens element of said one or more cubic crystalline lens elements comprises [111] calcium fluoride having a [111] crystal lattice direction substantially aligned with an optical axis passing through said at least one cubic crystalline lens element.

55. The photolithography tool of claim 52, wherein at least one cubic crystalline lens element of said one or more cubic crystalline lens elements comprises [100] calcium fluoride having a [100] crystal lattice direction substantially aligned with an optical axis passing through said at least one cubic crystalline lens element.

56. The photolithography of claim 52, wherein said projection optics comprises a catadioptric system including at least one reflective surface.

57. The photolithography tool of claim 52, wherein said projection optics further comprises at least one additional optical element, wherein said at least one additional optical element comprises fused silica.

58. The photolithography of claim 57, wherein said at least one additional optical element is a powered lens element having a surface with asymmetric variation in curvature.

59. The photolithography tool of claim 52, wherein at least one cubic crystalline lens element of said one or more cubic crystalline lens elements has an aspheric surface.

60. The photolithography tool of claim 52, wherein said projection optics has a numerical aperture greater than or about 0.7.

61. A photolithography tool comprising:
condenser optics positioned to receive light from a light source, said condenser optics positioned to direct an optical beam formed from said light source through a reticle; and
projection optics configured to form an image of said reticle onto a substrate, said projection optics including:
one or more cubic crystalline lens elements receiving said directed optical beam propagated through said reticle, said one or more cubic crystalline lens elements having intrinsic birefringence which introduces retardance into said optical beam, and a ±90(2n+1) polarization rotation optics positioned along a common optical pathway with said reticle and said one or more cubic crystalline lens elements, the polarization rotation optics rotating the polarization of said optical beam transmitted through said one or more cubic crystalline lens elements by about ±90(2n+1) degrees, where n is an integer.

62. The photolithography tool of claim 61, wherein said light source outputs light having a wavelength less than or equal to about 193 nm.

63. The photolithography tool of claim 61, wherein at least one cubic crystalline lens element of said one or more cubic crystalline lens elements comprises [111] calcium fluoride having a [111] crystal lattice direction substantially aligned with an optical axis passing through said at least one cubic crystalline lens element.

64. The photolithography tool of claim 61, wherein at least one cubic crystalline lens element of said one or more cubic crystalline lens elements comprises [100] calcium fluoride having a [100] crystal lattice direction substantially aligned with an optical axis passing through said at least one cubic crystalline lens element.

65. The photolithography tool of claim 61, wherein said projection optics comprises a catadioptric system including at least one reflective surface.

66. The photolithography of claim 61, wherein said projection optics further comprises at least one additional optical element, wherein said at least one additional optical element comprises fused silica.

67. The photolithography tool of claim 66, wherein said at least one additional optical element is a powered lens element having a surface with asymmetric variation in curvature.

68. The photolithography tool of claim 61, wherein at least one cubic crystalline lens element of said one or more cubic crystalline lens elements has an aspheric surface.

69. The photolithography of claim 61, wherein said projection optics has a numerical aperture greater than or about 0.7.

70. A method for forming a semiconductor device comprising:

propagating a beam of light through a reticle;

forming an optical image of said reticle by directing said beam of light into a first part of a projection lens, said first part of said projection lens including one or more refractive optical elements, said beam of light becoming aberrated as a result of first polarization aberrations introduced by said first part of said projection lens, said first polarization aberrations resulting from variation in an optical property with polarization;

rotating the polarization of said beam of light by about ±90(2n+1) degrees, wherein n is an integer; and propagating said beam of light through a second part of said projection lens, said second part of said projection lens including one or more refractive optical elements, said second part of said projection lens selected to introduce second polarization aberrations which at least partially cancel said first polarization aberrations, said second polarization aberrations resulting from variation in an optical property with polarization; and positioning a substrate, such that said optical image formed by said beam of light output by said projection lens, is formed on said substrate.

71. The method of claim 70, wherein said beam of light has a wavelength less than or equal to about 193 nm.

72. The method of claim 70, wherein at least one refractive optical element of said one or more refractive optical elements in the first part, at least one refractive optical element of said one or more refractive optical elements in the second part, or both comprises [111] calcium fluoride having a [111] crystal lattice direction substantially aligned with an optical axis passing through said at least one refractive optical element of said one or more refractive optical elements in the first part, said at least one refractive optical element of said one or more refractive optical elements in the second part, or both.

73. The method of claim 70, wherein at least one refractive optical element of said one or more refractive optical elements in the first part, at least one refractive optical element of said one or more refractive optical elements in the second part, or both comprises [100] calcium fluoride having a [100] crystal lattice direction substantially aligned with an optical axis passing through said at least one refractive optical element of said one or more refractive optical elements in the first part, said at least one refractive optical element of said one or more refractive optical elements in the second part, or both.

74. The method of claim 70, comprising transmitting said beam of light through a catadioptric system including at least one reflective surface.

75. The method of claim 70, further comprising transmitting said beam of light through at least one additional optical element, wherein said at least one additional optical element comprises fused silica.

76. The method of claim 75, wherein said at least one additional optical element is a powered lens element having a surface with asymmetric variation in curvature.

77. The method of claim 70, wherein at least one refractive optical element of said one or more refractive optical elements in the first part, at least one refractive optical element of said one or more refractive optical elements in the second part, or both has an aspheric surface.

78. A photolithography tool comprising:

condenser optics positioned to receive light from a light source, said condenser optics positioned to direct an optical beam formed from said light source through a reticle; and projection optics configured to form an image of said reticle onto a substrate, wherein said condenser optics include:

one or more cubic crystalline optical elements receiving light from said light source, said one or more cubic crystalline optical elements having intrinsic birefringences which introduces retardance into said optical beam, and ±90(2n+1) polarization rotation optics positioned along a common optical pathway through said one or more cubic crystalline lens elements, the polarization rotation optics rotating the polarization of said light transmitted through said one or more cubic crystalline optical elements by about ±90(2n+1) degrees, where n is an integer.

79. The photolithography tool of claim 78, wherein said light source outputs light having a wavelength less than or equal to about 193 nm.

80. The photolithography tool of claim 78, wherein at least one cubic crystalline lens element of said one or more cubic crystalline lens elements comprises [111] calcium fluoride having a [111] crystal lattice direction substantially aligned with an optical axis passing through said at least one cubic crystalline lens element.

81. The photolithography tool of claim 78, wherein at least one cubic crystalline lens element of said one or more cubic crystalline lens elements comprises [100] calcium fluoride having a [100] crystal lattice direction substantially aligned with an optical axis passing through said at least one cubic crystalline lens element.

82. The photolithography tool of claim 78, wherein said projection optics comprises a catadioptric system including at least one reflective surface.

83. The photolithography tool of claim 78, wherein said projection optics further comprises at least one additional optical element, wherein said at least one additional optical element comprises fused silica.

84. The photolithography tool of claim 83, wherein said at least one additional optical element is a powered lens element having a surface with asymmetric variation in curvature.

85. The photolithography tool of claim 78, wherein at least one cubic crystalline lens element of said one or more cubic crystalline lens elements has an aspheric surface.

86. The photolithography tool of claim 78, wherein said projection optics has a numerical aperture greater than or about 0.7.

87. A device forming method, comprising:
   illuminating a mask pattern;
   transmitting a beam of light having first and second orthogonal polarization states along an optical path from said mask pattern through at least one optical element, said optical element having intrinsic birefringence such that said first polarization state is phase delayed with respect to said second polarization state;
   rotating the first and second orthogonal polarization states of said beam of light;
   transmitting said beam of light, having rotated the first and second orthogonal polarization states, through at least one birefringent element such that said second polarization state is phase delayed with respect to said first polarization state to reduce the relative phase difference between said first and second orthogonal polarization states of said beam of light;
   projecting said beam of light, after said beam of light is transmitted through said at least one birefringent element, onto photosensitive material of a substrate.

88. The method of claim 87, wherein said beam of light has a wavelength less than or equal to about 193 nm.

89. The method of claim 87, wherein said at least one optical element, said at least one birefringent element, or both comprises [111] calcium fluoride having a [111] crystal lattice direction substantially aligned with an optical axis passing through said at least one optical element, said at least one birefringent element, or both.

90. The method of claim 87, wherein said at least one optical element, said at least one birefringent element, or both comprises [100] calcium fluoride having a [100] crystal lattice direction substantially aligned with an optical axis passing through said at least one optical element, said at least one birefringent element, or both.

91. The method of claim 87, comprising transmitting said beam of light through a catadioptric system including at least one reflective surface.

92. The method of claim 87, further comprising transmitting said beam of light through at least one additional optical element, wherein said at least one additional optical element comprises fused silica.

93. The method of claim 92, wherein said at least one additional optical element is a powered lens element having a surface with asymmetric variation in curvature.

94. The method of claim 87, wherein said orthogonal polarization states are rotated by integer multiples of 90°.

95. The method of claim 87, wherein said at least one optical element, said at least one birefringent element, or both has an aspheric surface.

* * * * *